US012628552B2

(12) United States Patent
Kim et al.

(10) Patent No.: US 12,628,552 B2
(45) Date of Patent: May 12, 2026

(54) LIGHT-EMITTING DEVICE AND ELECTRONIC APPARATUS INCLUDING THE LIGHT-EMITTING DEVICE

(71) Applicant: Samsung Display Co., Ltd., Yongin-si (KR)

(72) Inventors: Beomjin Kim, Yongin-si (KR); Yeongji Im, Yongin-si (KR); Jino Lim, Yongin-si (KR); Seunggak Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1008 days.

(21) Appl. No.: 17/358,681

(22) Filed: Jun. 25, 2021

(65) Prior Publication Data

US 2022/0006028 A1 Jan. 6, 2022

(30) Foreign Application Priority Data

Jun. 26, 2020 (KR) ........................ 10-2020-0078803

(51) Int. Cl.
*H10K 85/60* (2023.01)
*H10K 50/15* (2023.01)
*H10K 85/00* (2023.01)

(52) U.S. Cl.
CPC ........... *H10K 85/615* (2023.02); *H10K 85/00* (2023.02); *H10K 85/633* (2023.02);
(Continued)

(58) Field of Classification Search
CPC ...... H10K 30/865; H10K 50/11; H10K 50/13; H10K 50/14; H10K 50/15; H10K 50/156;
(Continued)

(56) References Cited

U.S. PATENT DOCUMENTS

2005/0221124 A1 10/2005 Hwang et al.
2008/0038587 A1 2/2008 Wen et al.
(Continued)

FOREIGN PATENT DOCUMENTS

CN 106910835 A 6/2017
CN 109686870 4/2019
(Continued)

OTHER PUBLICATIONS

CN-109686870-A machine translation (Year: 2019).*

*Primary Examiner* — Elizabeth M. Dahlburg
(74) *Attorney, Agent, or Firm* — Lerner David LLP

(57) ABSTRACT

A light-emitting device and an electronic apparatus including the same are provided. The light-emitting device includes a first electrode, a second electrode facing the first electrode, and an interlayer between the first electrode and the second electrode. The interlayer includes an emission layer, and a hole transport region between the emission layer and the first electrode. The hole transport region includes at least one first compound including $^{15}N$ in the number of $m_1$, $^{15}N$ in the number of $m_1$ is linked to a neighboring carbon (C) via a single bond, $m_1$ is an integer equal to or greater than 1, and the first compound is not Compound A in the specification.

14 Claims, 3 Drawing Sheets

10

(52) U.S. Cl.
CPC ......... *H10K 85/6572* (2023.02); *H10K 50/15* (2023.02); *H10K 50/156* (2023.02)

(58) Field of Classification Search
CPC .... H10K 85/00; H10K 85/615; H10K 85/631; H10K 85/633; H10K 85/636; H10K 85/657; H10K 85/6572
See application file for complete search history.

(56) References Cited

U.S. PATENT DOCUMENTS

| | | | | |
|---|---|---|---|---|
| 2015/0123086 | A1* | 5/2015 | Lee | H10K 50/858 438/26 |
| 2015/0303384 | A1* | 10/2015 | Kim | C07D 405/10 548/440 |
| 2017/0179204 | A1 | 6/2017 | Lim et al. | |
| 2019/0280212 | A1 | 9/2019 | Zeng et al. | |

FOREIGN PATENT DOCUMENTS

| | | |
|---|---|---|
| KR | 10-2014-0080451 | 6/2014 |
| KR | 10-2016-0041014 | 4/2016 |

* cited by examiner

LIGHT-EMITTING DEVICE AND ELECTRONIC APPARATUS INCLUDING THE LIGHT-EMITTING DEVICE

CROSS-REFERENCE TO RELATED APPLICATION(S)

This application claims priority to and benefits of Korean Patent Application No. 10-2020-0078803 under 35 U.S.C. § 119, filed on Jun. 26, 2020 in the Korean Intellectual Property Office, the entire contents of which are incorporated herein by reference.

BACKGROUND

1. Technical Field

Embodiments relate to a light-emitting device and an electronic apparatus including the light-emitting device.

2. Description of the Related Art

Among light-emitting devices, organic light-emitting devices are self-emission devices that have wide viewing angles, high contrast ratios, short response times, and excellent characteristics in terms of brightness, driving voltage, and response speed, compared to devices in the art.

Organic light-emitting devices may include a first electrode disposed on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as the holes and the electrons, recombine in the emission layer to produce excitons. These excitons transition from an excited state to a ground state to thereby generate light.

SUMMARY

Embodiments relate to a light-emitting device including a compound having excellent light-emission efficiency and high stability, and an electronic apparatus including the light-emitting device.

Additional aspects will be set forth in part in the description which follows and, in part, will be apparent from the description, or may be learned by practice of the embodiments of the disclosure.

According to an aspect, a light-emitting device is provided that may include a first electrode, a second electrode facing the first electrode, and an interlayer between the first electrode and the second electrode, wherein the interlayer may include an emission layer, and a hole transport region between the emission layer and the first electrode, the hole transport region may include at least one first compound including $^{15}N$ in the number of $m_1$, $^{15}N$ in the number of $m_1$ may be linked to a neighboring carbon (C) via a single bond, $m_1$ may be an integer equal to or greater than 1, and the at least one first compound may not be Compound A:

A

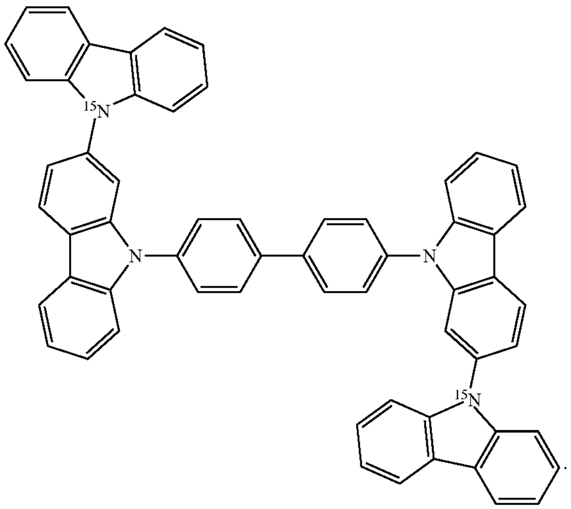

In an embodiment, at least one C from among C linked to $^{15}N$ in the number of $m_1$ via a single bond may be $^{12}C$.

In an embodiment, $m_1$ may be an integer from 1 to 10.

In an embodiment, at least one $^{15}N$ from among $^{15}N$ in the number of $m_1$ may form a part of a cyclic group included in the at least one first compound.

In an embodiment, at least one $^{15}N$ from among $^{15}N$ in the number of $m_1$ may not form a part of a cyclic group included in the at least one first compound.

In an embodiment, the at least one first compound may further include $^{14}N$ in the number of $m_2$, $^{14}N$ in the number of $m_2$ may be linked to a neighboring carbon (C) via a single bond, and $m_2$ may be an integer equal to or greater than 1.

In an embodiment, at least one $^{14}N$ from among $^{14}N$ in the number of $m_2$ may not form a part of a cyclic group included in the at least one first compound.

In an embodiment, the at least one first compound may include two or more N(s), and when two N(s) from among the two or more N(s) are linked to a heteroatom-free group, at least one of the two N(s) may be $^{15}N$.

In an embodiment, the at least one first compound may include two or more N(s), the two or more N(s) may each form a first cyclic group and a second cyclic group, and when the first cyclic group and the second cyclic group form a condensed ring with each other, at least one of the two or more N(s) may be $^{15}N$.

In an embodiment, each N included in the at least one first compound may be $^{15}N$.

In an embodiment, the at least one first compound may further include O, S, Si, P, B, or a combination thereof.

In an embodiment, each of the at least one first compound may be represented by one of Formulae 1, 1-1, 2, 2-1, and 3:

1

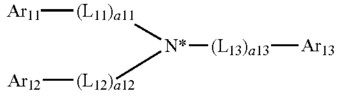

-continued 1-1

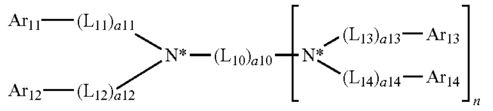

2

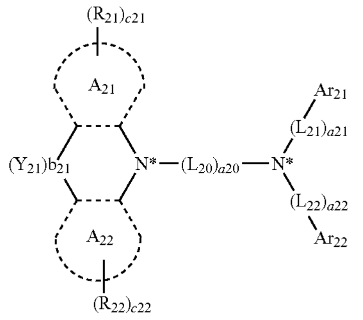

2-1

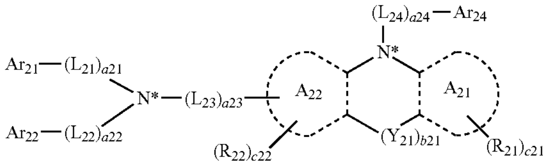

3

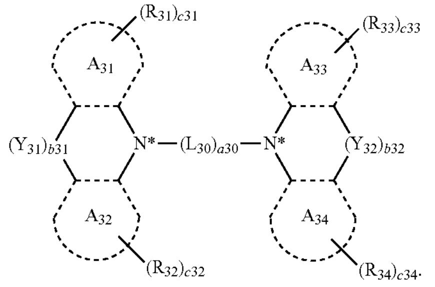

In Formulae 1, 1-1, 2, 2-1, and 3, $Y_{21}$ may be O, S, Se, $C(Z_{21a})(Z_{21b})$, $Si(Z_{21a})(Z_{21b})$, or $N^*(Z_{21a})$, $Y_{31}$ may be O, S, Se, $C(Z_{31a})(Z_{31b})$, $Si(Z_{31a})(Z_{31b})$, or $N^*(Z_{31a})$, $Y_{32}$ may be O, S, Se, $C(Z_{32a})(Z_{32b})$, $Si(Z_{32a})(Z_{32b})$, or $N^*(Z_{32a})$, N* may be $^{14}N$ or $^{15}N$, at least one N* in Formula 1, 1-1, 2, 2-1, or 3 may be $^{15}N$, b21, b31, and b32 may each independently be an integer from 0 to 3, $Ar_{11}$ to $Ar_{14}$, $Ar_{21}$, $Ar_{22}$, and $Ar_{24}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, ring $A_{21}$, $A_{22}$, and $A_{31}$ to $A_{34}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{10}$, $L_{20}$, and $L_{30}$ may each independently be *—O—', *—S—', *—N*($Ar_{15}$)—*', a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $Ar_{15}$ may be the same as described in connection with $Ar_{11}$, $L_{11}$ to $L_{14}$ and $L_{21}$ to $L_{24}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 to a14 and a21 to a24 may each independently be an integer from 0 to 10, a10, a20, and a30 may each independently be an integer from 1 to 5, $R_{21}$, $R_{22}$, $R_{31}$ to $R_{34}$, $Z_{21a}$, $Z_{21b}$, $Z_{31a}$, $Z_{31b}$, $Z_{32a}$, and $Z_{32}$ b may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N^*(Q_1)(Q_2)$, —$B(Q_1)(Q_2)$, —$C(=O)(Q_1)$, —$S(=O)_2(Q_1)$, or —$P(=O)(Q_1)(Q_2)$, c21, c22, and c31 to c34 may each independently be an integer from 0 to 10, n may be an integer from 1 to 5, $R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N^*(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N^*(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or —$Si(Q_{31})(Q_{32})(Q_{33})$, —$N^*(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, when a heteroatom included in the $C_1$-$C_{60}$ heterocyclic group is a nitrogen atom, the nitrogen atom may be $^{14}N$ or $^{15}N$, a nitrogen atom included in the cyano group or the nitro group may be $^{14}N$ or $^{15}N$, and N* may be $^{14}N$ or $^{15}N$.

In an embodiment, the hole transport region may include two or more first compounds that are different from each other.

In an embodiment, the hole transport region may include a first layer, and a second layer between the first layer and the emission layer, the first layer and the second layer may each include the at least one first compound, and the at least one first compound included in the first layer may be different from the at least one first compound included in the second layer.

In an embodiment, the at least one first compound included in the first layer may include $^{15}N$ in the number of $m_{11}$, the at least one first compound included in the second layer may include $^{15}N$ in the number of $m_{12}$, and $m_{11}$ may be greater than $m_{12}$.

In an embodiment, the emission layer may include a first emission layer, a second emission layer, and a third emission layer each having different emission colors, the hole transport region may include a first emission auxiliary layer between the first electrode and the first emission layer, a second emission auxiliary layer between the first electrode and the second emission layer, and a third emission auxiliary layer between the first electrode and the third emission layer, and at least one of the first emission auxiliary layer, the second emission auxiliary layer, and the third emission auxiliary layer may include the at least one first compound.

According to another aspect, a light-emitting device is provided that may include a first electrode, a second electrode facing the first electrode, an interlayer between the first electrode and the second electrode, and a capping layer disposed outside the second electrode and having a refractive index of equal to or greater than about 1.6, wherein the interlayer may include an emission layer, and a hole transport region between the emission layer and the first electrode, and the hole transport region may include at least one first compound as described above.

According to another aspect, an electronic apparatus including the light-emitting device is provided, wherein the electronic apparatus may further include a thin-film transistor, the thin-film transistor may include a source electrode and a drain electrode, and the first electrode of the light-emitting device may be electrically connected to the source electrode or the drain electrode.

In an embodiment, the electronic apparatus may further include a color filter, a color conversion layer, a touch screen layer, a polarization layer, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
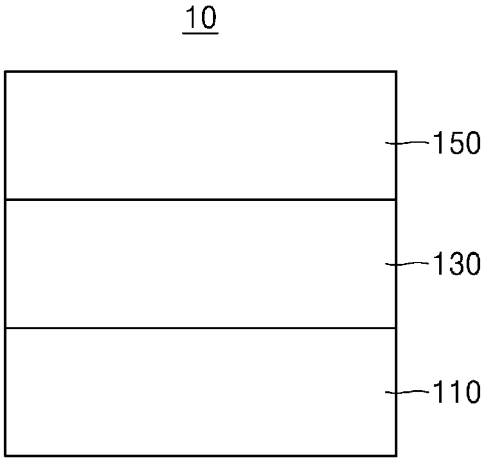
FIGS. 1 to 3 are each a schematic cross-sectional view of a structure of a light-emitting device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the disclosure.

Sizes of elements in the drawings may be exaggerated for convenience of explanation. Therefore, as the sizes and thicknesses of components in the drawings may be arbitrarily illustrated for convenience of explanation, the following embodiments of the disclosure are not limited thereto.

As used herein, the expressions used in the singular such as "a," "an," and "the" are intended to include the plural forms as well, unless the context clearly indicates otherwise.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

In the description, it will be understood that when an element (a region, a layer, a section, or the like) is referred to as being "on", "connected to" or "coupled to" another element, it can be directly on, connected or coupled to the other element, or one or more intervening elements may be disposed therebetween.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept.

The terms "below," "lower," "above," "upper," and the like are used to describe the relationship of the configurations shown in the drawings. The terms are used as a relative concept and are described with reference to the direction indicated in the drawings.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The light-emitting device may include a first electrode, a second electrode facing the first electrode, and an interlayer between the first electrode and the second electrode, wherein the interlayer may include an emission layer and a hole transport region between the emission layer and the first electrode, the hole transport region may include at least one first compound including $^{15}N$ in the number of $m_1$, $^{15}N$ in the number of $m_1$ may be linked to a neighboring carbon (C) via a single bond, $m_1$ may be an integer equal to or greater than 1, and the first compound may not be Compound A:

A

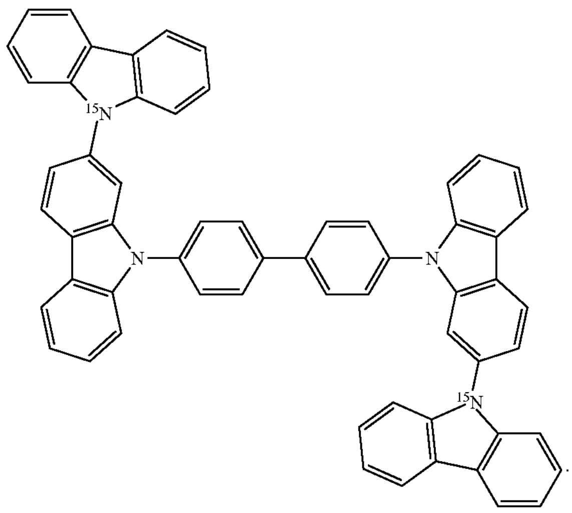

$^{15}N$ in the number of $m_1$ may be linked to a neighboring carbon (C) via a single bond. A single bond is a covalent bond having a bond order of 1 and is clearly distinguished from a double bond having a bond order of 2.

In an embodiment, at least one C from among C linked to $^{15}N$ in the number of $m_1$ via a single bond may be $^{12}C$. $^{12}C$ may not include $^{13}C$ that is an isotope of carbon (C).

In an embodiment, at least one $^{15}N$ from among $^{15}N$ in the number of $m_1$ may form a part of a cyclic group included in the first compound.

In an embodiment, at least one $^{15}N$ from among $^{15}N$ in the number of $m_1$ may not form a part of a cyclic group included in the first compound.

Those skilled in the art may readily recognize that Compound 16 represents an embodiment of the first compound containing a first $^{15}N$ and an second $^{15}N$, wherein the first $^{15}N$ may form a part of a cyclic group included in the first compound and the second $^{15}N$ may not form a part of cyclic group included in the first compound.

16

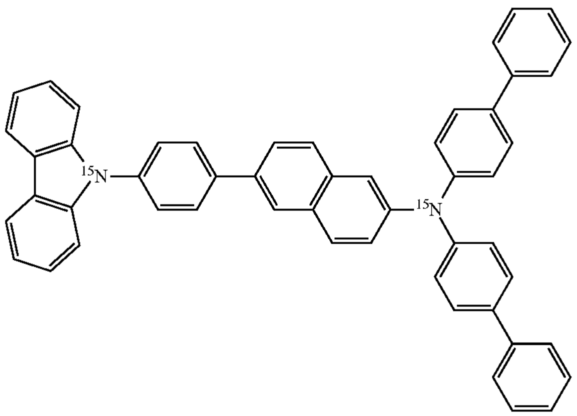

In an embodiment, the first compound may further include $^{14}N$ in the number of $m_2$, $^{14}N$ in the number of $m_2$ may be linked to a neighboring carbon (C) via a single bond, and $m_2$ may be an in integer equal to or greater than 1.

In an embodiment, at least one $^{14}N$ from among $^{14}N$ in the number of $m_2$ may form a part of a cyclic group included in the first compound.

In an embodiment, at least one $^{14}N$ from among $^{14}N$ in the number of $m_2$ may not form a part of a cyclic group included in the first compound.

Those skilled in the art may readily recognize that Compound 8 represents an embodiment of the first compound containing $^{15}N$ and $^{14}N$, wherein the $^{14}N$ may not form a part of a cyclic group included in the first compound. Those skilled in the art may readily recognize that Compound 11 represents an embodiment of the first compound containing $^{15}N$ and $^{14}N$, wherein the $^{14}N$ may form a part of cyclic group included in the first compound.

8

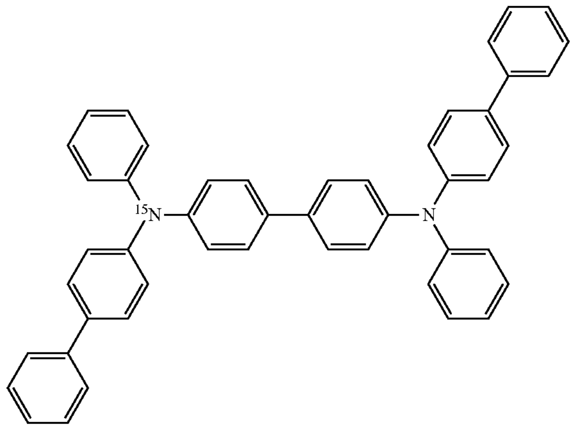

-continued

11

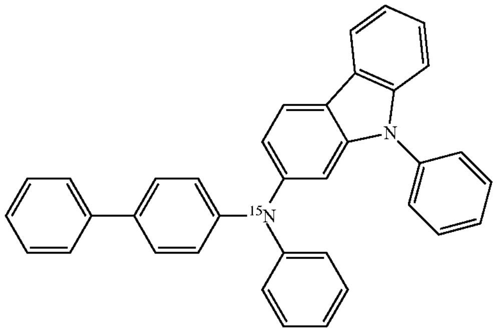

In an embodiment, the first compound may include two or more N(s), and when two N(s) from among the two or more N(s) are linked to a heteroatom-free group, at least one of the two N(s) may be $^{15}N$. The heteroatom-free group refers to a group consisting of C and H.

In an embodiment, the heteroatom-free group may be a carbocyclic group such as a benzene group or a naphthalene group, but embodiments of the disclosure are not limited thereto.

In an embodiment, the first compound may include two or more N(s), the two or more N(s) may each form a first cyclic group and a second cyclic group, and when the first cyclic group and the second cyclic group form a condensed ring with each other, at least one of the two or more N(s) may be $^{15}N$.

In an embodiment, the first compound may be Compound 22, but embodiments of the disclosure are not limited thereto.

22

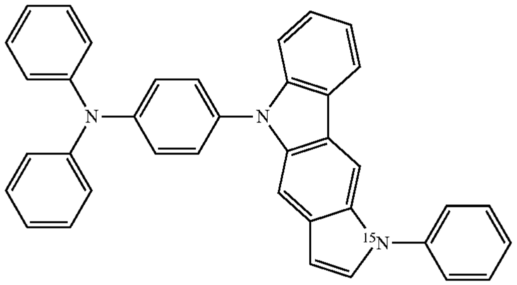

In the first compound, $m_1$ may be an integer equal to or greater than 1.

In an embodiment, $m_1$ may be an integer from 1 to 10.

In an embodiment, $m_1$ may be an integer from 1 to 6.

The first compound may not be Compound A.

A

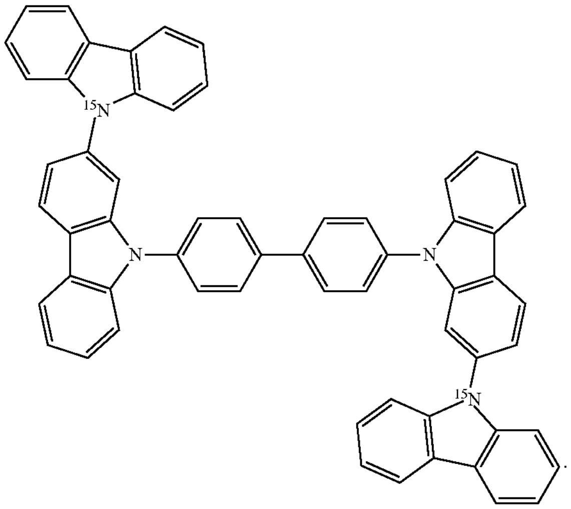

In an embodiment, each N included in the first compound may be $^{15}N$.

In an embodiment, the first compound may not include $^{14}N$.

In an embodiment, the first compound may further include O, S, Si, P, B, or any combination thereof.

In an embodiment, the first compound may include O, S, Si, or any combination thereof, but embodiments of the disclosure are not limited thereto.

In an embodiment, the first compound may be represented by one of Formulae 1, 1-1, 2, 2-1, and 3:

1

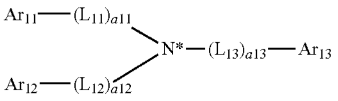

1-1

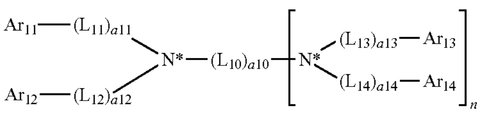

2

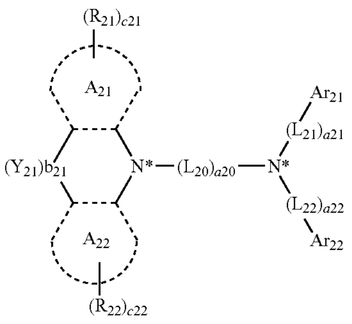

-continued 2-1

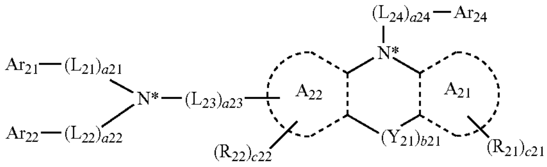

3

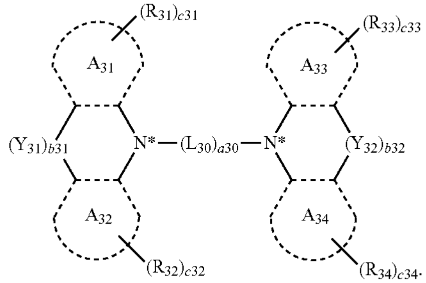

In Formulae 1, 1-1, 2, 2-1, and 3, $Y_{21}$ may be O, S, Se, $C(Z_{21a})(Z_{21b})$, $Si(Z_{21a})(Z_{21b})$, or $N^*(Z_{21a})$, $Y_{31}$ may be O, S, Se, $C(Z_{31a})(Z_{31b})$, $Si(Z_{31a})(Z_{31b})$, or $N^*(Z_{31a})$, and $Y_{32}$ may be O, S, Se, $C(Z_{32a})(Z_{32b})$, $Si(Z_{32a})(Z_{32b})$, or $N^*(Z_{32}a)$.

In an embodiment, $Y_{21}$ may be O, S, $C(Z_{21a})(Z_{21b})$, or $N^*(Z_{21a})$, $Y_{31}$ may be O, S, $C(Z_{31a})(Z_{31b})$, or $N^*(Z_{31a})$, and $Y_{32}$ may be O, S, $C(Z_{32a})(Z_{32b})$, or $N^*(Z_{32a})$, but embodiments of the disclosure are not limited thereto.

In Formulae 1, 1-1, 2, 2-1, and 3, N* may be $^{14}N$ or $^{15}N$, and at least one N* may be $^{15}N$.

In Formulae 1, 1-1, 2, 2-1, and 3, b21, b31, and b32 may each independently be an integer from 0 to 3.

In Formulae 1, 1-1, 2, 2-1, and 3, $Ar_{11}$ to $Ar_{14}$, $Ar_{21}$, $Ar_{22}$, and $Ar_{24}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, $Ar_{11}$ to $Ar_{15}$, $Ar_{21}$, $Ar_{22}$, and $Ar_{24}$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a pyrrole group, an indole group, an indene group, a benzosilole group, a benzothiophene group, a benzofuran group, a carbazole group, a fluorene group, a spirobifluorene group, a dibenzosilole group, a dibenzothiophene group, a dibenzofuran group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, or a dithiine group.

In an embodiment, $Ar_{11}$ to $Ar_{15}$, $Ar_{21}$, $Ar_{22}$, and $Ar_{24}$ may each independently be a benzene group, a naphthalene group, an indole group, a carbazole group, a fluorene group, a spirobifluorene group, a dibenzofuran group, or a dithiine group.

In Formulae 1, 1-1, 2, 2-1, and 3, ring $A_{21}$, $A_{22}$, and $A_{31}$ to $A_{34}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, ring $A_{21}$, $A_{22}$, and $A_{31}$ to $A_{34}$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a pyrrole group, an indole group, an indene group, a benzosilole group, a benzothiophene group, a benzofuran group, a carbazole group, a fluorene group, a spirobifluorene group, a dibenzosilole group, a dibenzothiophene group, a dibenzofuran group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, or a dithiine group.

In an embodiment, ring $A_{21}$, $A_{22}$, and $A_{31}$ to $A_{34}$ may each independently be a benzene group, a naphthalene group, an indole group, a carbazole group, a fluorene group, a spirobifluorene group, a dibenzofuran group, or a dithiine group.

In Formulae 1, 1-1, 2, 2-1, and 3, $L_{10}$, $L_{20}$, and $L_{30}$ may each independently be *—O—', *—S—', *—N*($Ar_{15}$)—*', a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$ In Formulae 1, 1-1, 2, 2-1, and 3, $Ar_{15}$ may be the same as described in connection with $Ar_{11}$ in the specification.

In Formulae 1, 1-1, 2, 2-1, and 3, $L_{11}$ to $L_{14}$ and $L_{21}$ to $L_{24}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, $L_{10}$ to $L_{14}$, $L_{20}$ to $L_{24}$, and $L_{30}$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a pyrrole group, an indole group, an indene group, a benzosilole group, a benzothiophene group, a benzofuran group, a carbazole group, a fluorene group, a dibenzosilole group, a dibenzothiophene group, a dibenzofuran group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, $L_{10}$ to $L_{14}$, $L_{20}$ to $L_{24}$, and $L_{30}$ may each independently be a benzene group or a naphthalene group, but embodiments of the disclosure are not limited thereto.

In Formulae 1, 1-1, 2, 2-1, and 3, a11 to a14 and a21 to a24 may each independently be an integer from 0 to 10.

In an embodiment, a11 to a14 and a21 to a24 may each independently be an integer from 0 to 5, but embodiments of the disclosure are not limited thereto.

In Formulae 1, 1-1, 2, 2-1, and 3, a10, a20, and a30 may each independently be an integer from 1 to 5.

In Formulae 1, 1-1, 2, 2-1, and 3, $R_{21}$, $R_{22}$, $R_{31}$ to $R_{34}$, $Z_{21a}$, $Z_{21b}$, $Z_{31a}$, $Z_{31b}$, $Z_{32}$a, and $Z_{32}$ b may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N*($Q_1$)($Q_2$), —B($Q_1$)($Q_2$), —C(═O)($Q_1$), —S(═O)$_2$($Q_1$), or —P(═O)($Q_1$)($Q_2$).

In an embodiment, $R_{21}$, $R_{22}$, $R_{31}$ to $R_{34}$, $Z_{21a}$, $Z_{21b}$, $Z_{31a}$, $Z_{31b}$, $Z_{32a}$, and $Z_{32}$ b may each independently be:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, —Si($Q_{31}$)($Q_{32}$)($Q_{33}$), —N*($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or any combination thereof;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —Si($Q_{31}$)($Q_{32}$)($Q_{33}$), —N*($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or any combination thereof; or —B($Q_1$)($Q_2$), —P($Q_1$)($Q_2$), —N*($Q_1$)($Q_2$), or —C(═O)($Q_1$).

In Formulae 1, 1-1, 2, 2-1, and 3, c21, c22, and c31 to c34 may each independently be an integer from 0 to 10.

In Formulae 1, 1-1, 2, 2-1, and 3, n may be an integer from 1 to 5.

In Formulae 1, 1-1, 2, 2-1, and 3, $R_{10a}$ may be: deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N*($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N*($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N*($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$).

In Formulae 1, 1-1, 2, 2-1, and 3, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In Formulae 1, 1-1, 2, 2-1, and 3, when a heteroatom included in the $C_1$-$C_{60}$ heterocyclic group is a nitrogen atom, the nitrogen atom may be $^{14}N$ or $^{15}N$, a nitrogen atom included in the cyano group or the nitro group may be $^{14}N$ or $^{15}N$, and N* may be $^{14}N$ or $^{15}N$.

In an embodiment, the hole transport region may include two or more first compounds that are different from each other.

In an embodiment, the hole transport region may include a first layer, and a second layer between the first layer and the emission layer, the first layer and the second layer may each include the at least one first compound, and a first compound included in the first layer may be different from a first compound included in the second layer.

In an embodiment, the first layer and the second layer may each independently be a hole injection layer, a hole transport layer, an emission auxiliary layer, an electron blocking layer, or any combination thereof.

In an embodiment, a first compound included in the first layer may include $^{15}N$ in the number of $m_{11}$, a first compound included in the second layer may include $^{15}N$ in the number of $m_{12}$, and $m_{11}$ may be greater than $m_{12}$.

In an embodiment, a first compound included in the first layer may include $^{14}N$ in the number of $m_{21}$, a first compound included in the second layer may include $^{14}N$ in the number of $m_{22}$, and $m_{21}$ may be identical to $m_{22}$.

In an embodiment, the hole transport region may include at least one of a first compound selected from Compounds 1 to 24:

1

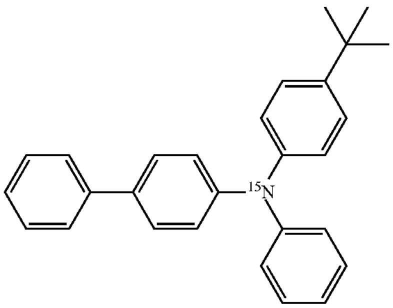

-continued

2

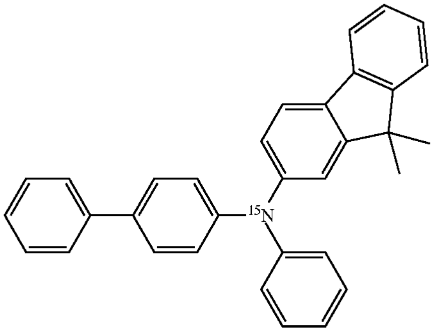

3

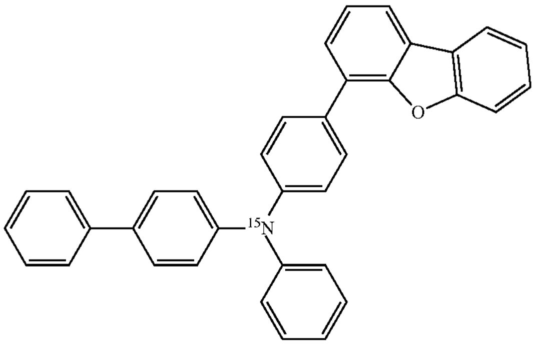

4

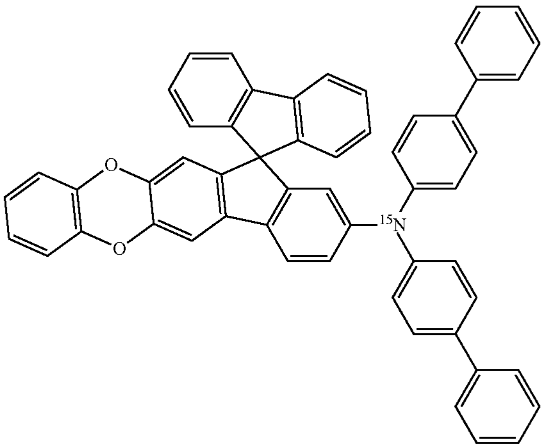

-continued
5
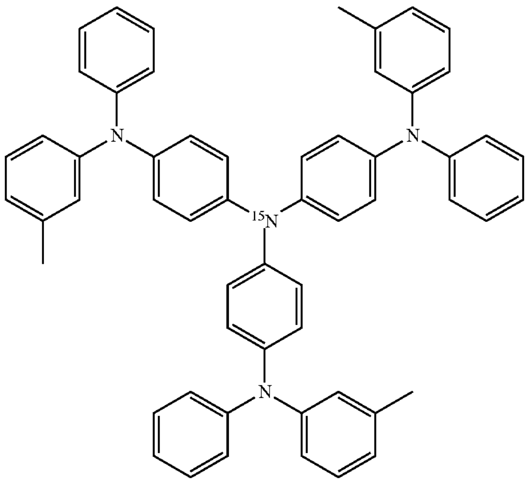
6
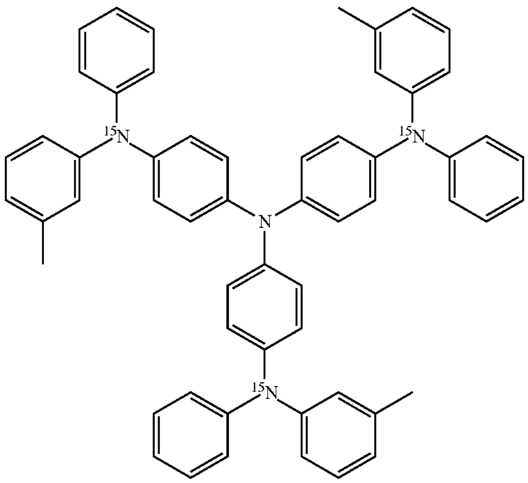
7
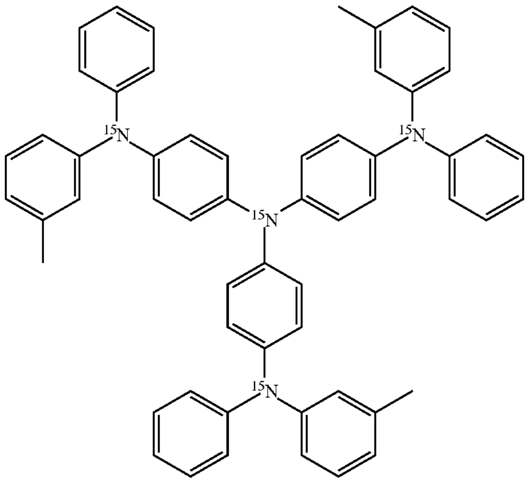
-continued
8
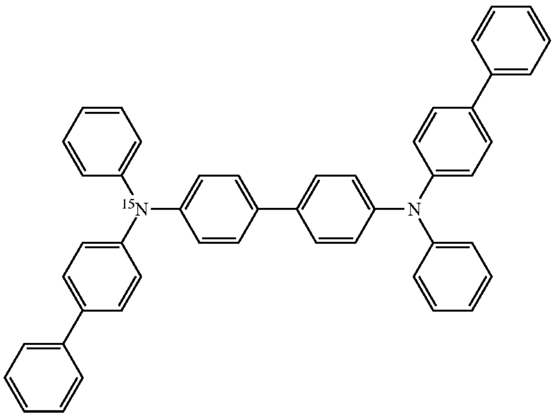
9
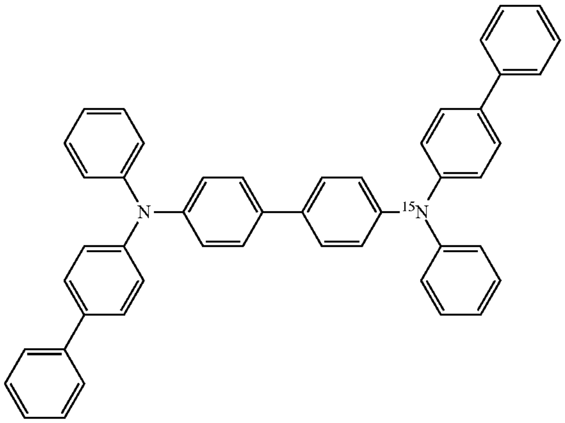
10
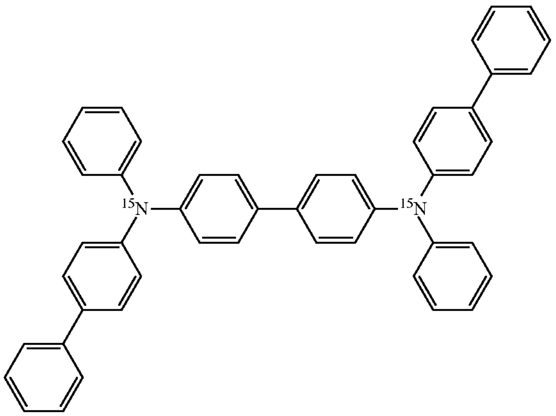
11
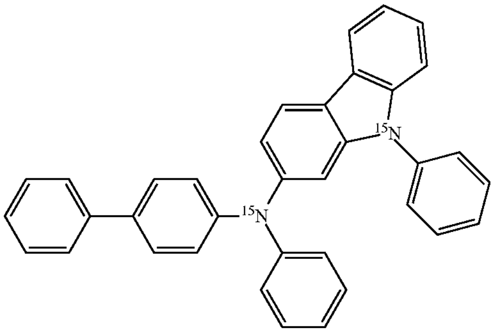

-continued
12
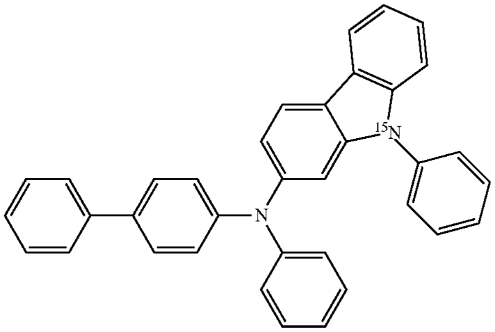
13
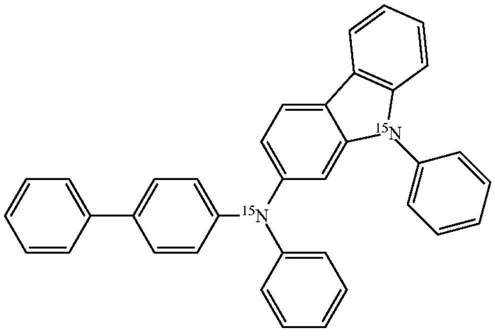
14
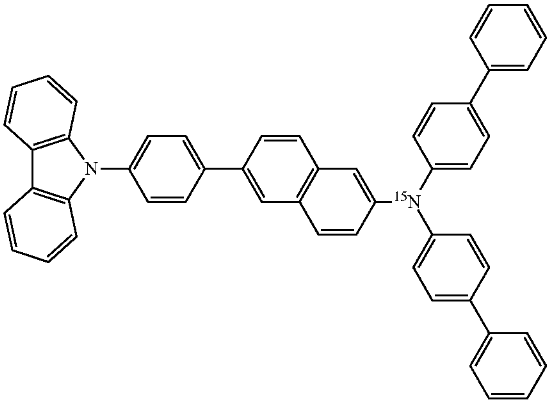
15
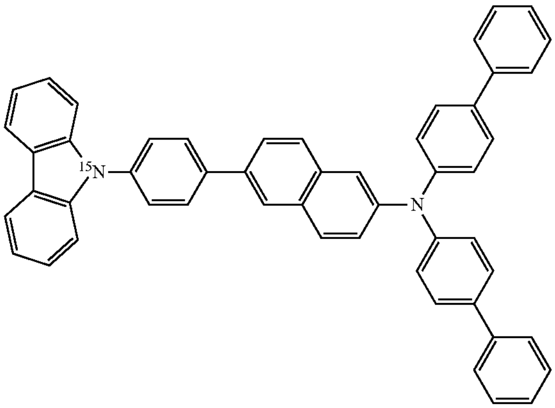
-continued
16
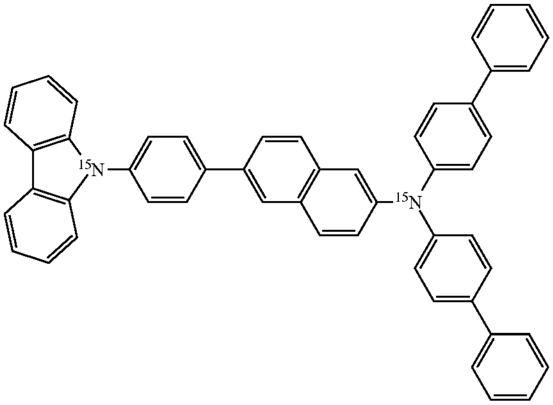
17
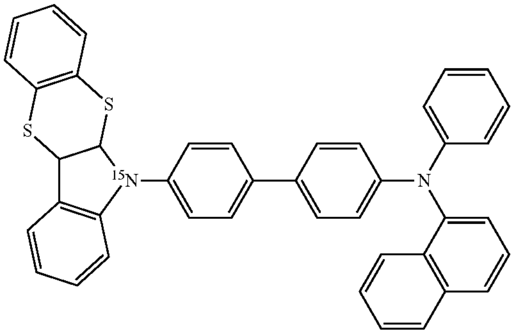
18
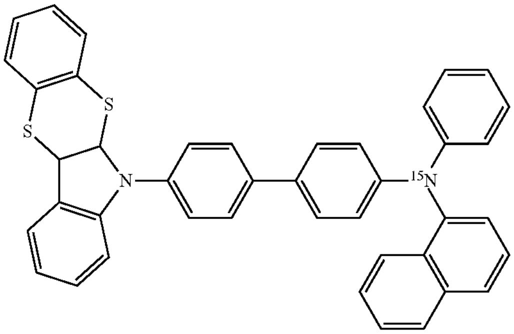
19
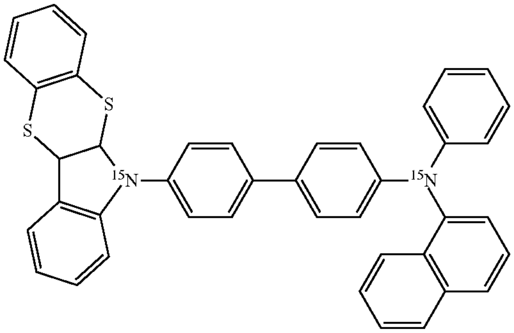

-continued

20

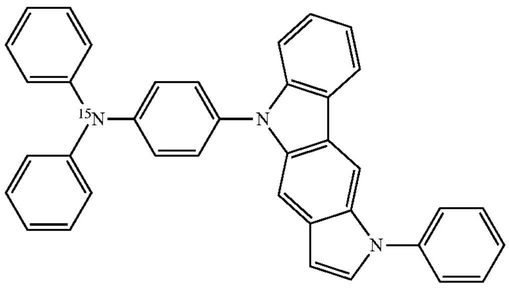

21

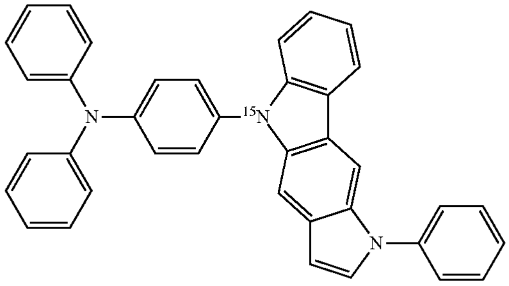

22

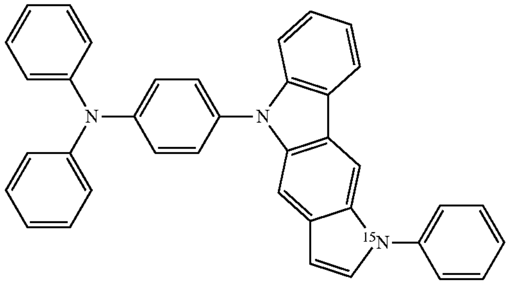

23

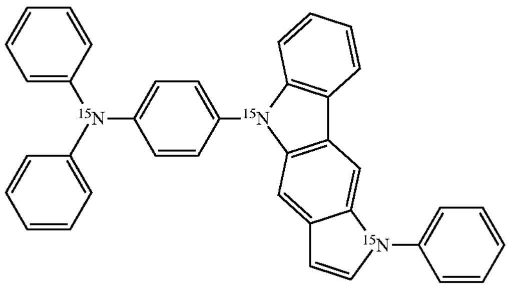

-continued

24

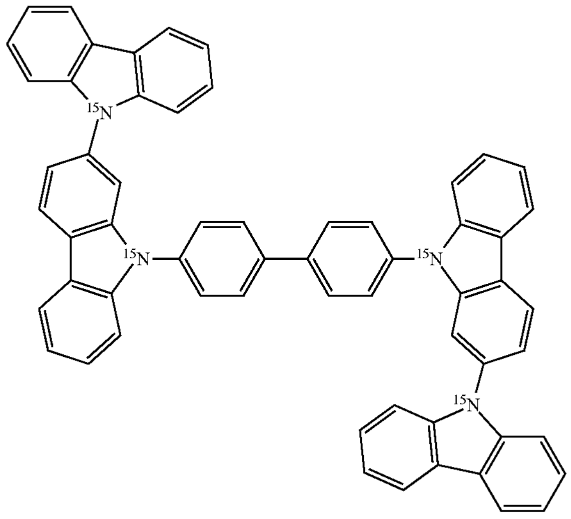

A first compound included in the light-emitting device may increase stability of a $^{15}N$—C single bond by substituting a nitrogen atom with $^{15}N$ (an isotope of nitrogen) heavier than general $^{14}N$. $^{15}N$ may reduce intramolecular vibration energy, and accordingly, energy dissipated as vibration energy may decrease, and efficiency may increase. A C—N single bond of materials having hole transport characteristics is weak, and thus stability of the C—N single bond is known to determine stability of a molecule as a whole and have a great influence on lifespan of a device. Because $^{15}N$ in the number of $m_1$ is linked to a neighboring carbon (C) via a single bond, a first compound of the disclosure may have increased stability of a C—N bond due to substitution with $^{15}N$, and thus the device may have an increased lifespan. Therefore, the first compound may be used as a material for a hole transport region that has excellent efficiency and excellent stability, and an electronic device, for example, an organic light-emitting device, including the first compound may have excellent light-emission efficiency and long lifespan.

At least one of the first compound may be used in a light-emitting device (for example, an organic light-emitting device). Accordingly, provided is a light-emitting device including: a first electrode; a second electrode facing the first electrode; and an interlayer between the first electrode and the second electrode, wherein the interlayer includes an emission layer and a hole transport region between the emission layer and the first electrode, and the hole transport region includes at least one first compound as described in the specification.

In an embodiment, the first electrode of the light-emitting device may be an anode, the second electrode of the light-emitting device may be a cathode, the interlayer may further include an electron transport region between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In an embodiment, at least one of the hole transport region and the emission layer may include an arylamine-containing compound, an acridine-containing compound, a carbazole-containing compound, or any combination thereof, or at least one of the emission layer and the electron transport region may include a silicon-containing compound, a phosphine oxide-containing compound, a sulfur oxide-containing compound, a phosphorus oxide-containing compound, a triazine-containing compound, a pyrimidine-containing compound, a pyridine-containing compound, a dibenzofuran-containing compound, a dibenzothiophene-containing compound, or any combination thereof.

In an embodiment, the light-emitting device may include: a first capping layer disposed outside the first electrode; a second capping layer disposed outside the second electrode; or the first capping layer and the second capping layer.

In embodiments, at least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth-metal complex, or any combination thereof.

According to another aspect, provided is a light-emitting device including: a first electrode; a second electrode facing the first electrode; an interlayer between the first electrode and the second electrode; and a second capping layer disposed outside the second electrode and having a refractive index of equal to or greater than about 1.6, wherein the interlayer may include an emission layer and a hole transport region between the emission layer and the first electrode, and the hole transport region may include a first compound as described above.

In an embodiment, an encapsulation portion may be arranged on the second capping layer.

In an embodiment, the encapsulation portion may include: an inorganic film including silicon nitride ($SiN_x$), silicon oxide ($SiO_x$), indium tin oxide, indium zinc oxide, or any combination thereof; an organic film including polyethylene terephthalate, polyethylenenaphthelate, polycarbonate, polyimide, polyethylene sulfonate, polyoxymethylene, polyarylate, hexamethyldisiloxane, acryl-based resin, epoxy-based resin, or any combination thereof; or a combination of the inorganic film and the organic film.

In embodiments, the first compound may be included between a pair of electrodes of the light-emitting device. Accordingly, the first compound may be included in the interlayer of the light-emitting device, for example, the hole transport region of the interlayer.

In an embodiment, the emission layer in the interlayer of the light-emitting device may include a dopant and a host, and the first compound may be included in the host. In other words, the first compound may act as a host. The emission layer may emit red light, green light, blue light, and/or white light. For example, the emission layer may emit blue light. The blue light may have a maximum luminescence wavelength in a range of, for example, about 400 nm to about 500 nm.

In an embodiment, the emission layer may include a first emission layer, a second emission layer, and a third emission layer having different emission colors, the hole transport region may include a first emission auxiliary layer between the first electrode and the first emission layer, a second emission auxiliary layer between the first electrode and the second emission layer, and a third emission auxiliary layer between the first electrode and the third emission layer, and at least one of the first emission auxiliary layer, the second emission auxiliary layer, and the third emission auxiliary layer may include the first compound.

In an embodiment, the light-emitting device may further include at least one of a first capping layer disposed outside the first electrode and a second capping layer disposed outside the second electrode, and the first compound may be included in at least one of the first capping layer and the second capping layer. More details on the first capping layer and/or the second capping layer are the same as described in the specification.

In an embodiment, the light-emitting device may include: a first capping layer disposed outside the first electrode and including the first compound; a second capping layer disposed outside the second electrode and including the first compound; or the first capping layer and the second capping layer.

The expression "(an interlayer) includes at least one first compound" as used herein may include a case in which "(an interlayer) includes one type of a compound corresponding to the first compound" and a case in which "(an interlayer) includes two or more different compounds corresponding to the first compound."

In an embodiment, the interlayer may include, as the first compound, only Compound 1. In this embodiment, Compound 1 may be included in the hole transport region of the light-emitting device. In embodiments, the interlayer may include, as the first compound, Compound 1 and Compound 2. In this regard, Compound 1 and Compound 2 may exist in an identical layer (for example, Compound 1 and Compound 2 may all exist in a hole transport region), or different layers (for example, Compound 1 may exist in an emission layer, and Compound 2 may exist in a hole transport region).

The term "interlayer" as used herein refers to a single layer or all layers located between the first electrode and the second electrode of the light-emitting device.

According to another aspect, an electronic apparatus including the light-emitting device is provided. The electronic apparatus may further include a thin-film transistor. In embodiments, the electronic apparatus may further include a thin-film transistor including a source electrode and a drain electrode, and the first electrode of the light-emitting device may be electrically connected to the source electrode or the drain electrode. In an embodiment, the electronic apparatus may further include a color filter, a color conversion layer, a touch screen layer, a polarizing layer, or any combination thereof. More details on the electronic apparatus are the same as described in the specification.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

[First Electrode 110]

In FIG. 1, a substrate may be additionally disposed under the first electrode 110 or above the second electrode 150. The substrate may be a glass substrate or a plastic substrate. The substrate may be a flexible substrate. In embodiments, the substrate may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a high work function material that can easily inject holes may be used as a material for forming the first electrode 110.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure consisting of a single layer or a multi-layered structure including multiple layers. In an embodiment, the first electrode 110 may have a three-layered structure of ITO/Ag/ITO.

[Interlayer 130]

The interlayer 130 is located on the first electrode 110. The interlayer 130 includes an emission layer.

The interlayer 130 may further include a hole transport region disposed between the first electrode 110 and the emission layer and an electron transport region disposed between the emission layer and the second electrode 150.

The interlayer 130 may further include metal-containing compounds such as organometallic compounds, inorganic materials such as quantum dots, and the like, in addition to various organic materials.

In embodiments, the interlayer 130 may include, i) two or more emitting units sequentially stacked between the first electrode 110 and the second electrode 150 and ii) at least one charge generation layer located between adjacent ones of the emitting units. When the interlayer 130 includes the emitting units and the at least one charge generation layer as described above, the light-emitting device 10 may be a tandem light-emitting device.

[Hole Transport Region in Interlayer 130]

The hole transport region may have i) a single-layered structure consisting of a single layer consisting of a single material, ii) a single-layered structure consisting of a single layer including different materials, or iii) a multi-layered structure including multiple layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

[Formula 201]

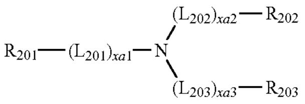

[Formula 202]

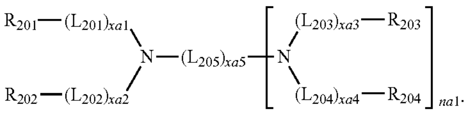

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_1$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_5$-$C_{60}$ polycyclic group unsubstituted or substituted with at least one $R_{10a}$ (for example, a carbazole group) (for example, see Compound HT16 or the like), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_5$-$C_{60}$ polycyclic group unsubstituted or substituted with at least one $R_{10a}$, and na1 may be an integer from 1 to 4.

In an embodiment, Formulae 201 and 202 may each include at least one of the groups represented by Formulae CY201 to CY217:

CY201

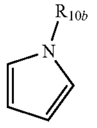

CY202

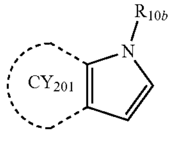

-continued

CY203

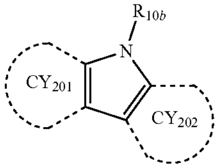

CY204

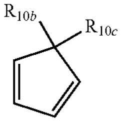

CY205

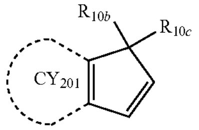

CY206

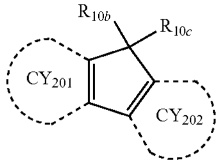

CY207

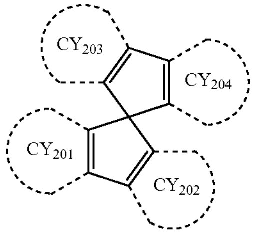

CY208

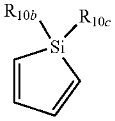

CY209

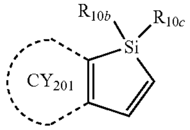

CY210

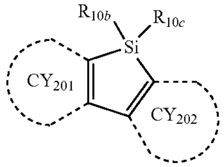

CY211

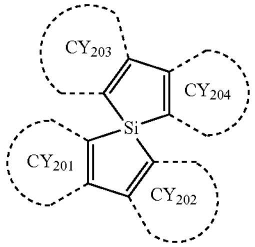

-continued

CY212

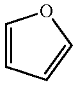

CY213

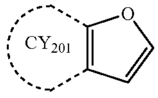

CY214

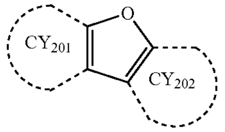

CY215

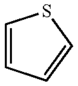

CY216

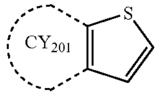

CY217

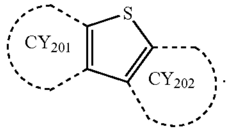

Regarding Formulae CY201 to CY217, $R_{10b}$ and $R_{10c}$ are the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$ described herein.

In an embodiment, ring CY201 to ring CY204 in Formulae CY201 to CY217 may each independently be a benzene group, a naphthalene group, a phenanthrene group, or an anthracene group.

In an embodiment, Formulae 201 and 202 may each include at least one of the groups represented by Formulae CY201 to CY203.

In an embodiment, Formula 201 may include at least one of the groups represented by Formulae CY201 to CY203 and at least one of the groups represented by Formulae CY204 to CY217.

In embodiments, in Formula 201, xa1 is 1, $R_{201}$ is a group represented by one of Formulae CY201 to CY203, xa2 is 0, and $R_{202}$ is a group represented by one of Formulae CY204 to CY207.

In embodiments, each of Formulae 201 and 202 may not include groups represented by Formulae CY201 to CY203.

In embodiments, each of Formulae 201 and 202 may not include groups represented by Formulae CY201 to CY203 and may include at least one of the groups represented by Formulae CY204 to CY217.

In an embodiment, each of Formulae 201 and 202 may not include groups represented by Formulae CY201 to CY217.

For example, the hole transport region may include one of following Compounds HT1 to HT45, m-MTDATA, TDATA, 2-TNATA, NPB(NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
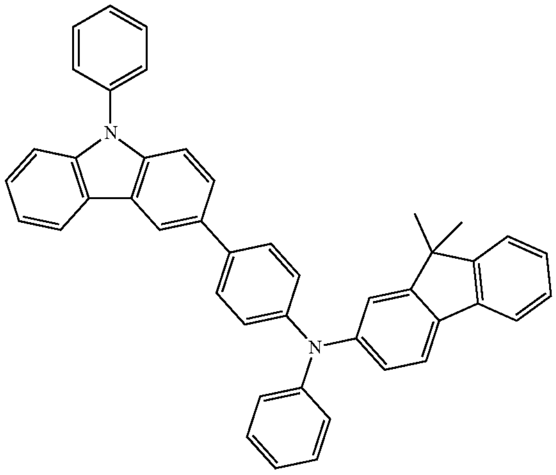
HT2
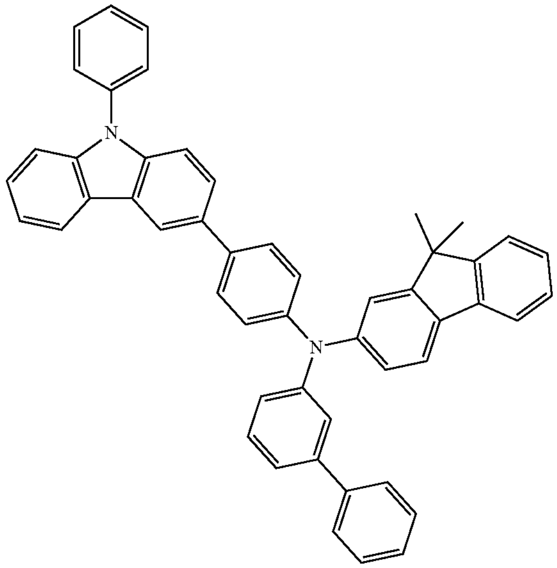
HT3
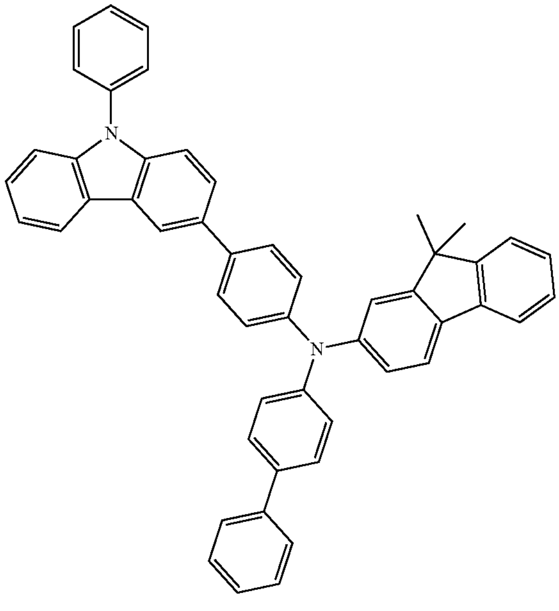
HT4
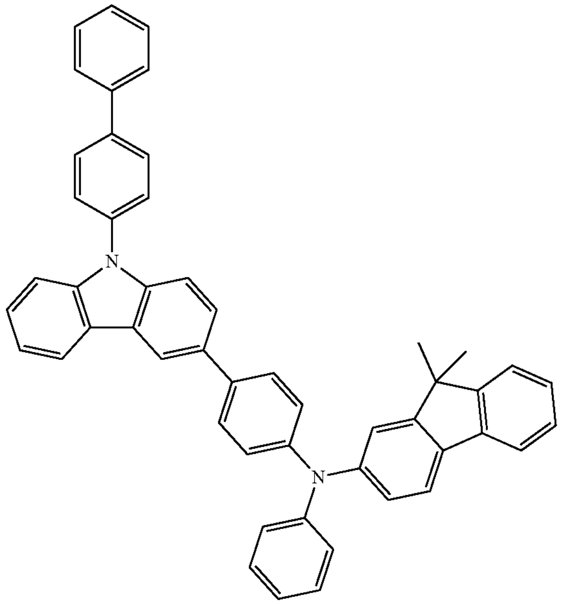

-continued
HT5
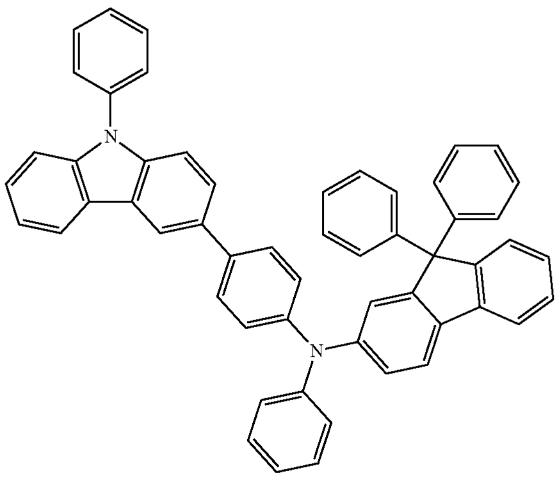
HT6
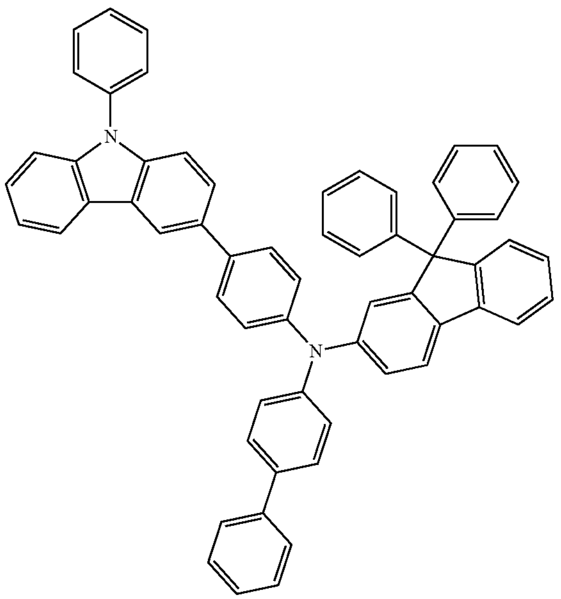
HT7
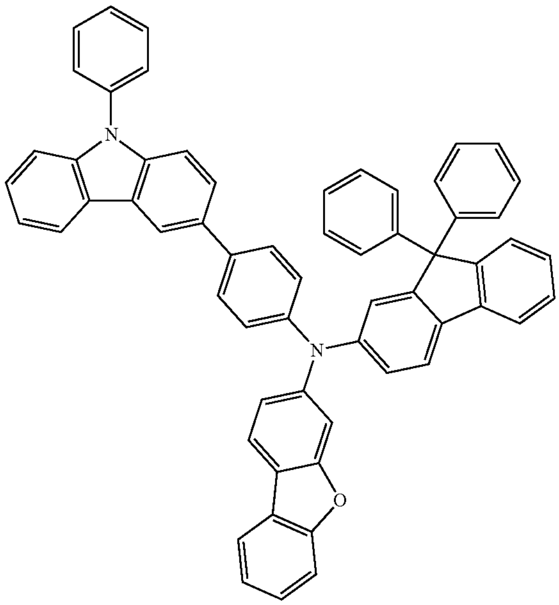
HT8
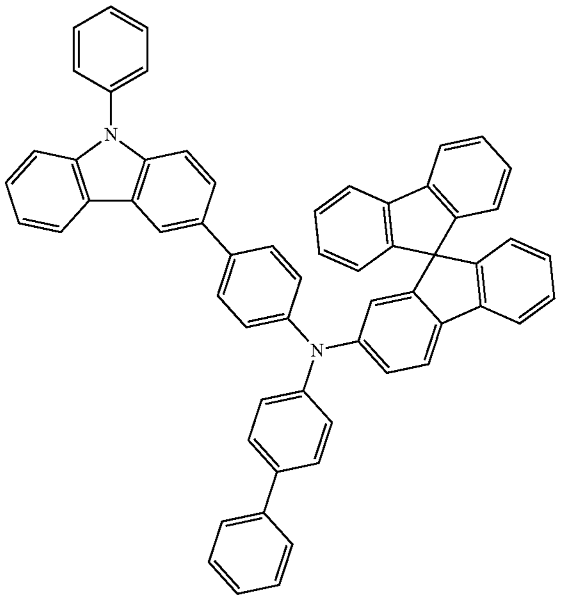

-continued
HT9
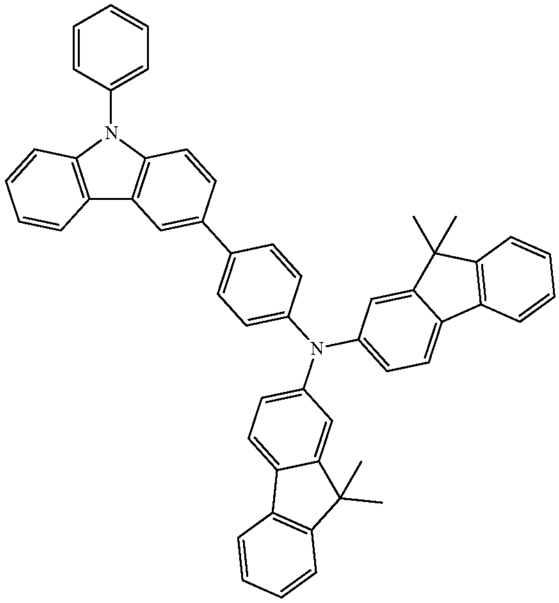
HT10
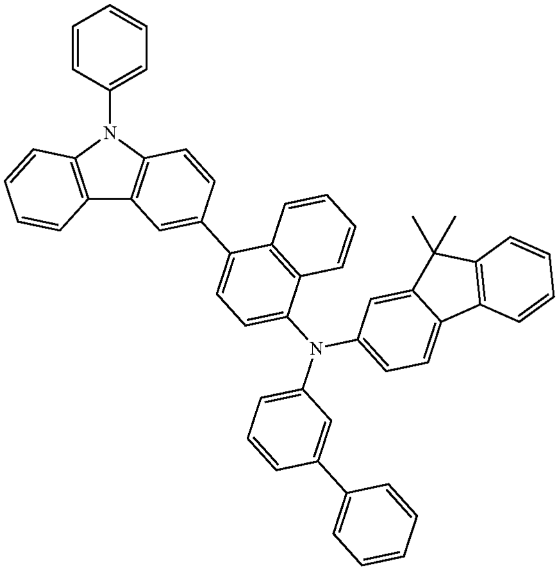
HT11
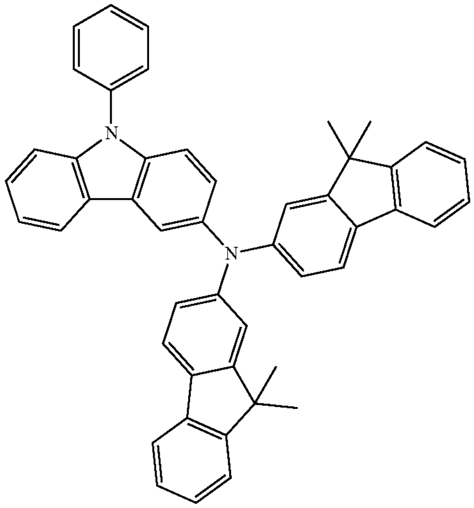
HT12
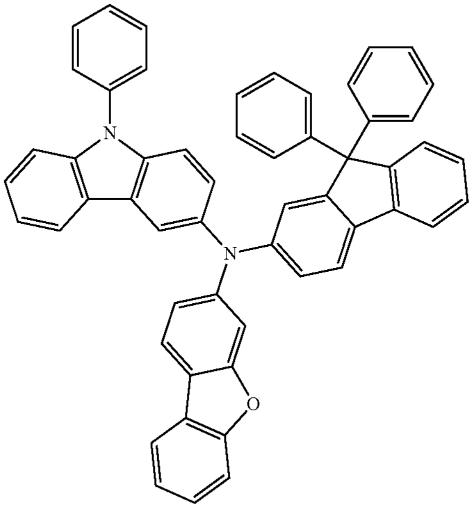

-continued
HT13
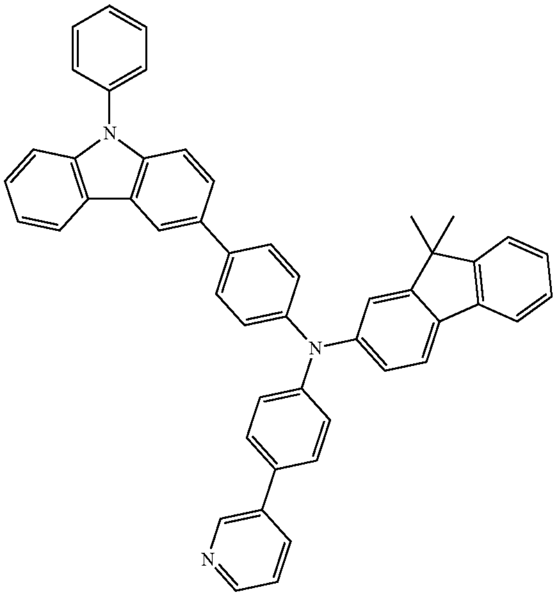
HT14
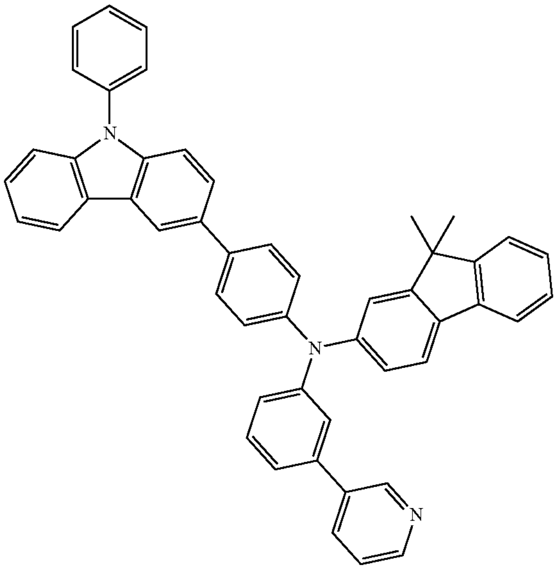
HT15
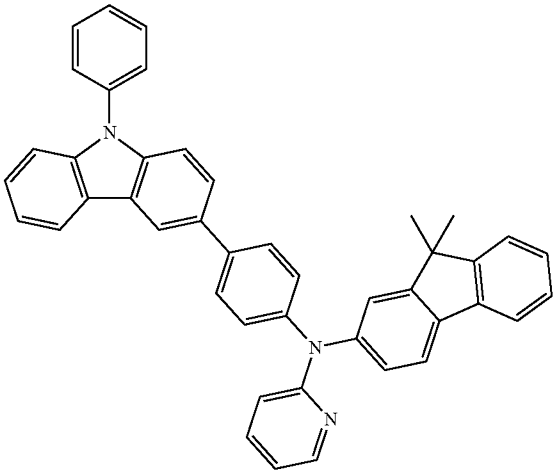
HT16
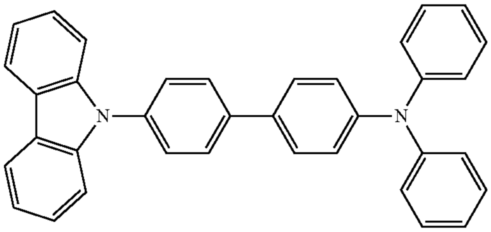
HT17
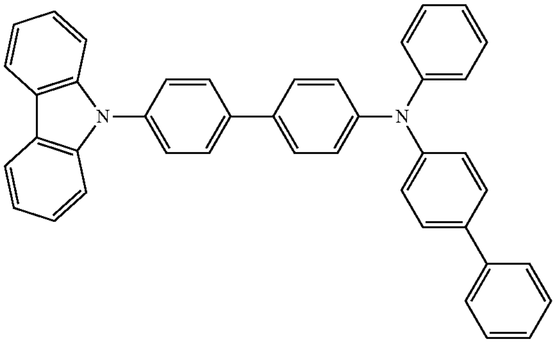
HT18
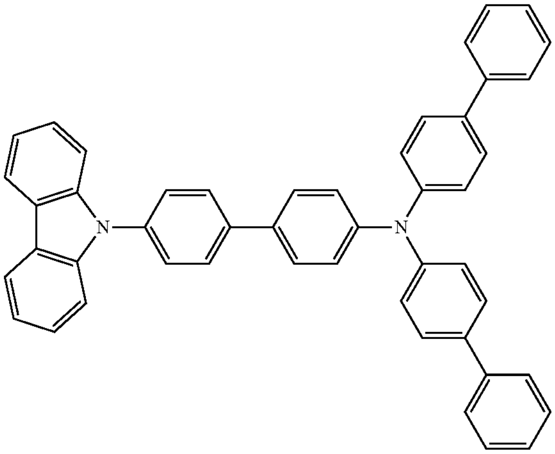

-continued
HT19
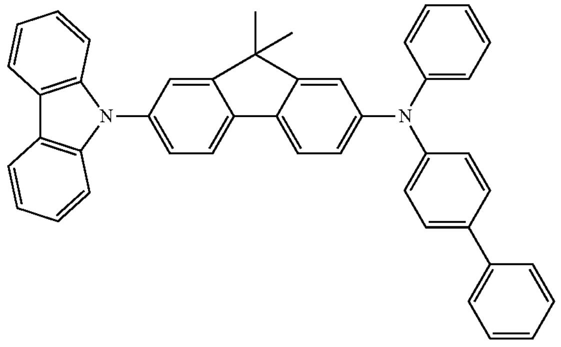
HT20
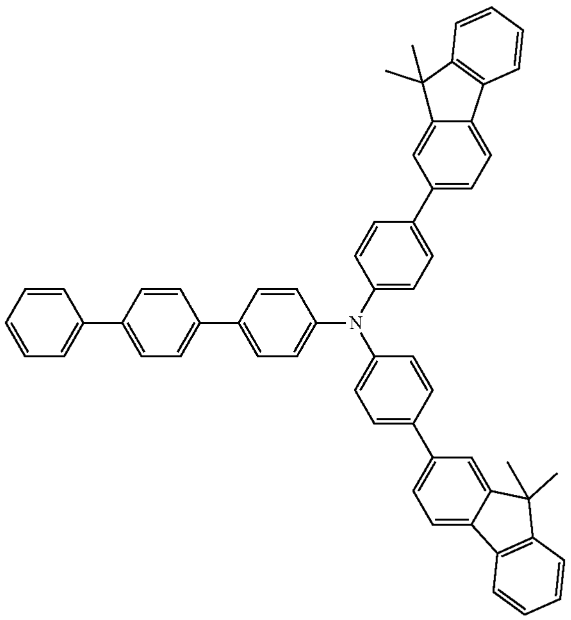
HT21
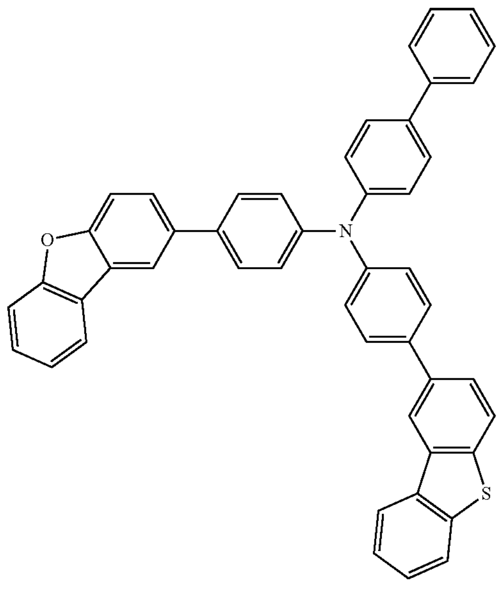
HT22
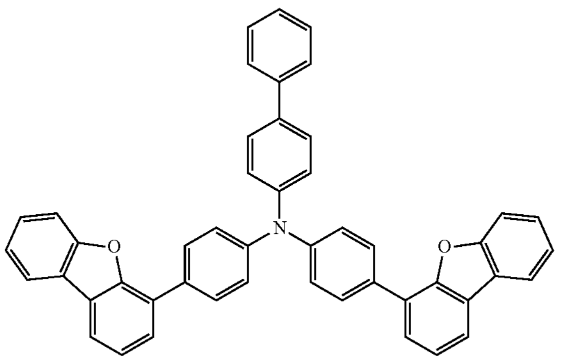

-continued
HT23
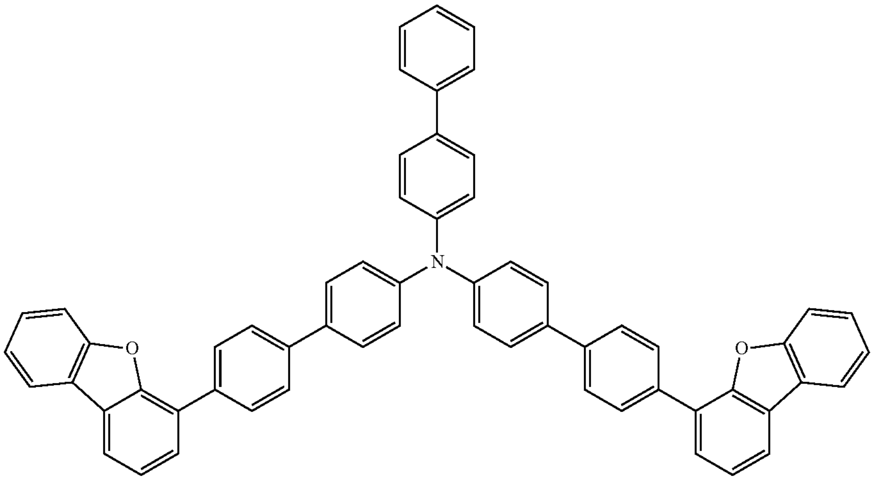
HT24
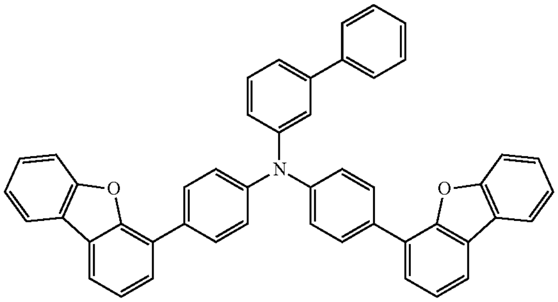
HT25
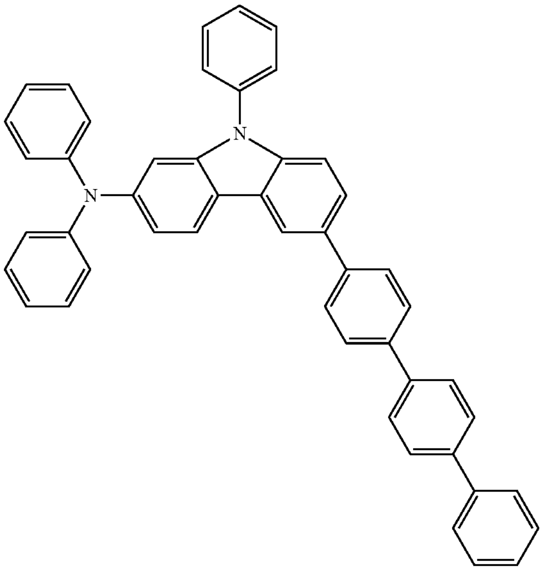
HT26
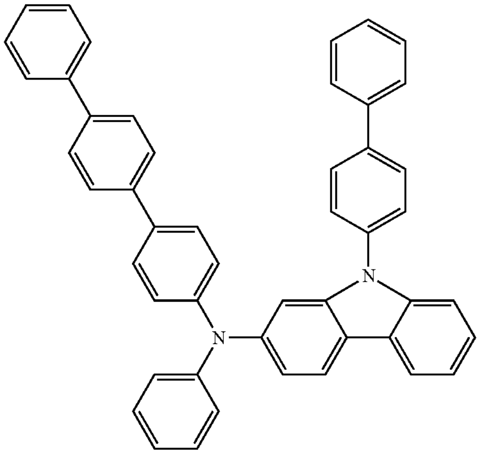
HT27
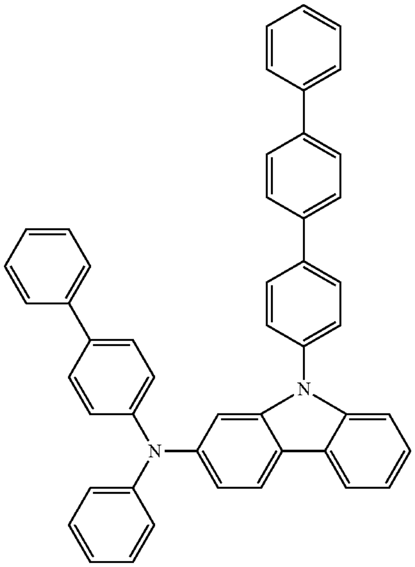

-continued
HT28
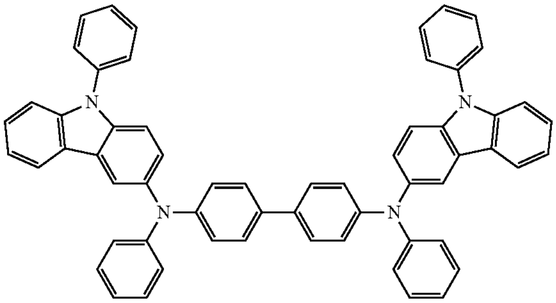
HT29
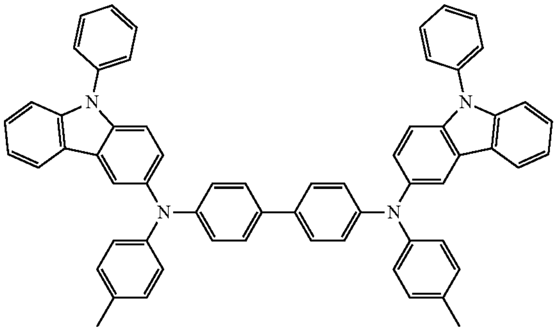
HT30
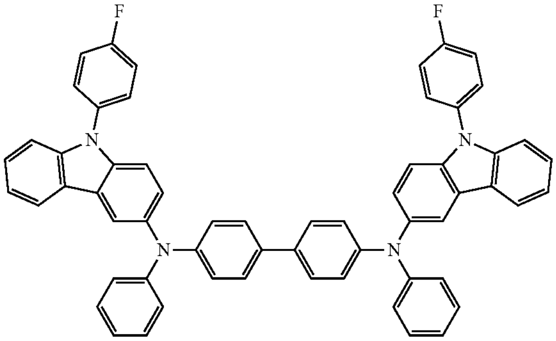
HT31
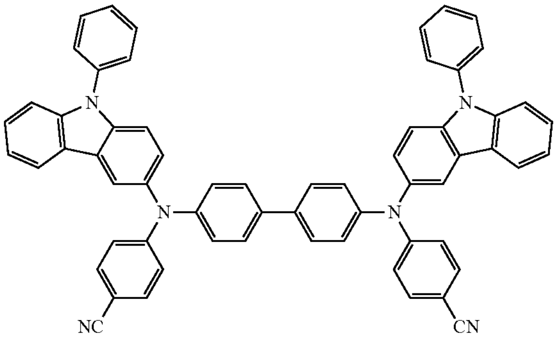
HT32
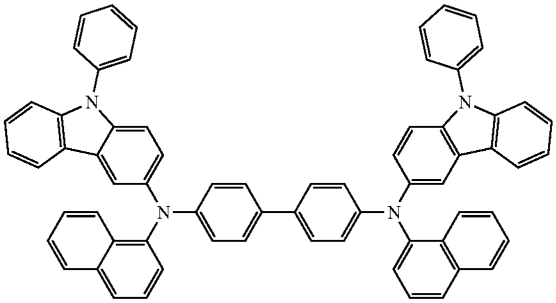
HT33
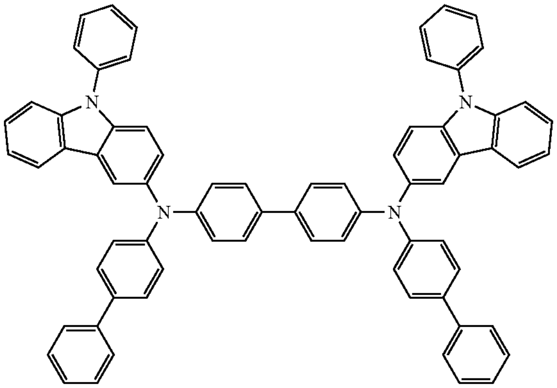
HT34
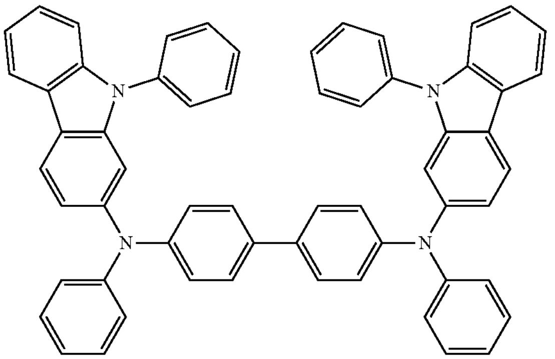
HT35
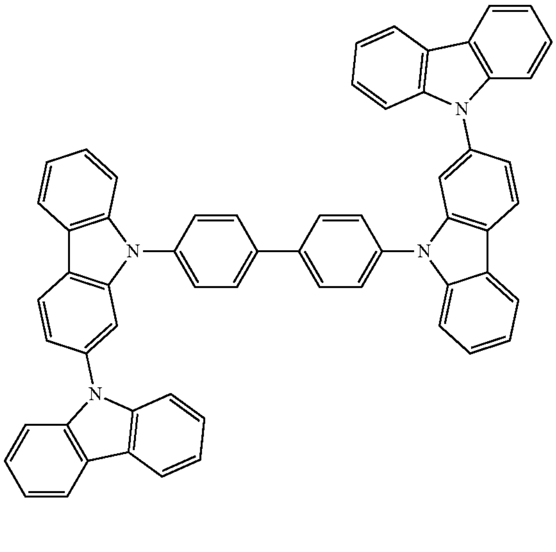

-continued
HT36
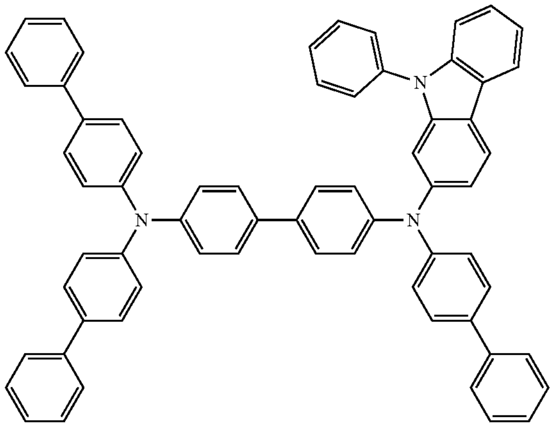
HT37
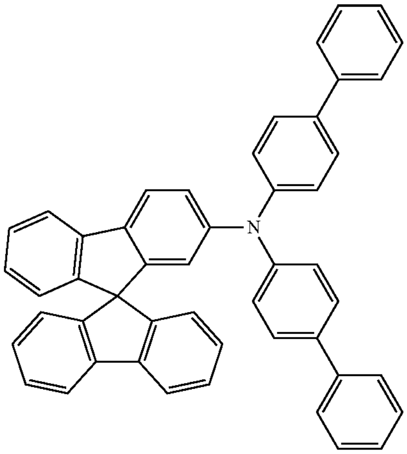
HT38
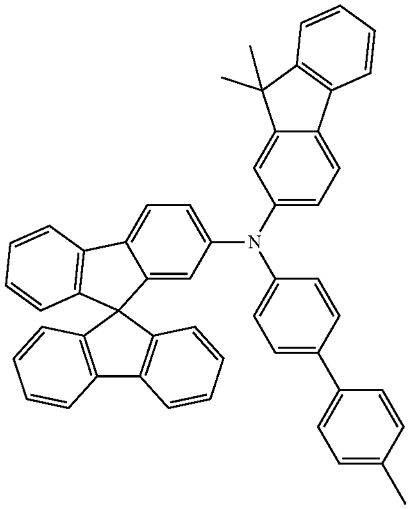
HT39
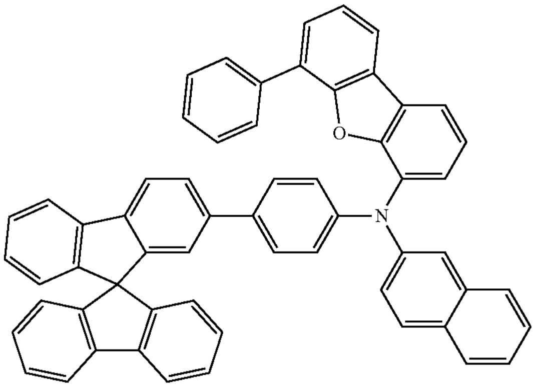
HT40
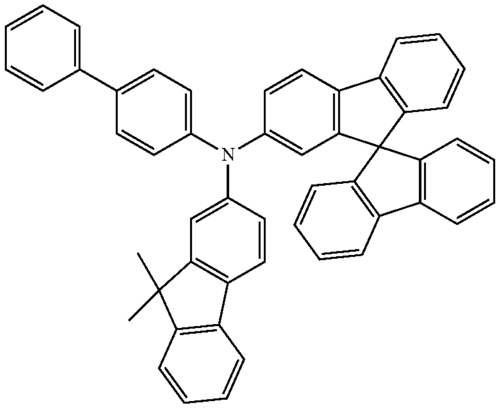
HT41
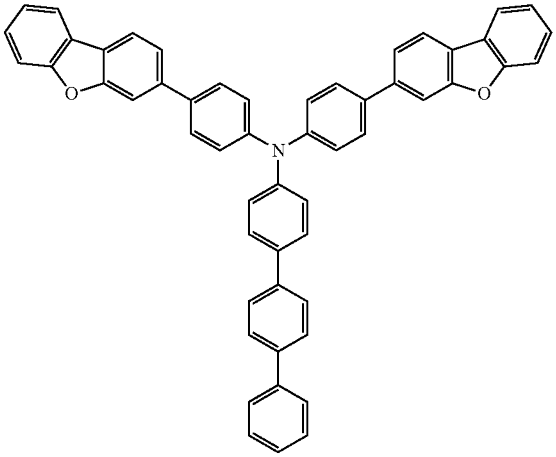

-continued
HT42
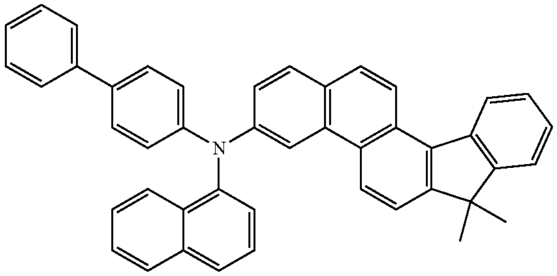
HT43
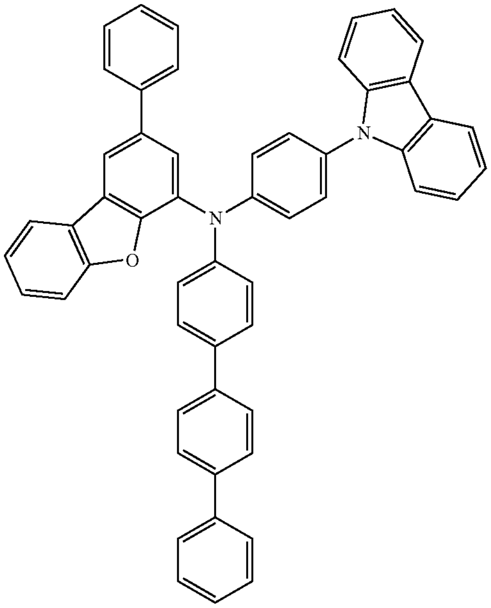
HT44
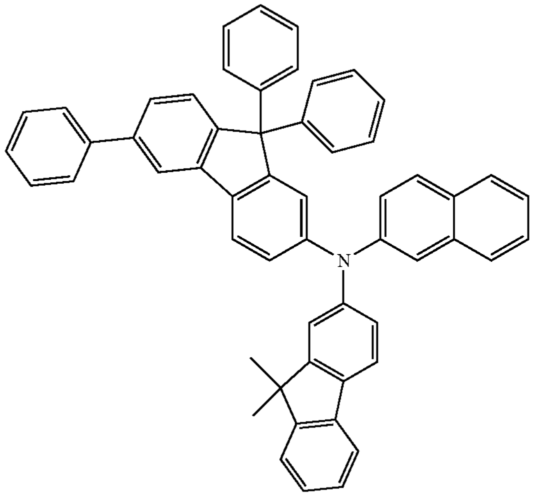
HT45
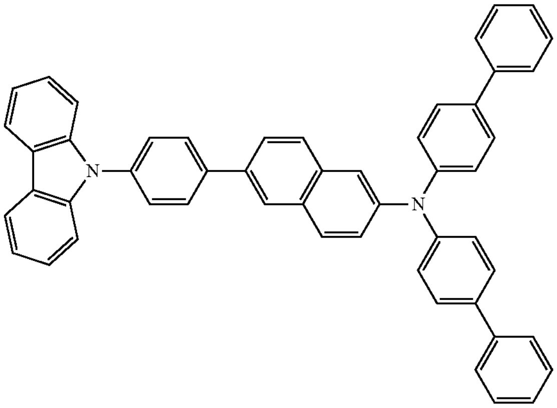

-continued
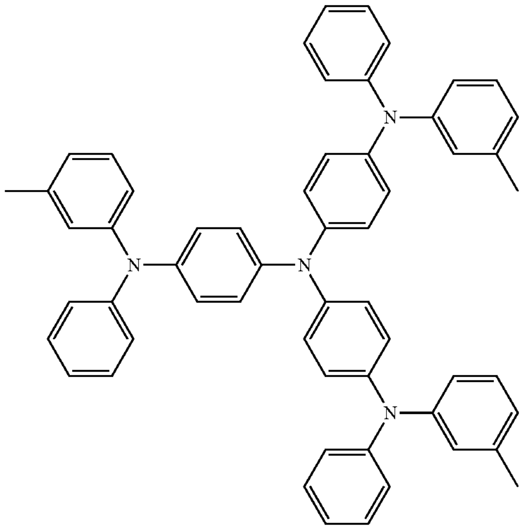
m-MTDATA
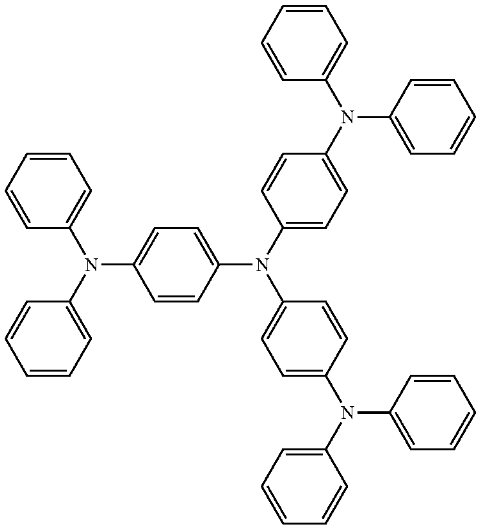
TDATA
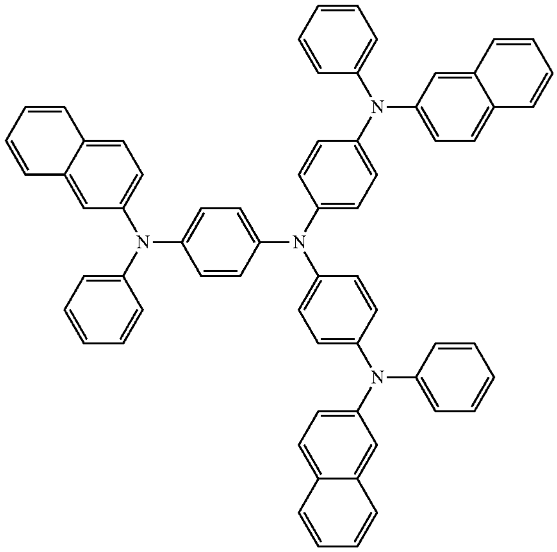
2-TNATA
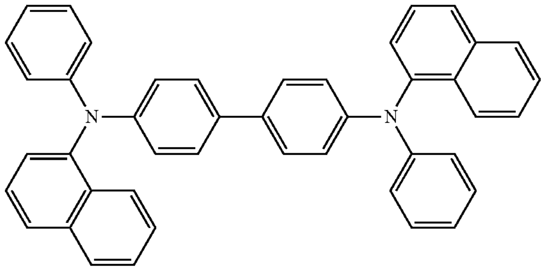
NPB
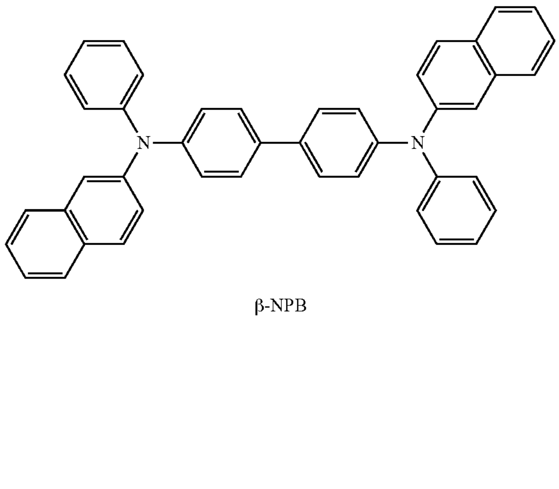
β-NPB
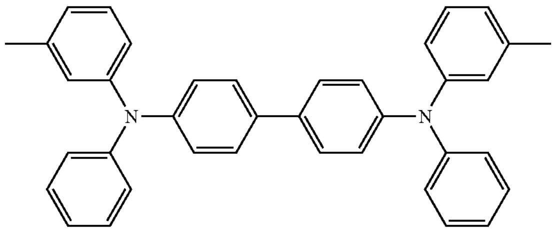
TPD -continued

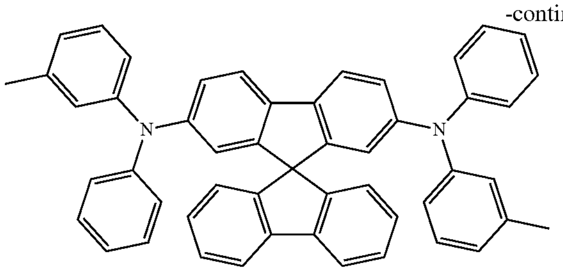

Spiro-TPD

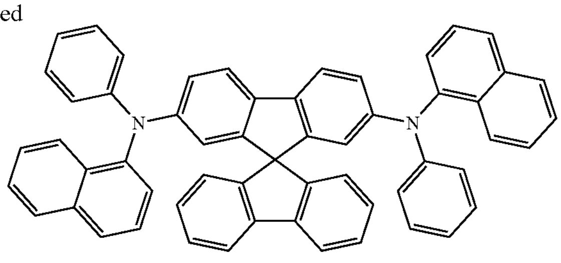

Spiro-NPB

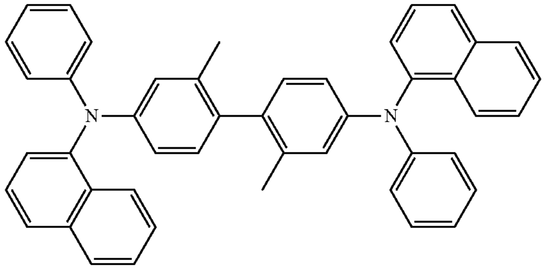

methylated-NPB

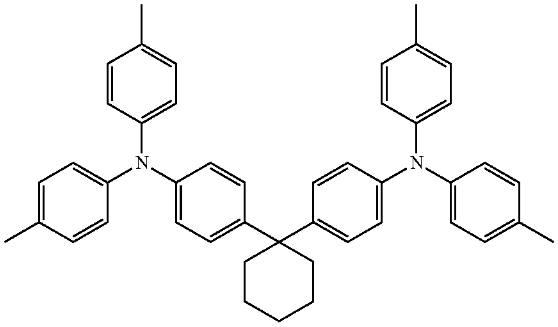

TAPC

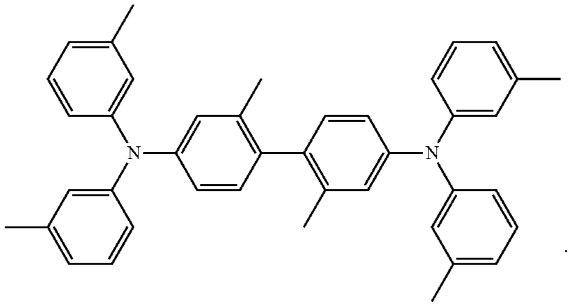

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

[p-Dopant]

The hole transport region may further include, in addition to these materials, a charge-generating material for the improvement of conductive properties. The charge-generating material may be uniformly or non-uniformly dispersed in the hole transport region (for example, in the form of a single layer of a charge-generating material).

The charge-generating material may be, for example, a p-dopant.

In an embodiment, a lowest unoccupied molecular orbital (LUMO) energy level of the p-dopant may be equal to or less than about −3.5 eV.

In an embodiment, the p-dopant may include a quinone derivative, a cyano group-containing compound, a compound containing element EL1 and element EL2, or any combination thereof.

Examples of the quinone derivative may include TCNQ and F4-TCNQ.

Examples of the cyano group-containing compound may include HAT-CN and a compound represented by Formula 221 below.

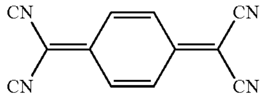

TCNQ

-continued

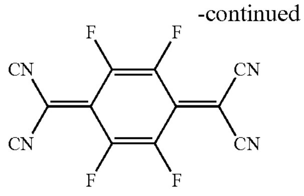

F4-TCNQ

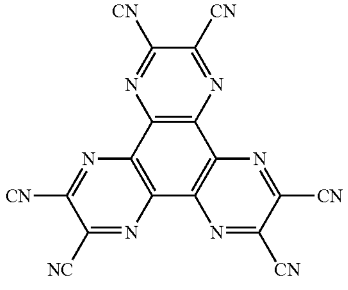

HAT-CN

[Formula 221]

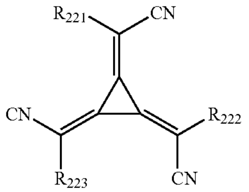

In Formula 221, $R_{221}$ to $R_{223}$ may each independently be a $C_1$-$C_{60}$ carbocyclic group unsubstituted or substituted with at least one $R_{10a}$ or a $C_1$-$C_{60}$ heterocyclic group unsubstituted or substituted with at least one $R_{10a}$, at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the compound containing element EL1 and element EL2, element EL1 may be metal, metalloid, or a combination thereof, and element EL2 may be a non-metal, metalloid, or a combination thereof.

Examples of the metal may include: an alkali metal (for example, lithium (Li), sodium (Na), potassium (K), rubidium (Rb), cesium (Cs), or the like); an alkaline earth metal (for example, beryllium (Be), magnesium (Mg), calcium (Ca), strontium (Sr), barium (Ba), or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper(Cu), silver (Ag), gold (Au), or the like); a post-transition metal (for example, zinc (Zn), indium (In), tin (Sn), or the like); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like).

Examples of the metalloid may include silicon (Si), antimony (Sb), and tellurium (Te).

Examples of the non-metal may include oxygen (O) and halogen (for example, F, Cl, Br, I, etc.).

In an embodiment, examples of the compound containing element EL1 and element EL2 may include metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or any combination thereof.

Examples of the metal oxide may include tungsten oxide (for example, WO, $W_2O_3$, $WO_2$, $WO_3$, or $W_2O_5$), vanadium oxide (for example, VO, $V_2O_3$, $VO_2$, or $V_2O_5$), molybdenum oxide (for example, MoO, $Mo_2O_3$, $MoO_2$, $MoO_3$, or $Mo_2O_5$), and rhenium oxide (for example, $ReO_3$).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, or $TiI_4$), zirconium halide (for example, $ZrF_4$, $ZrCl_4$, $ZrBr_4$, or $ZrI_4$), hafnium halide (for example, $HfF_4$, $HfCl_4$, $HfBr_4$, or $HfI_4$), vanadium halide (for example, $VF_3$, $VCl_3$, $VBr_3$, or $VI_3$), niobium halide (for example, $NbF_3$, $NbCl_3$, $NbBr_3$, or $NbI_3$), tantalum halide (for example, $TaF_3$, $TaCl_3$, $TaBr_3$, or $TaI_3$), chromium halide (for example, $CrF_3$, $CrCl_3$, $CrBr_3$, or $CrI_3$), molybdenum halide (for example, $MoF_3$, $MoCl_3$, $MoBr_3$, or Mob), tungsten halide (for example, $WF_3$, $WCl_3$, $WBr_3$, or $WI_3$), manganese halide (for example, $MnF_2$, $MnCl_2$, $MnBr_2$, or $MnI_2$), technetium halide (for example, $TcF_2$, $TcCl_2$, $TcBr_2$, or $TcI_2$), rhenium halide (for example, $ReF_2$, $ReCl_2$, $ReBr_2$, or $ReI_2$), iron halide (for example, $FeF_2$, $FeCl_2$, $FeBr_2$, or $FeI_2$), ruthenium halide (for example, $RuF_2$, $RuCl_2$, $RuBr_2$, or $RuI_2$), osmium halide (for example, $OsF_2$, $OsCl_2$, $OsBr_2$, or $OsI_2$), cobalt halide (for example, $CoF_2$, $CoCl_2$, $CoBr_2$, or $CoI_2$), rhodium halide (for example, $RhF_2$, $RhCl_2$, $RhBr_2$, or $RhI_2$), iridium halide (for example, $IrF_2$, $IrCl_2$, $IrBr_2$, or $IrI_2$), nickel halide (for example, $NiF_2$, $NiCl_2$, $NiBr_2$, or $NiI_2$), palladium halide (for example, $PdF_2$, $PdCl_2$, $PdBr_2$, or $PdI_2$), platinum halide (for example, $PtF_2$, $PtCl_2$, $PtBr_2$, or $PtI_2$), copper halide (for example, CuF, CuCl, CuBr, or CuI), silver halide (for example, AgF, AgCl, AgBr, or AgI), and gold halide (for example, AuF, AuCl, AuBr, or AuI).

Examples of the post-transition metal halide may include zinc halide (for example, $ZnF_2$, $ZnCl_2$, $ZnBr_2$, or $ZnI_2$), indium halide (for example, $InI_3$), and tin halide (for example, $SnI_2$).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$).

Examples of the metal telluride may include an alkali metal telluride (for example, $Li_2Te$, $Na_2Te$, $K_2Te$, $Rb_2Te$, or $Cs_2Te$), alkaline earth metal telluride (for example, BeTe, MgTe, CaTe, SrTe, or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), post-transition metal telluride (for example, ZnTe), and lanthanide metal telluride (for example, LaTe, CeTe, PrTe, NdTe, PmTe, EuTe, GdTe, TbTe, DyTe, HoTe, ErTe, TmTe, YbTe, or LuTe).

[Emission Layer in Interlayer 130]

When the light-emitting device 10 is a full-color light-emitting device, the emission layer may be patterned into a red emission layer, a green emission layer, and/or a blue emission layer, according to a sub-pixel. In embodiments, the emission layer may have a stacked structure of two or more layers of a red emission layer, a green emission layer, and a blue emission layer, in which the two or more layers contact each other or are separated from each other to emit white light. In embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

The amount of the dopant in the emission layer may be in a range of about 0.01 to about 15 parts by weight based on 100 parts by weight of the host.

In embodiments, the emission layer may include a quantum dot.

$R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are the same as described in connection with $Q_1$.

In an embodiment, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination thereof:

[Formula 301-1]

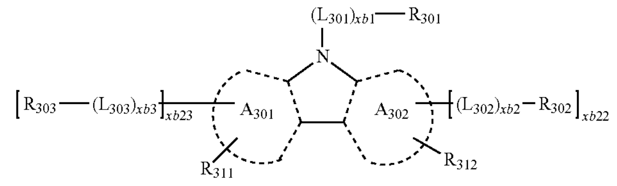

[Formula 301-2]

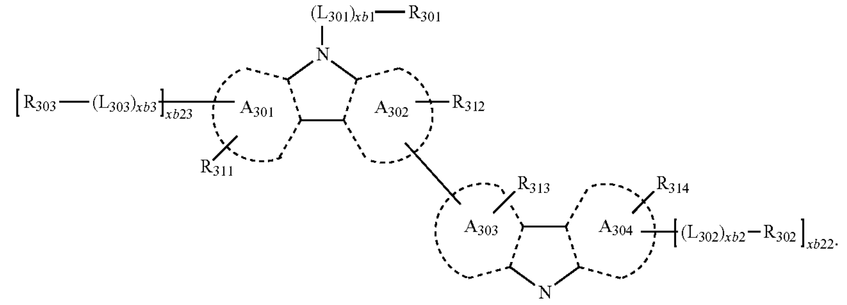

The emission layer may include a delayed fluorescence material. The delayed fluorescence material may act as a host or a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within this range, excellent luminescence characteristics may be obtained without a substantial increase in driving voltage.

[Host]

The host may include a compound represented by Formula 301 below:

$[Ar_{301}]_{xb11}$-$[(L_{301})_{xb1}$-$R_{301}]_{xb21}$ [Formula 301]

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described in the specification, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are the same as described in connection with $R_{301}$.

In an embodiment, the host may include an alkaline earth metal complex. In an embodiment, the host may include a Be complex (for example, Compound H55), a Mg complex, a Zn complex, or any combination thereof.

In an embodiment, the host may include one of following Compounds H1 to H128, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di(carbazol-9-yl)benzene (mCP), 1,3,5-tri(carbazol-9-yl) benzene (TCP), or any combination thereof:
H1
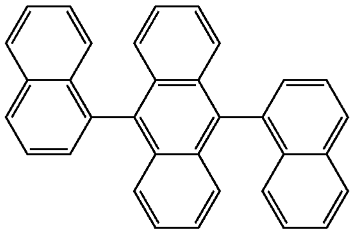
H2
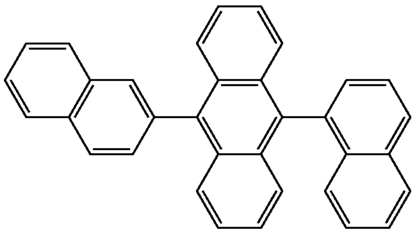
H3
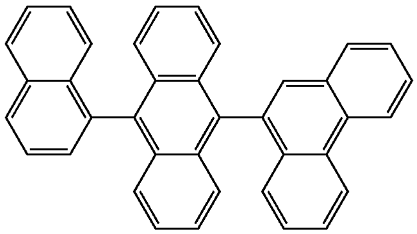
H4
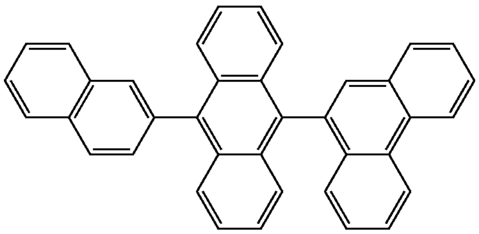
H5
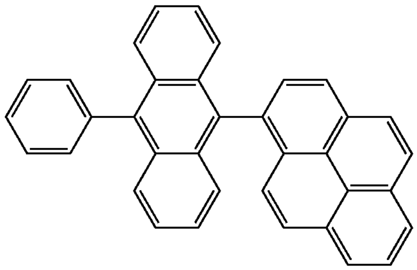
H6
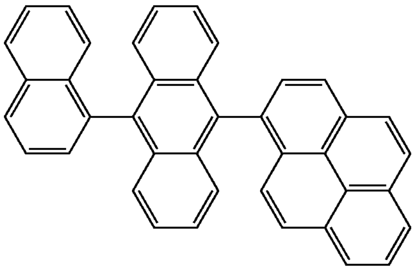
H7
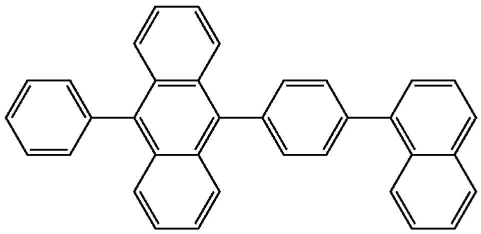
H8
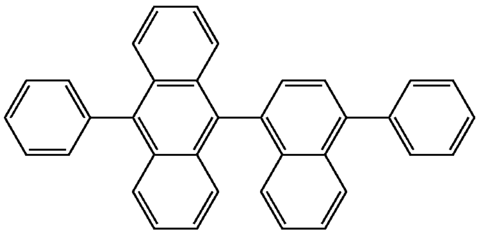
H9
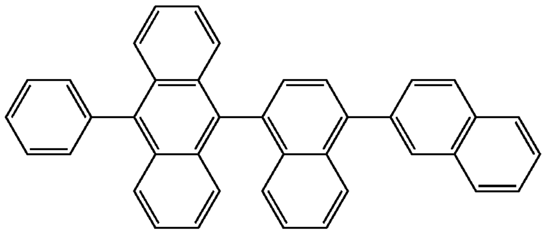
H10
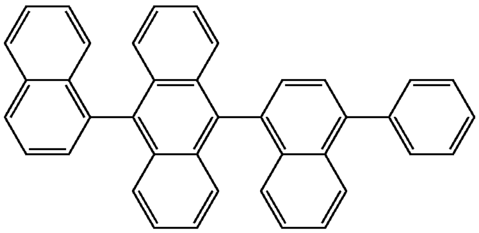
H11
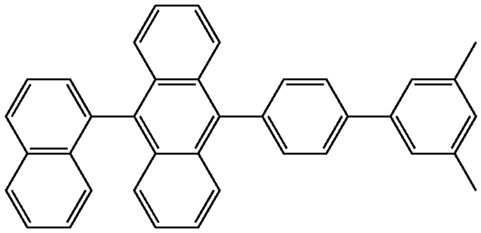
H12
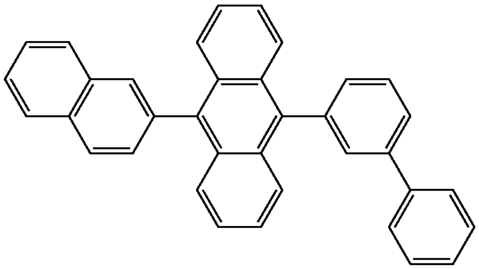

-continued
H13
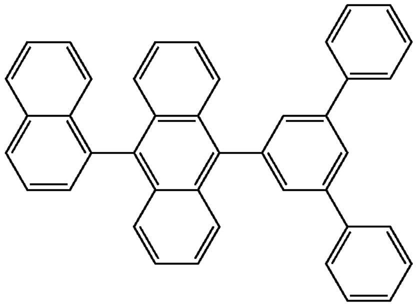
H14
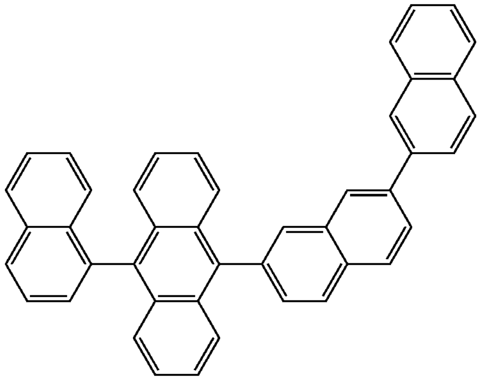
H15
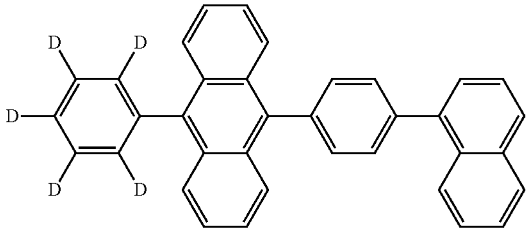
H16
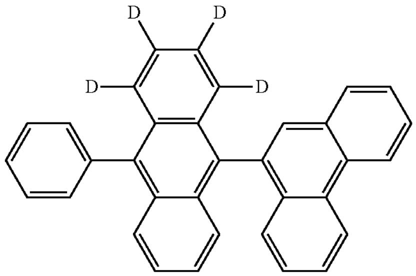
H17
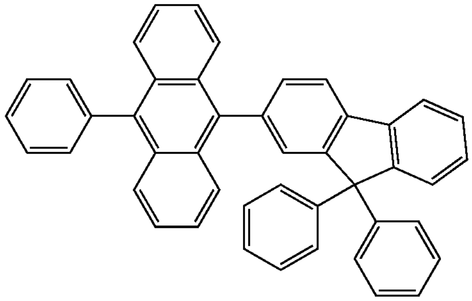
H18
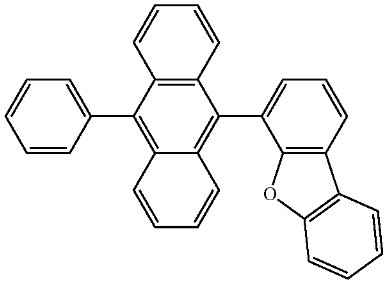
H19
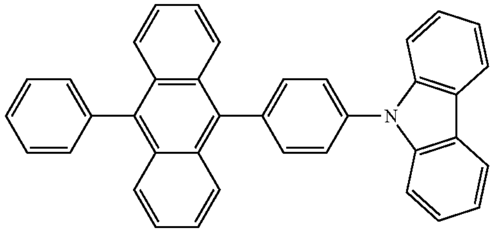
H20
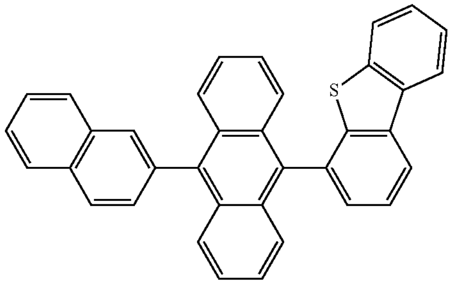

-continued
H21
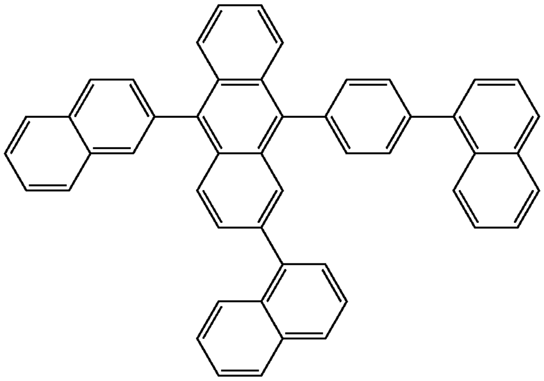
H22
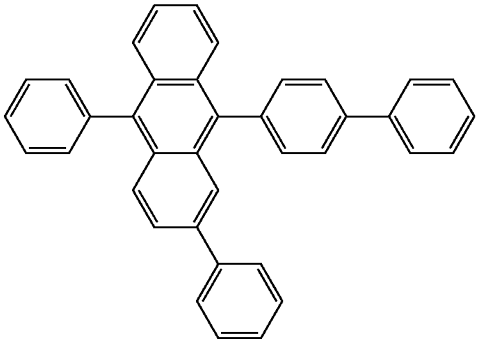
H23
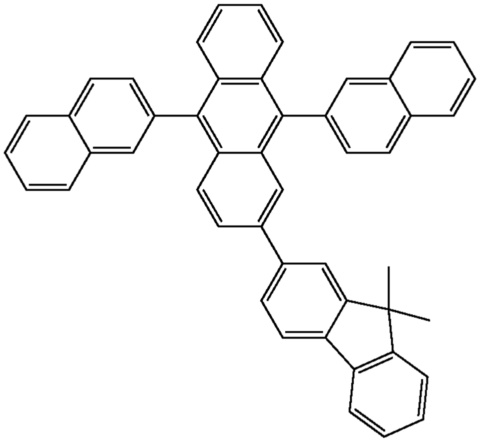
H24
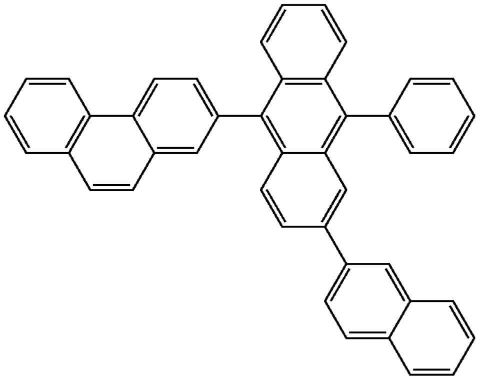
H25
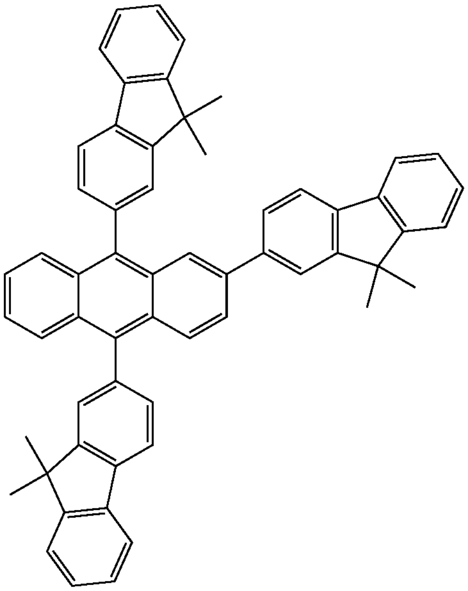
H26
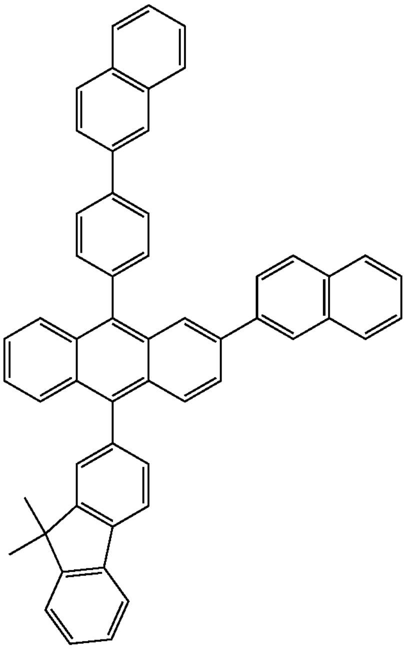

-continued
H27
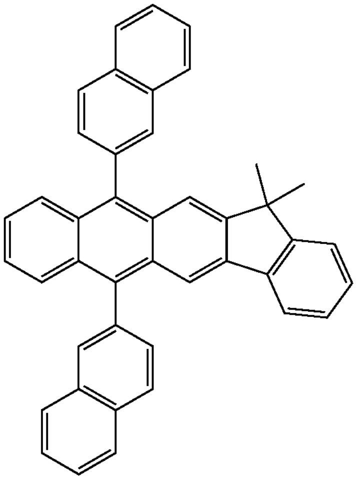
H28
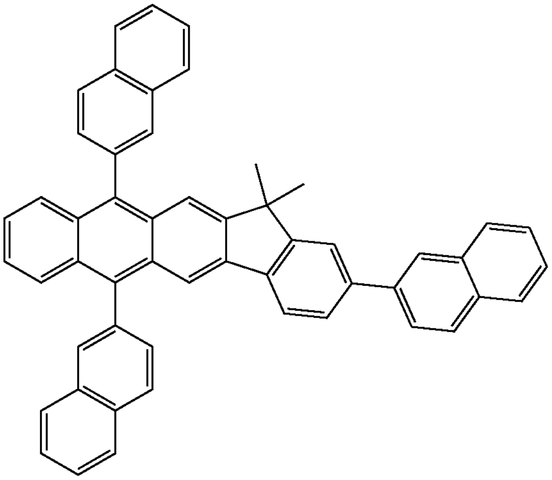
H29
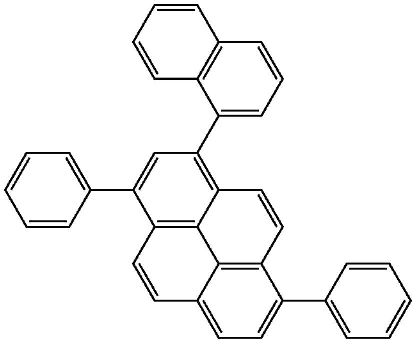
H30
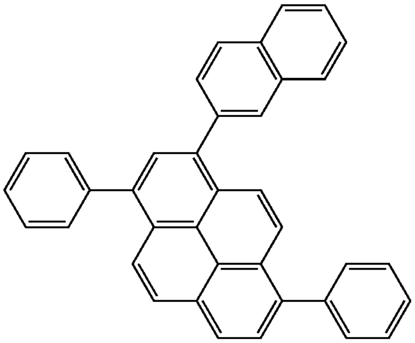
H31
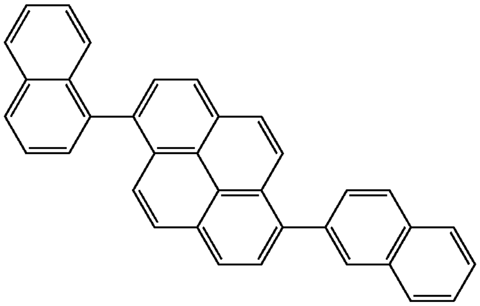
H32
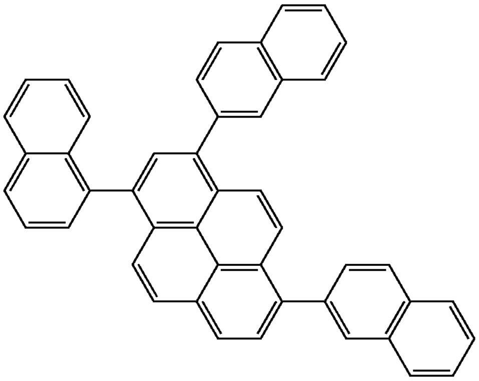
H33
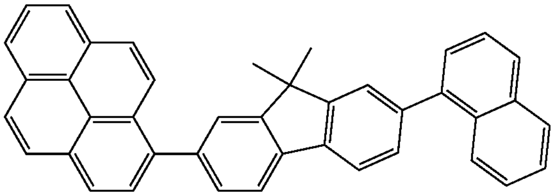

-continued
H34
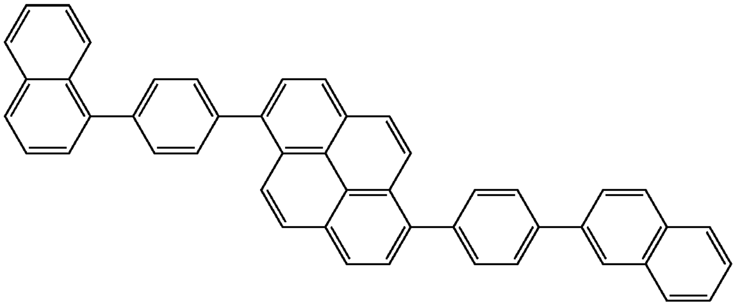
H35
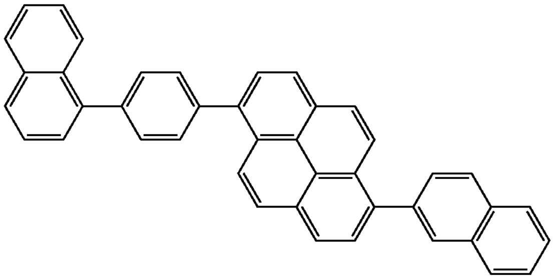
H36
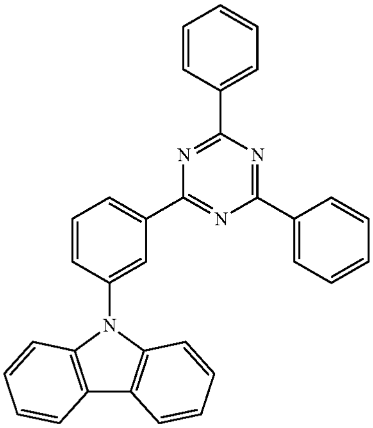
H37
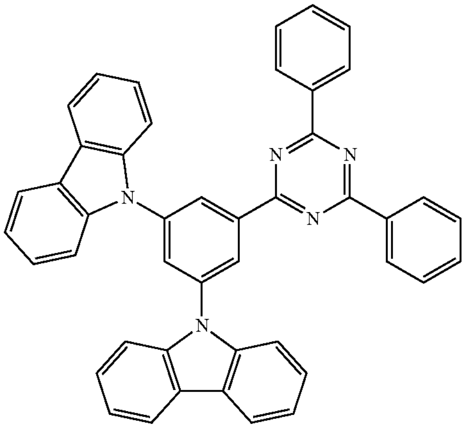
H38
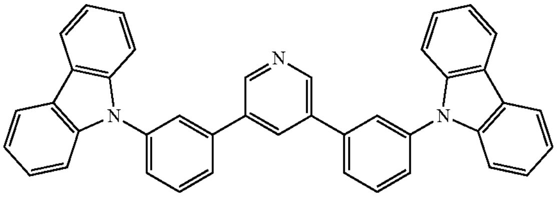

-continued
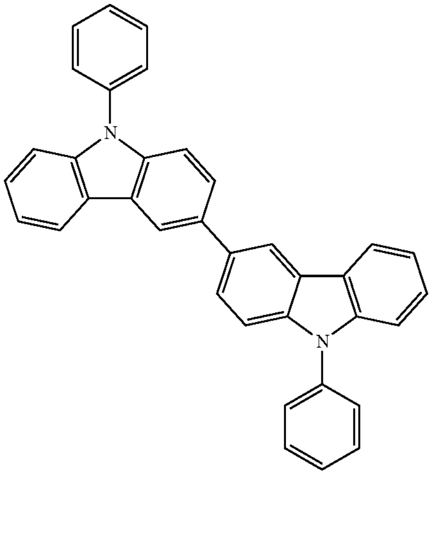
H39
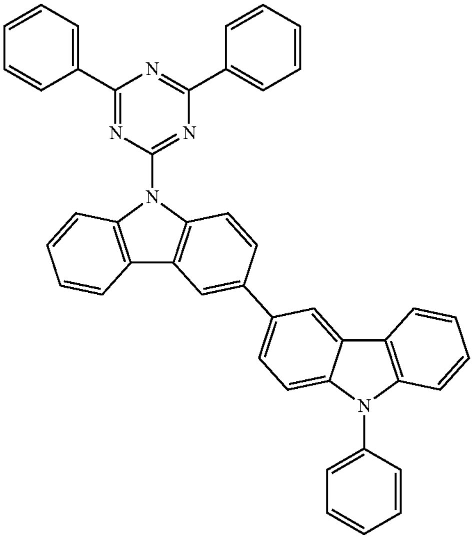
H40
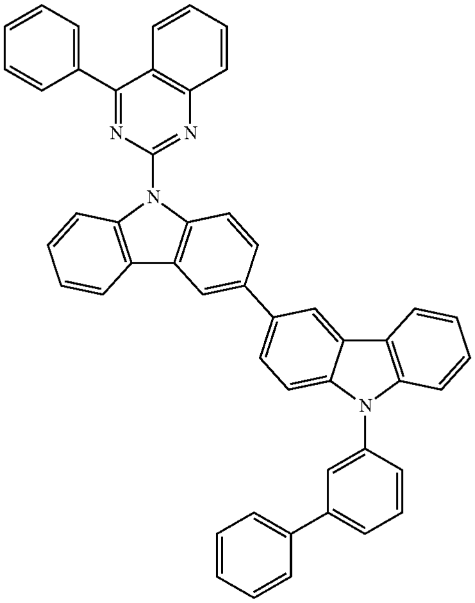
H41
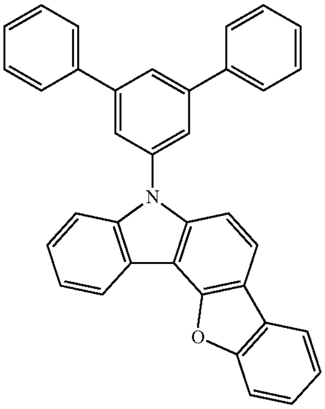
H42
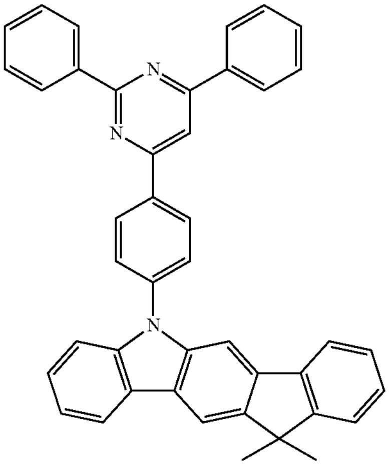
H43
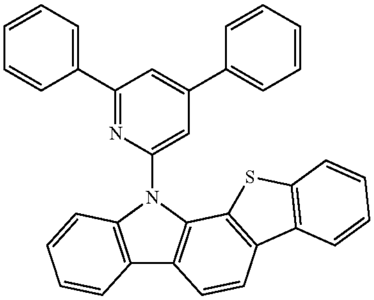
H44

-continued
H45
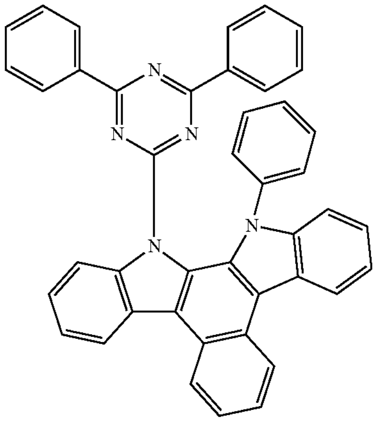
H46
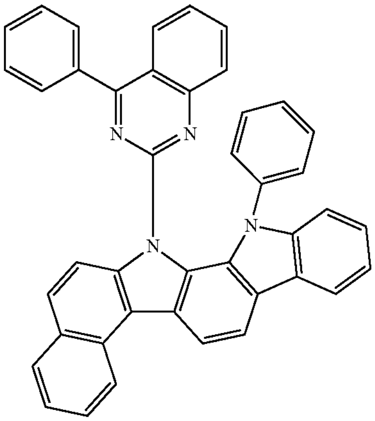
H47
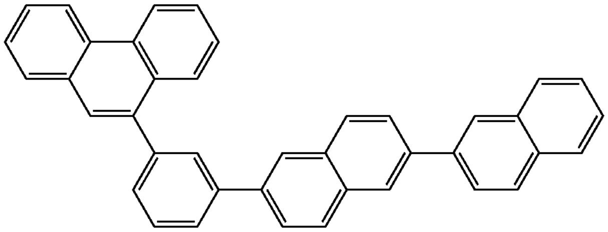
H48
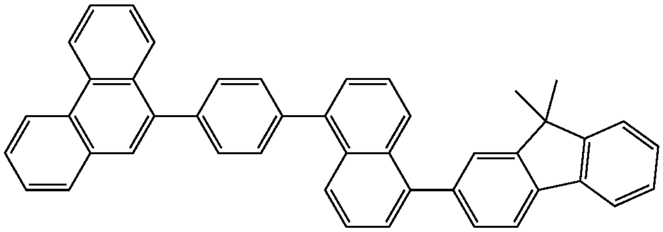
H49
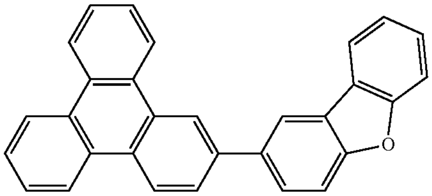
H50
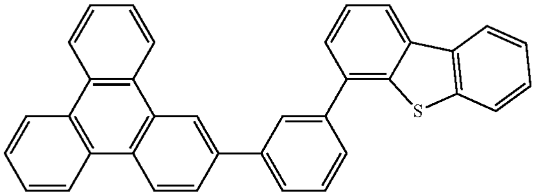
H51
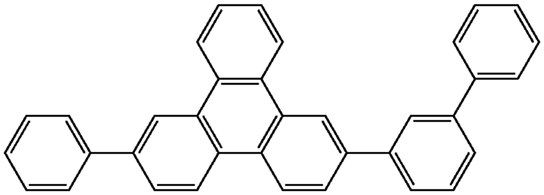
H52
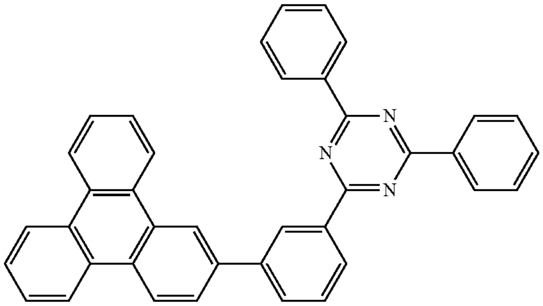

-continued
H53
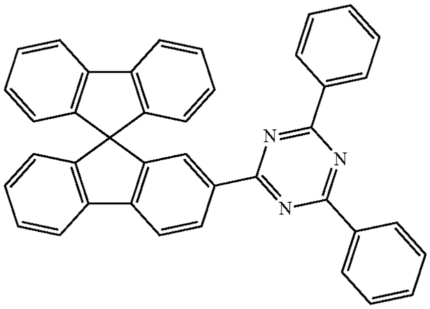
H54
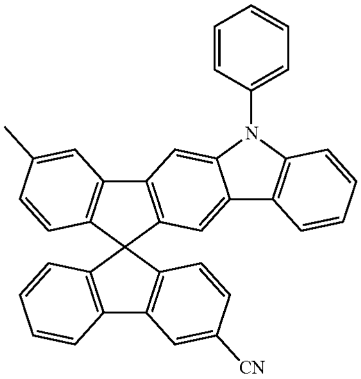
H55
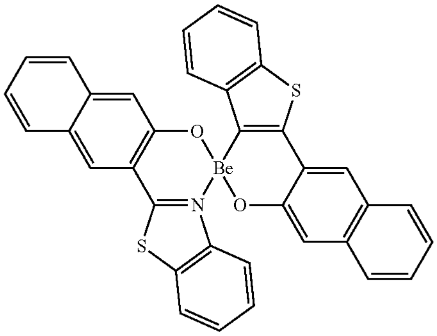
H56
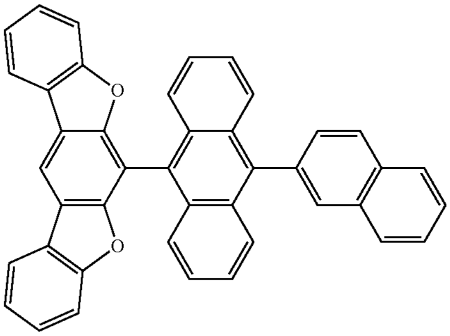
H57
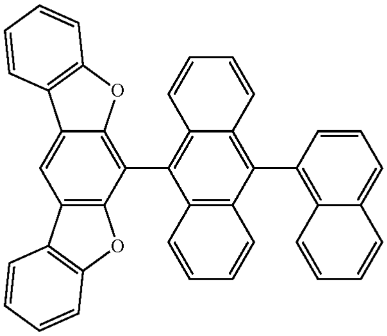
H58
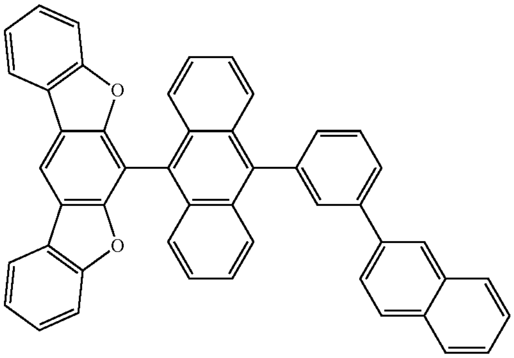
H60
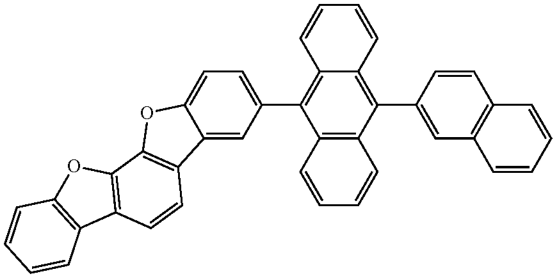
H61
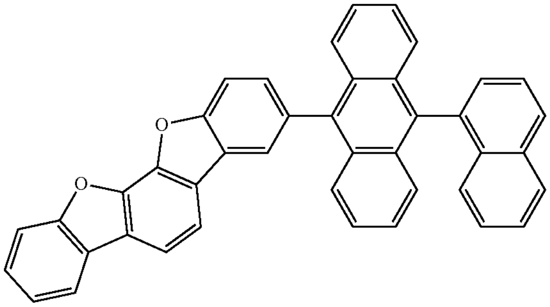

-continued
H62
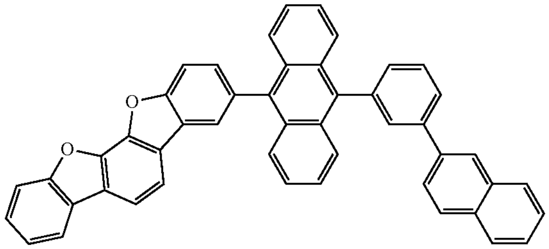
H63
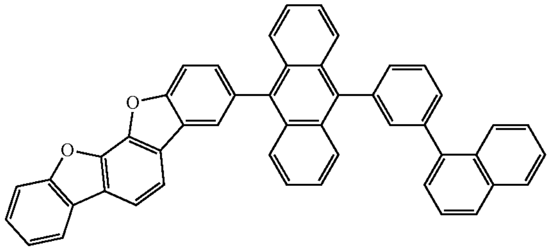
H64
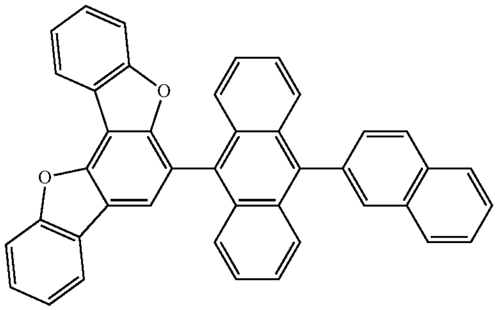
H65
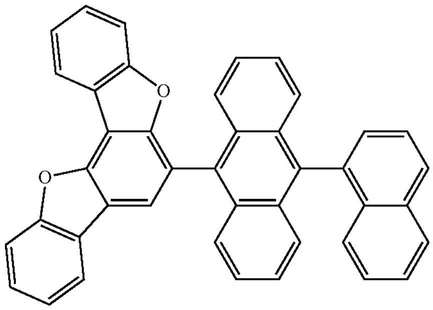
H66
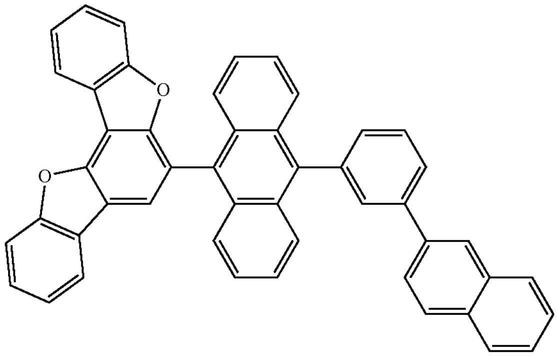
H67
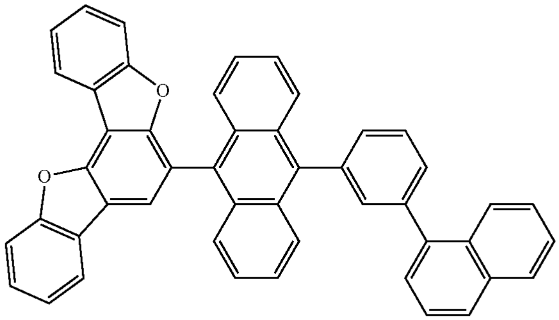
H68
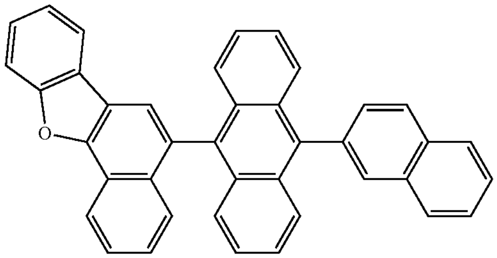
H69
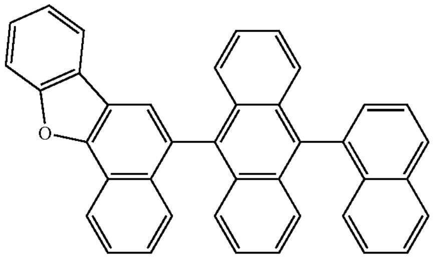
H70
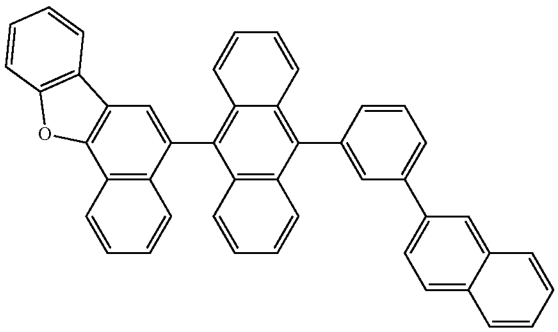
H71
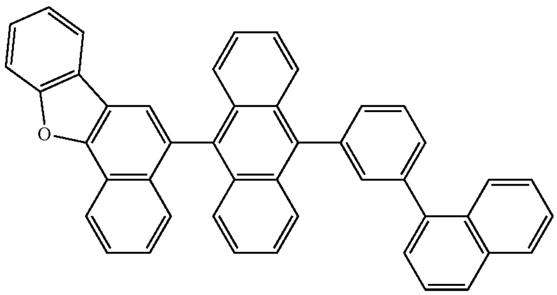

-continued
H72
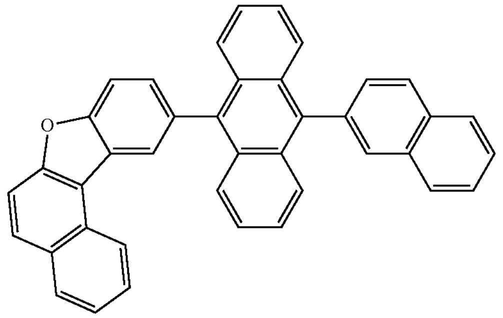
H73
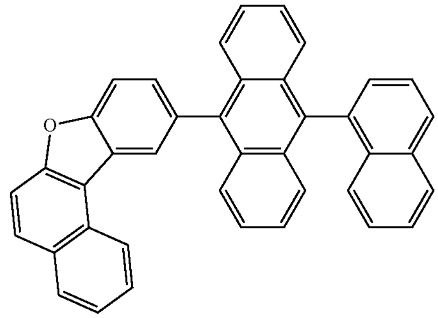
H74
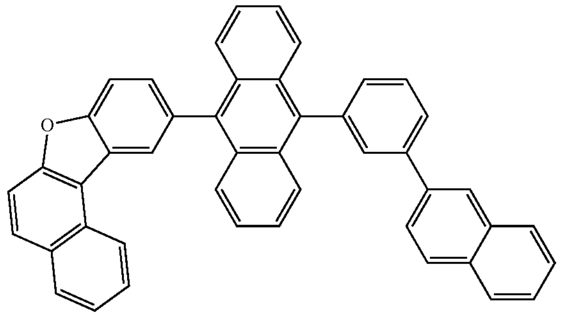
H75
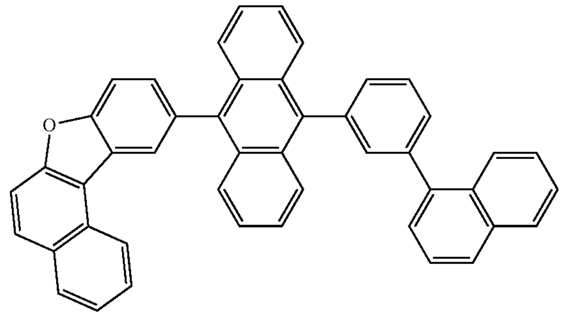
H76
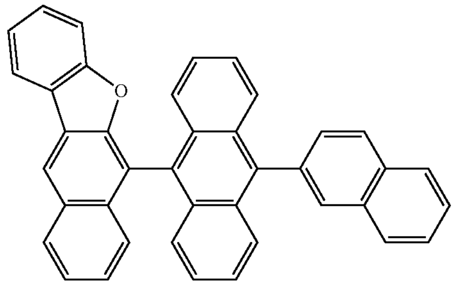
H77
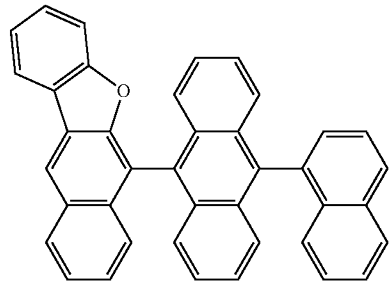
H78
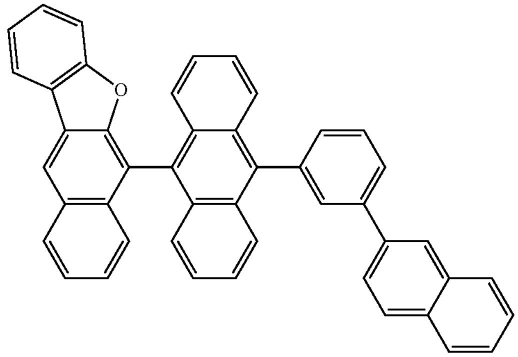
H79
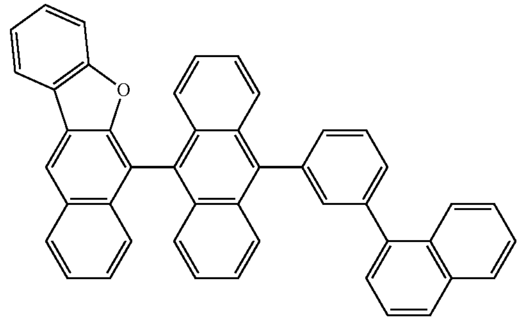

-continued
H80
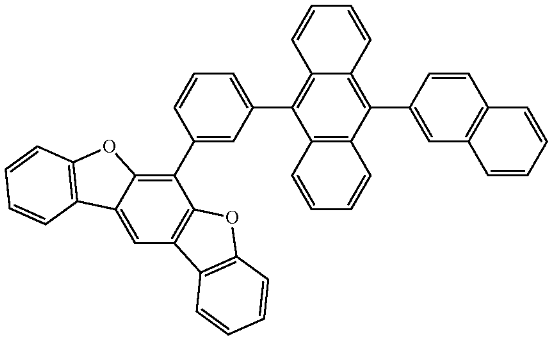
H81
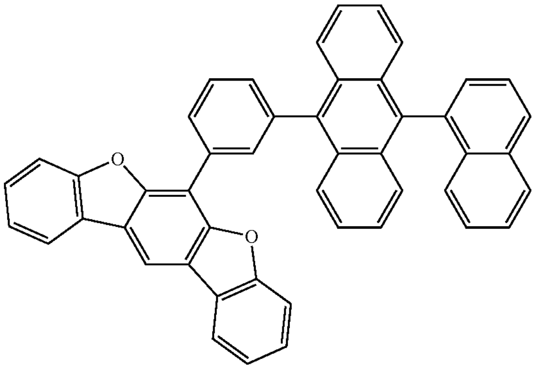
H82
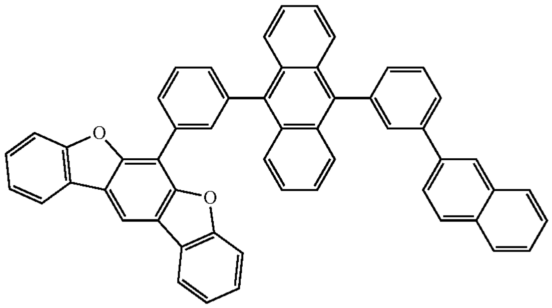
H83
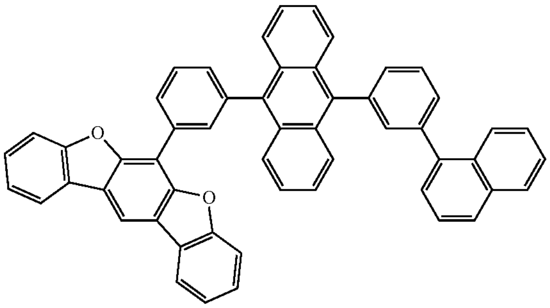
H84
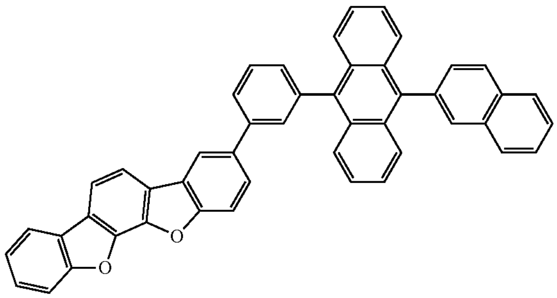
H85
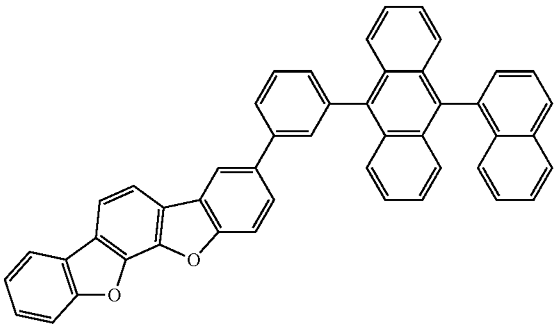
H86
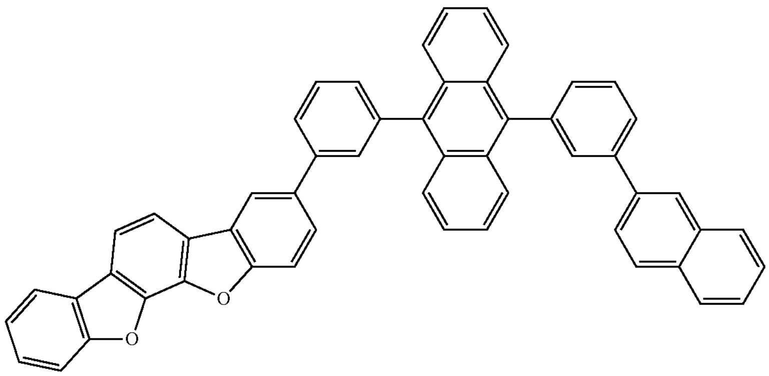

-continued
H87
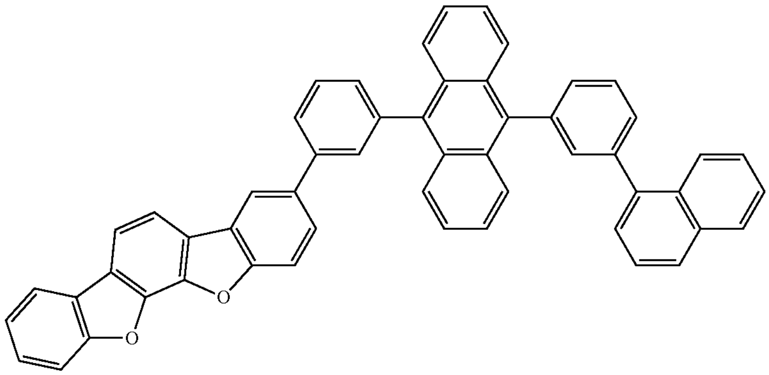
H88
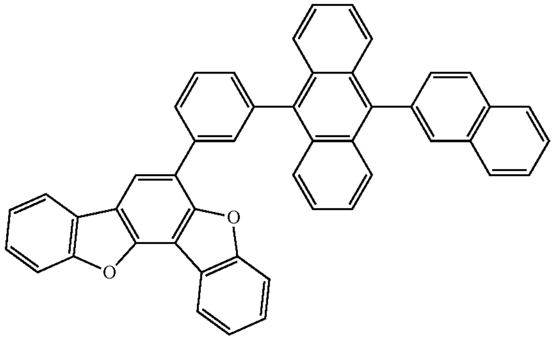
H89
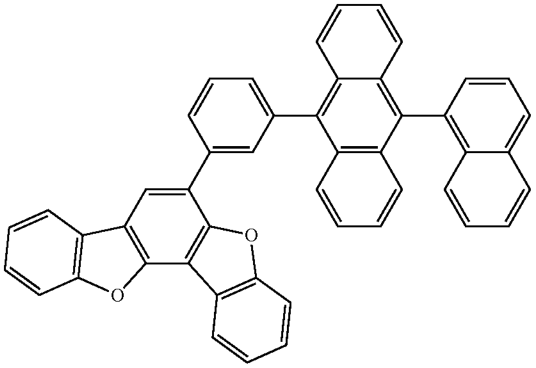
H90
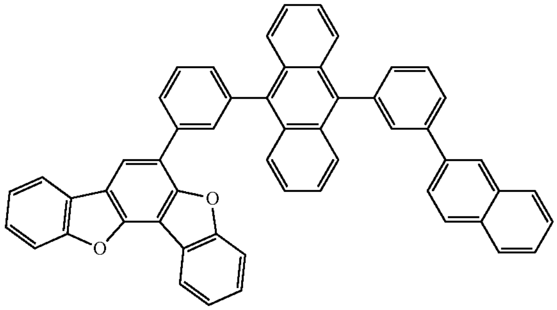
H91
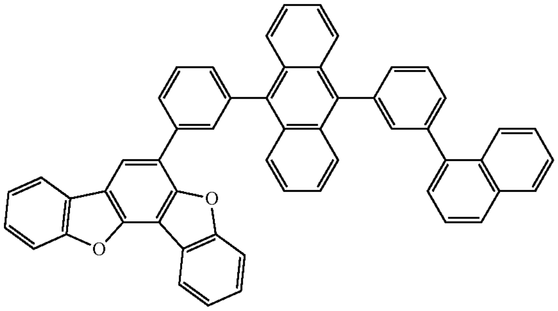
H92
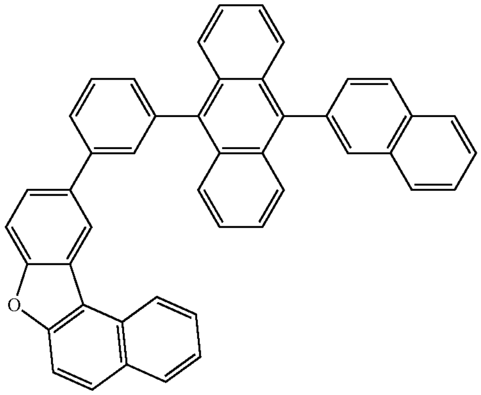
H93
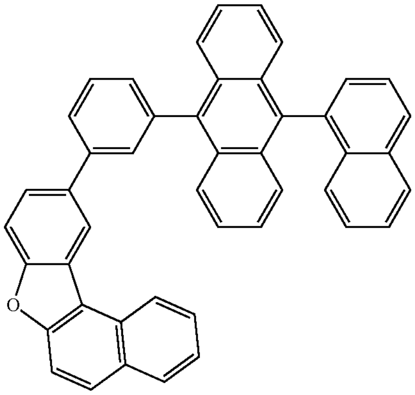

-continued
H94
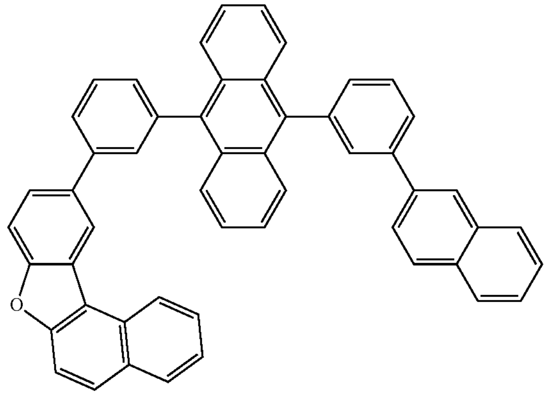
H95
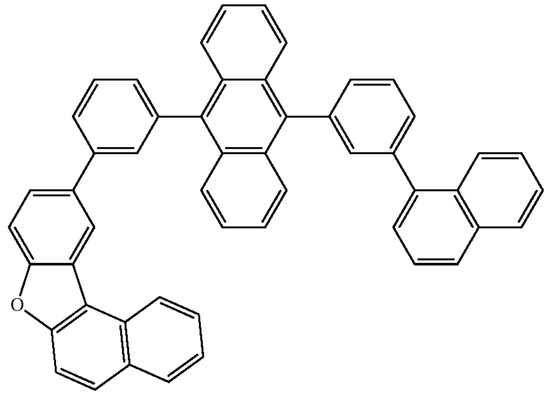
H96
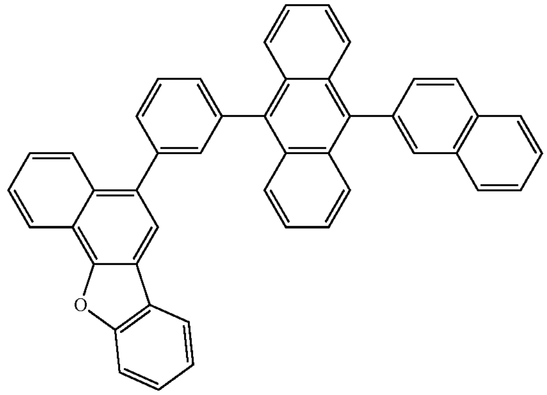
H97
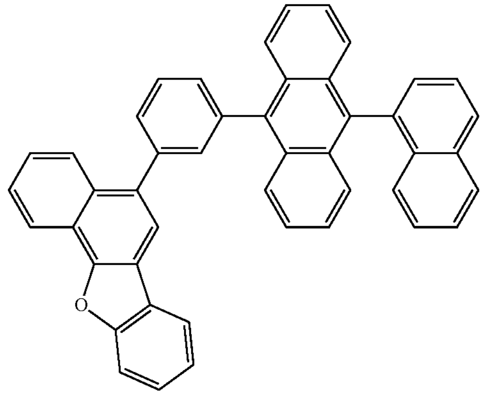
H98
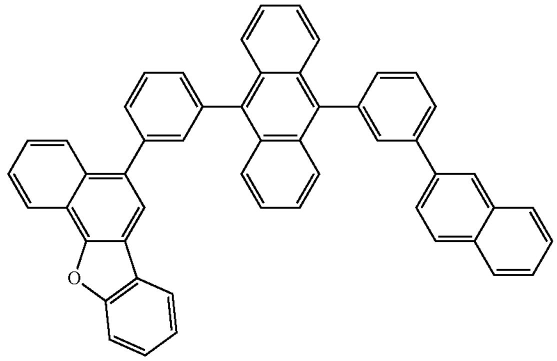
H99
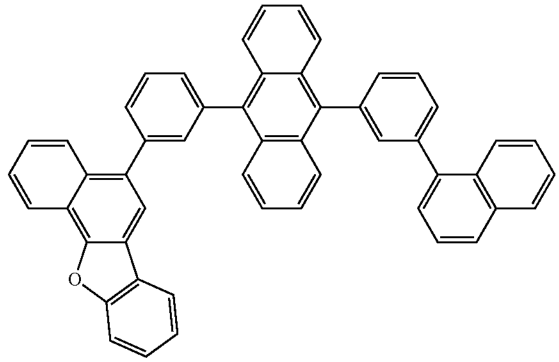
H100
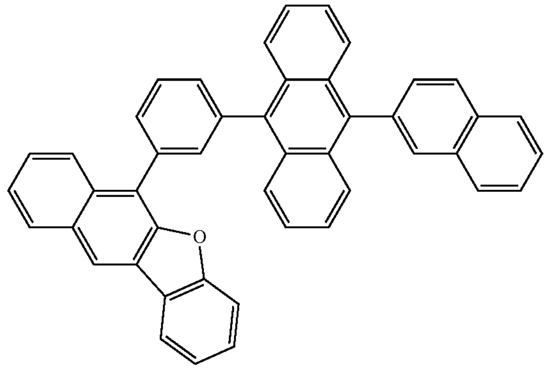
H101
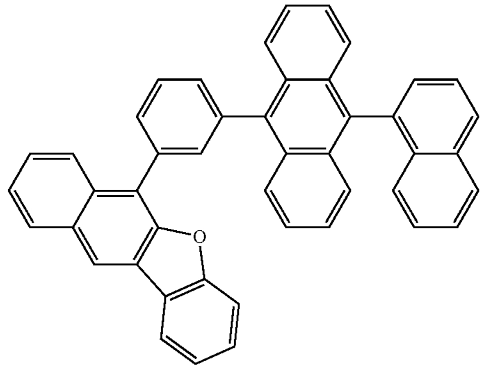

-continued
H102
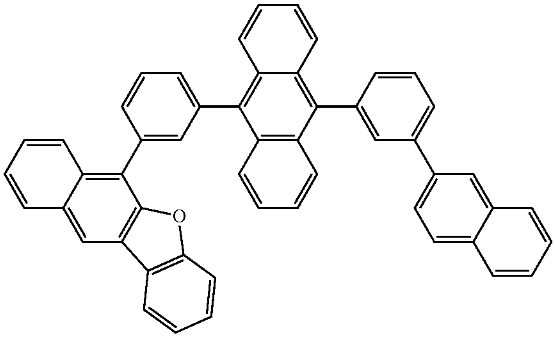
H103
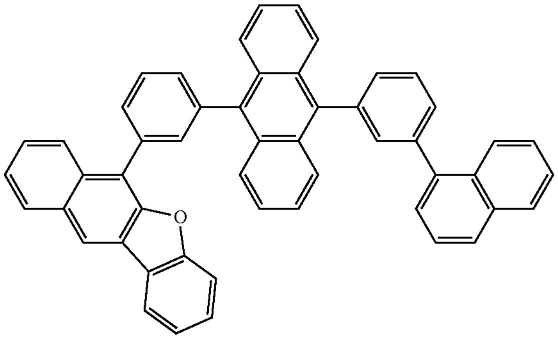
H104
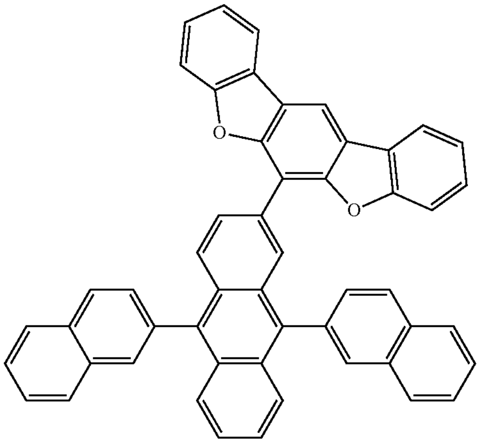
H105
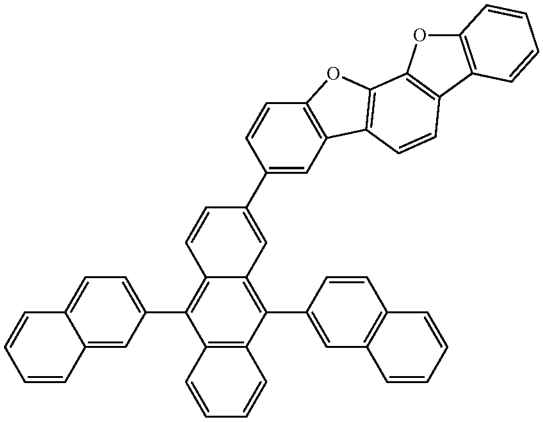
H106
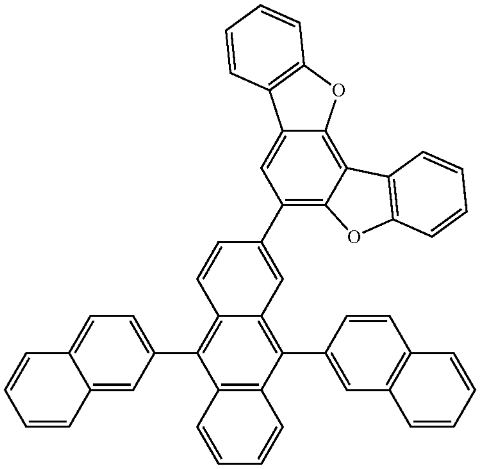
H107
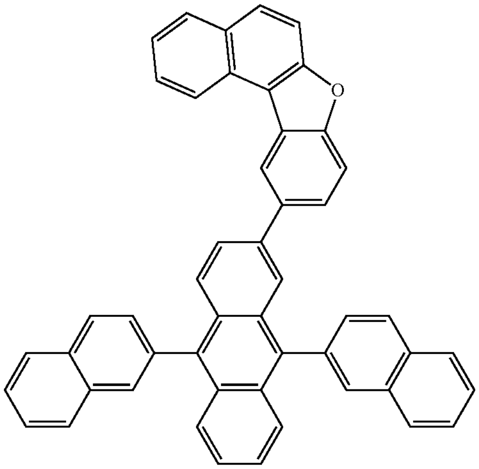

-continued
H108
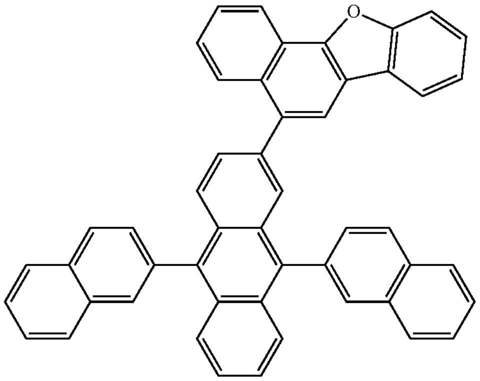
H109
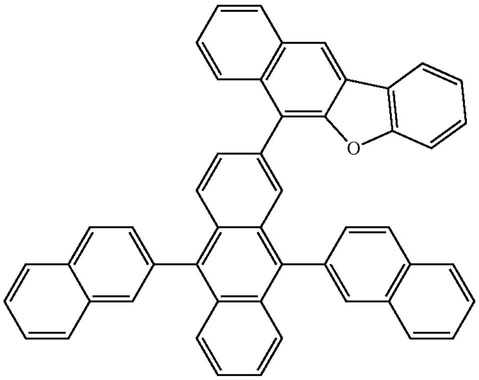
H110
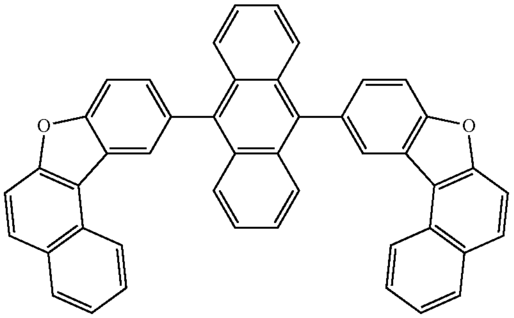
H111
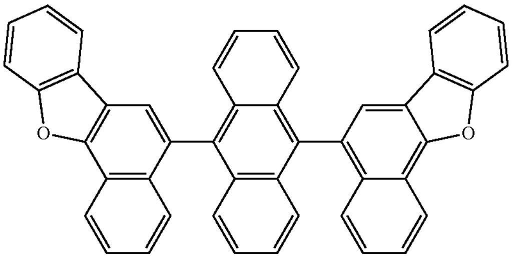
H112
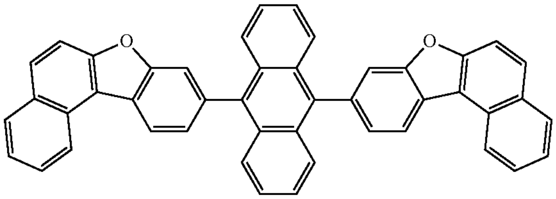
H113
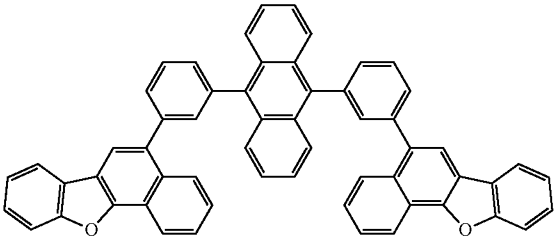
H114
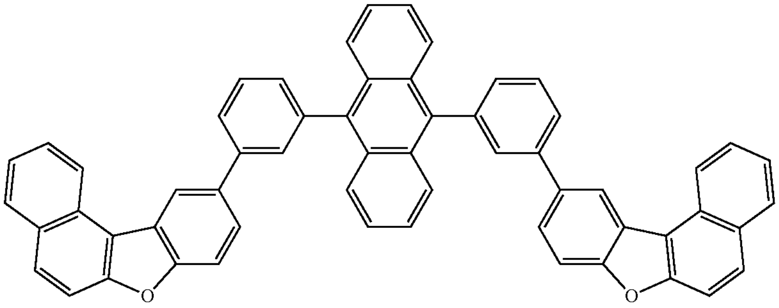

-continued
H115
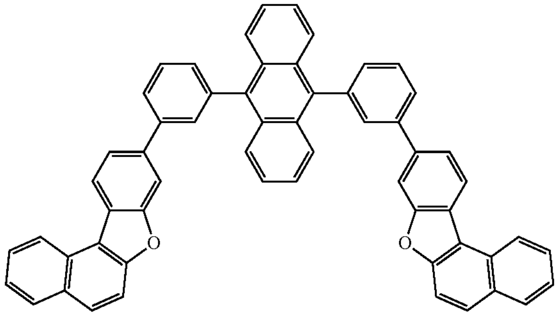
H116
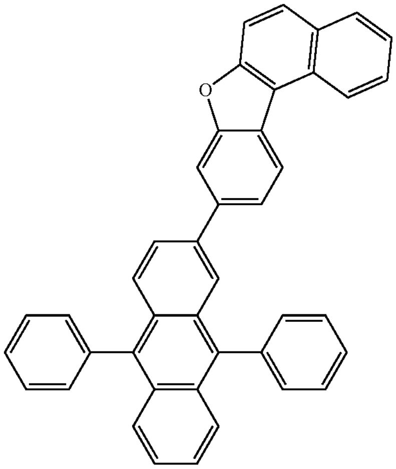
H117
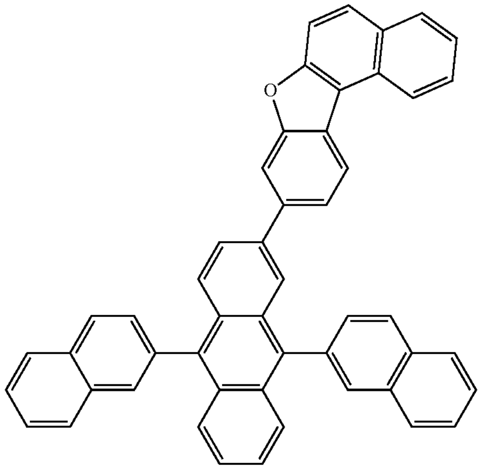
H118
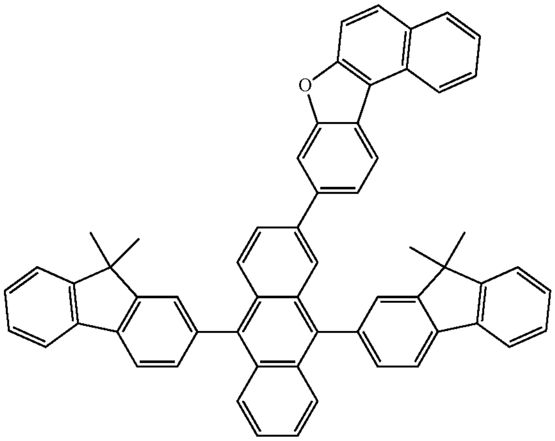
H119
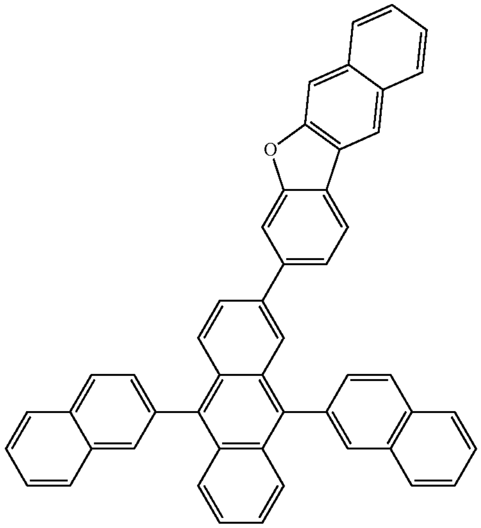
H120
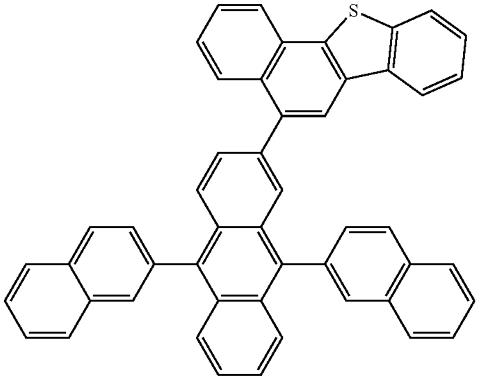

-continued
H121
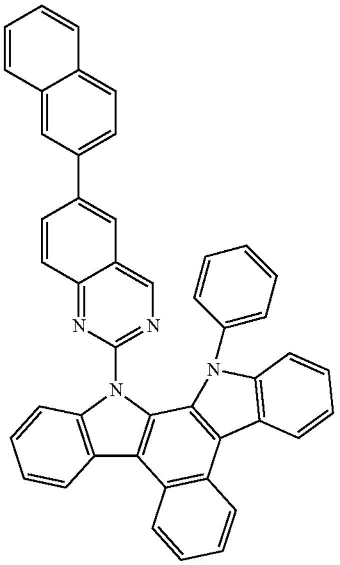
H122
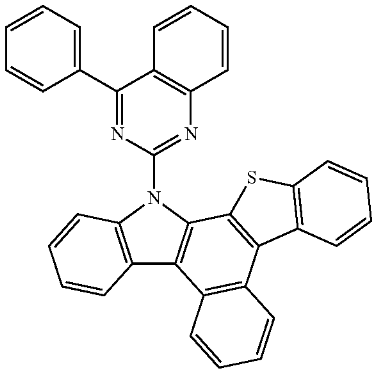
H123
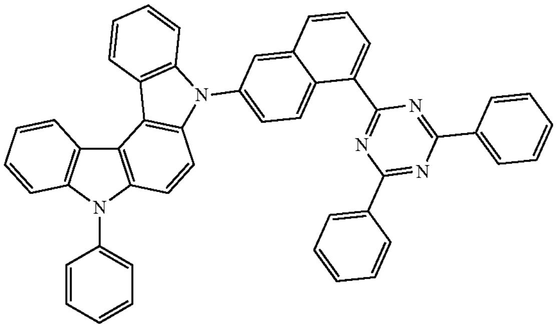
H124
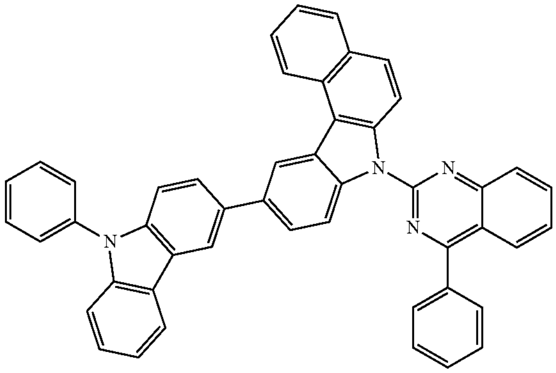
H125
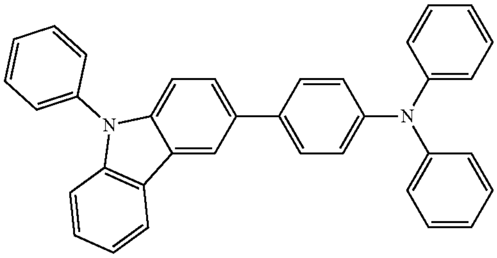
H126
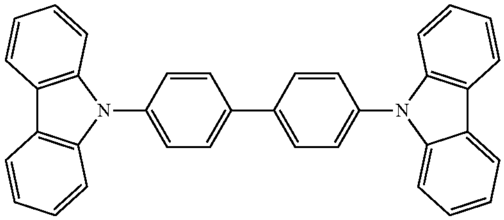
H127
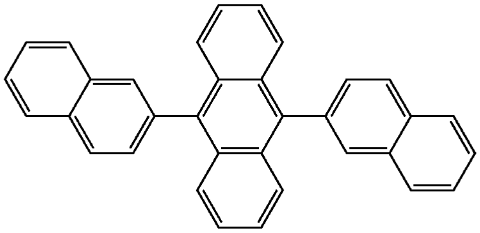
H128
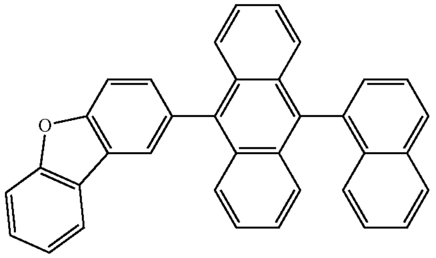
.

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

[Formula 401]

$M(L_{401})_{xc1}(L_{402})_{xc2}$

[Formula 402]

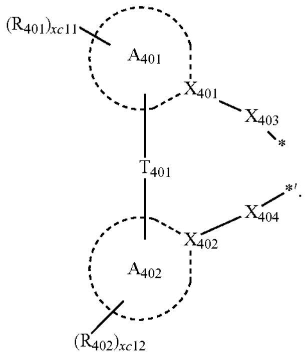

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-', *—C($Q_{411}$)=C($Q_{412}$)—', *—C($Q_{411}$)=', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$ in the specification, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$ in the specification, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) both $X_{401}$ and $X_{402}$ may be nitrogen.

In an embodiment, when xc1 in Formula 401 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ are the same as described in connection with $T_{401}$ in the specification.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), a isonitrile group, a —CN group, a phosphorus group (for example, a phosphine group and a phosphite group), or any combination thereof.

The phosphorescent dopant may include, for example, one of following Compounds PD1 to PD25 or any combination thereof:

PD1

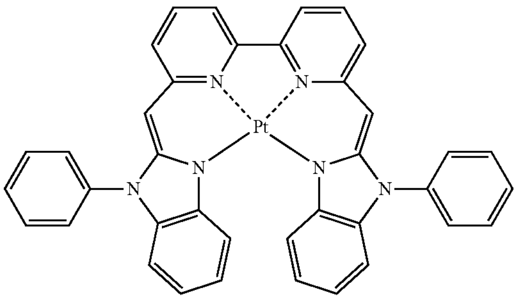

PD2

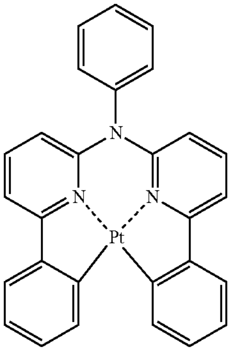

PD3

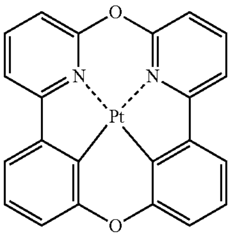

-continued
PD4
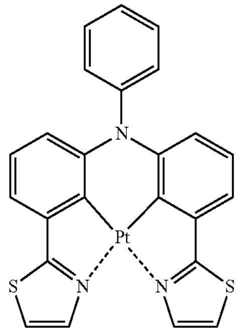
PD5
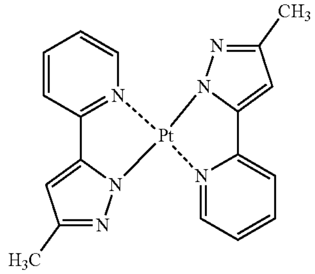
PD6
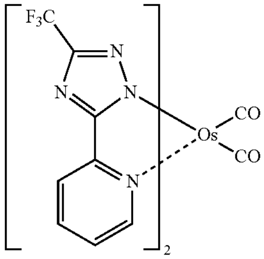
PD7
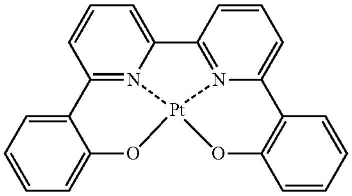
PD8
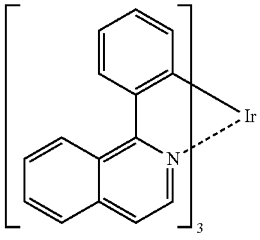
PD9
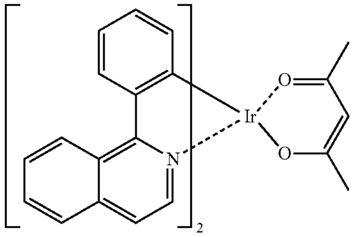
-continued
PD10
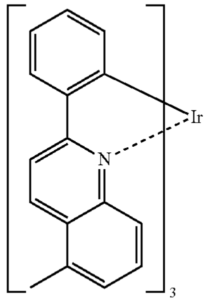
PD11
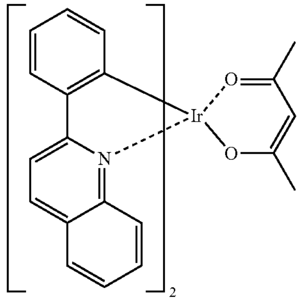
PD12
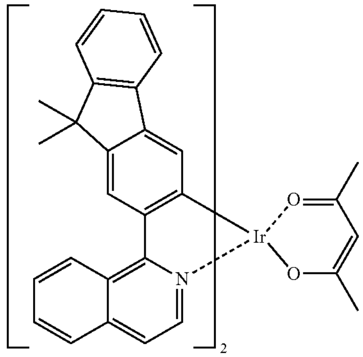
PD13
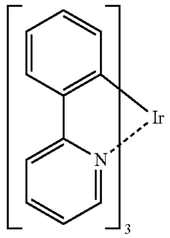
PD14
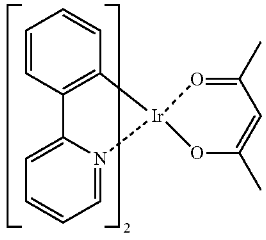

-continued
PD15
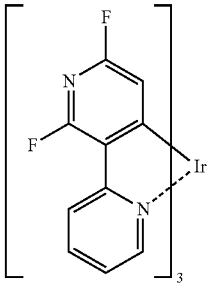
PD16
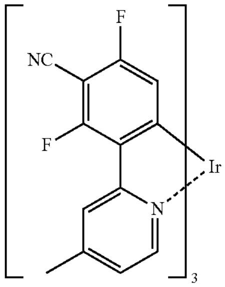
PD17
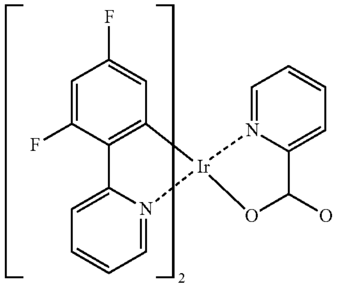
PD18
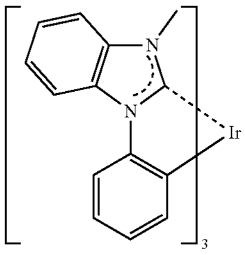
PD19
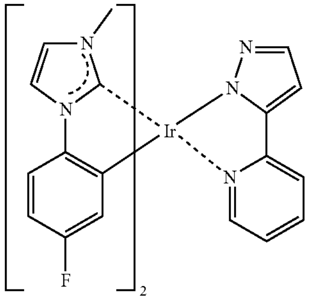
-continued
PD20
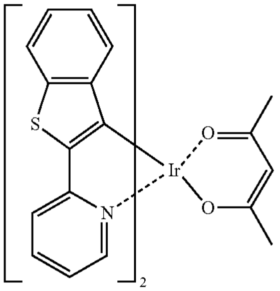
PD21
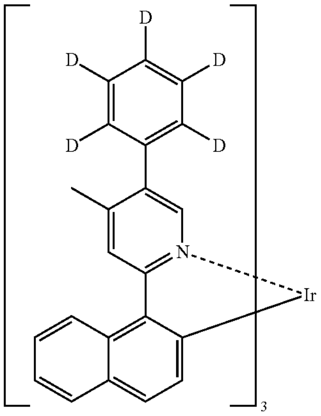
PD22
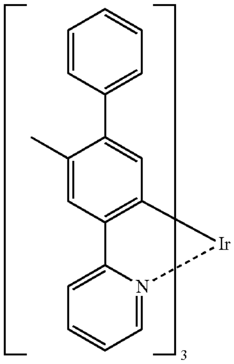
PD23
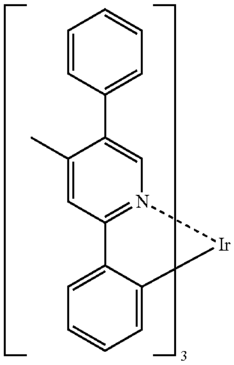

-continued

PD24

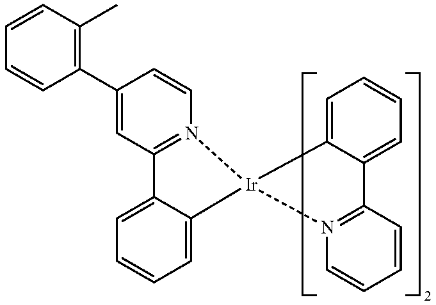

PD25

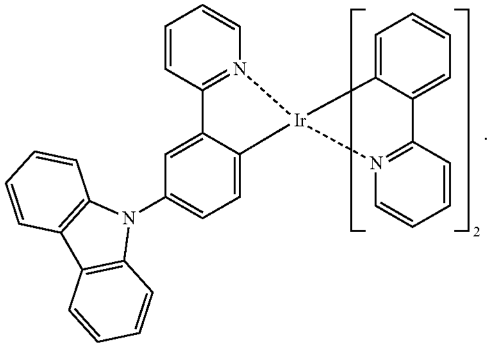

[Fluorescent Dopant]

The fluorescent dopant may include an amine group-containing compound, a styryl group-containing compound, or any combination thereof.

In an embodiment, the fluorescent dopant may include a compound represented by Formula 501:

[Formula 501]

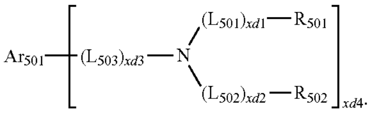

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed.

In an embodiment, xd4 in Formula 501 may be 2.

In an embodiment, the fluorescent dopant may include: one of Compounds FD1 to FD36; DPVBi; DPAVBi; or any combination thereof:

FD1

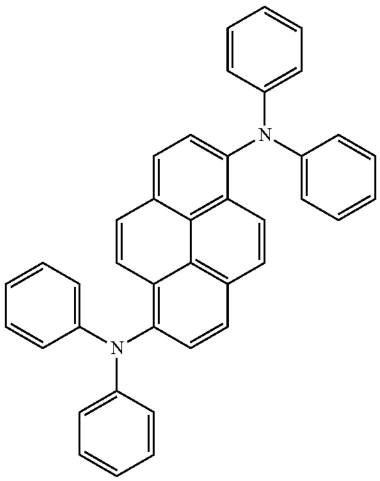

FD2

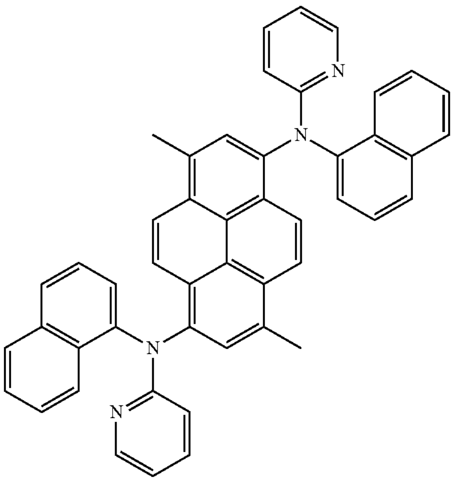

-continued
FD3
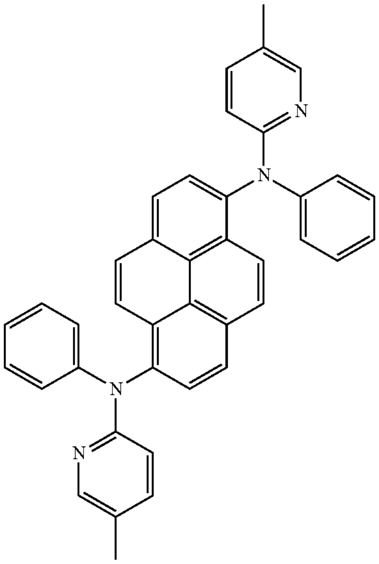
FD4
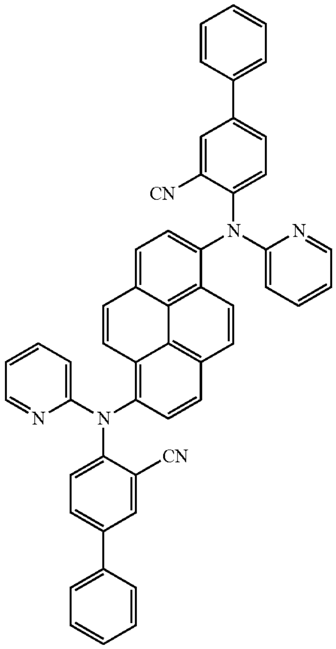
FD5
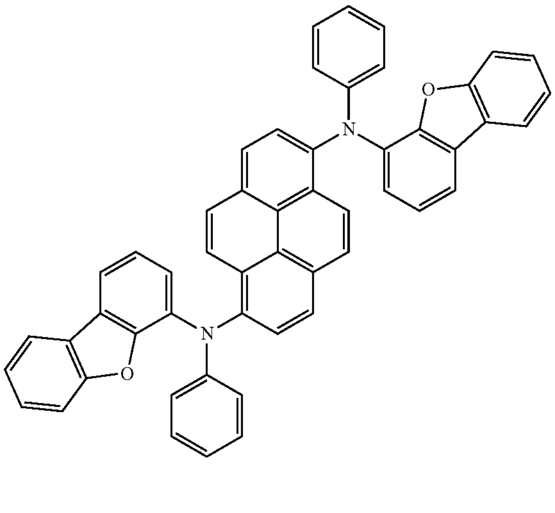
FD6
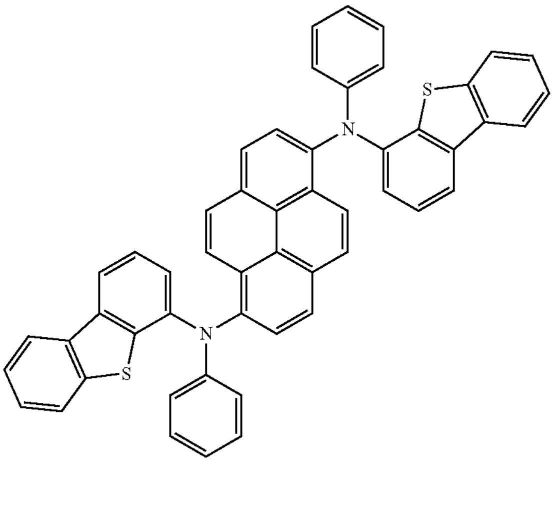

-continued
FD7
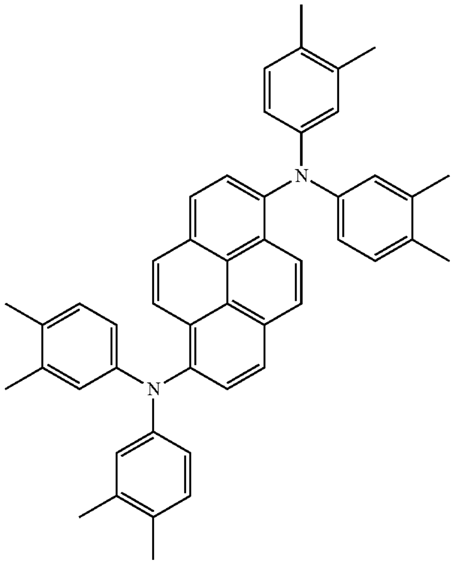
FD8
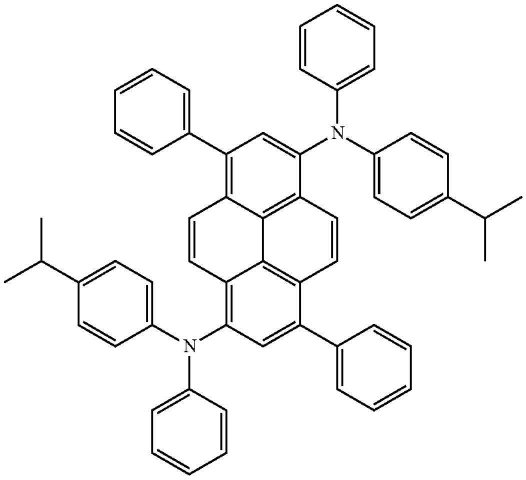
FD09
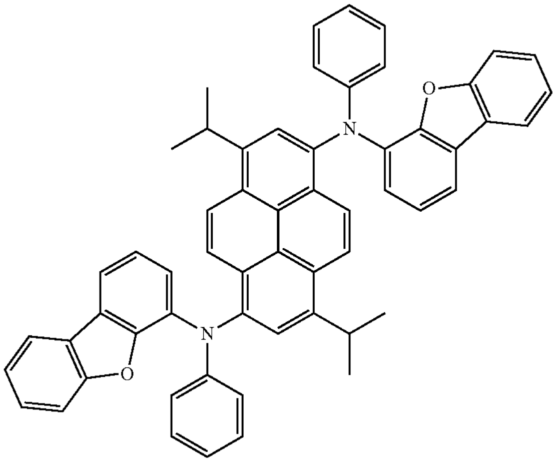
FD10
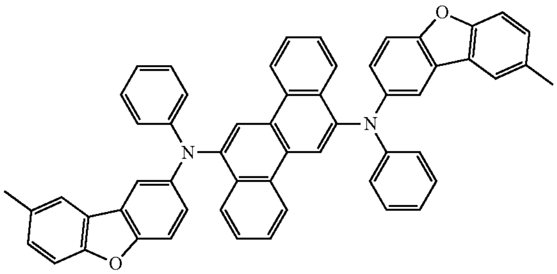
FD11
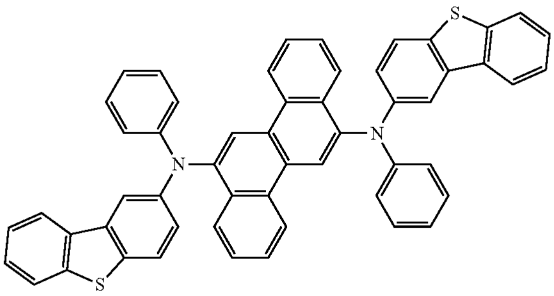
FD12
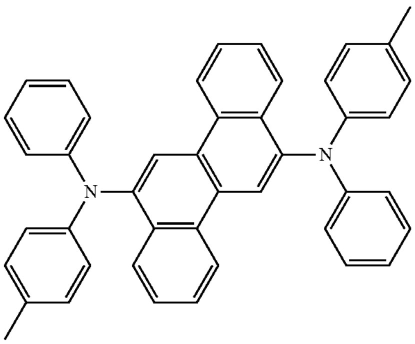

-continued
FD13
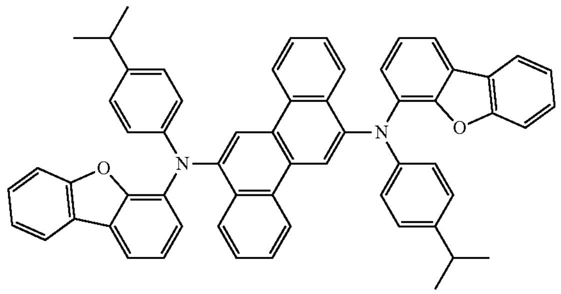
FD14
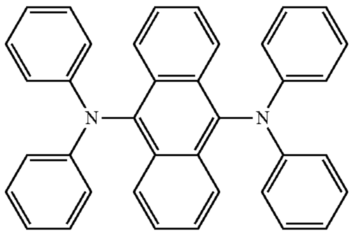
FD15
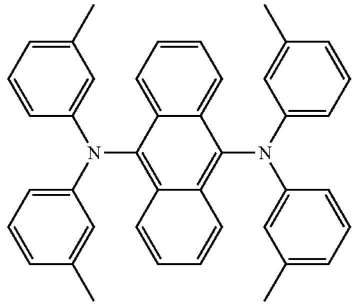
FD16
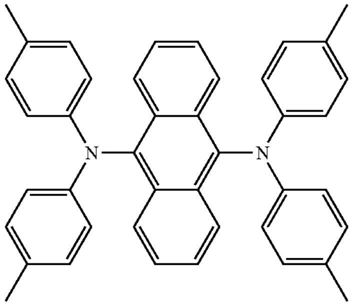
FD17
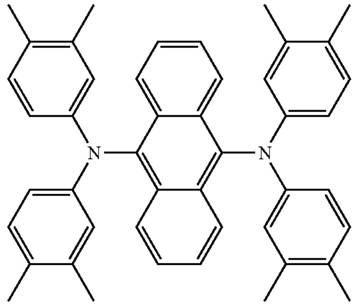
FD18
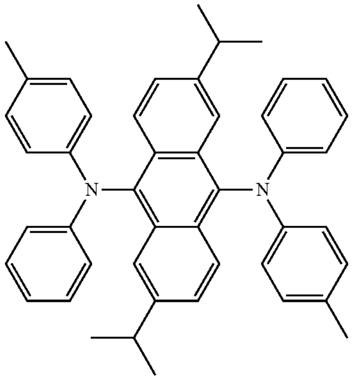
FD19
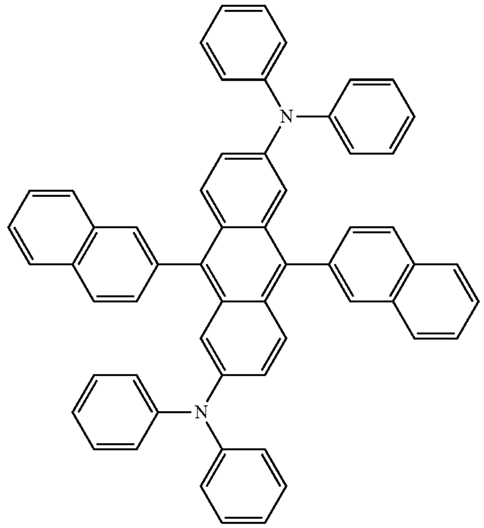
FD20
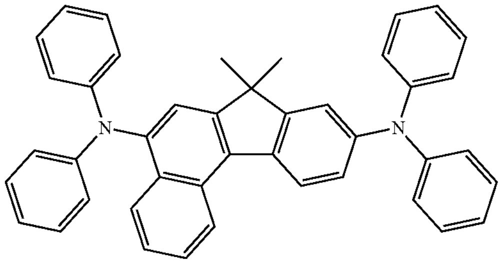

-continued
FD21
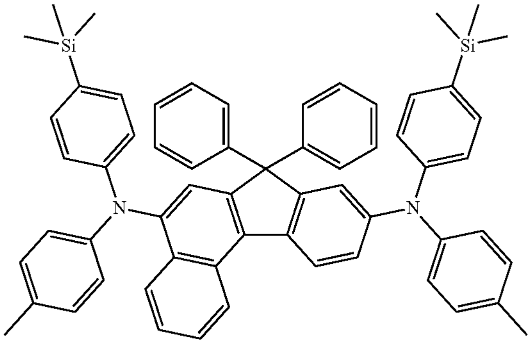
FD22
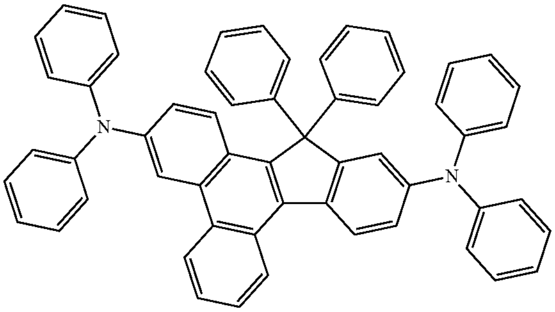
FD23
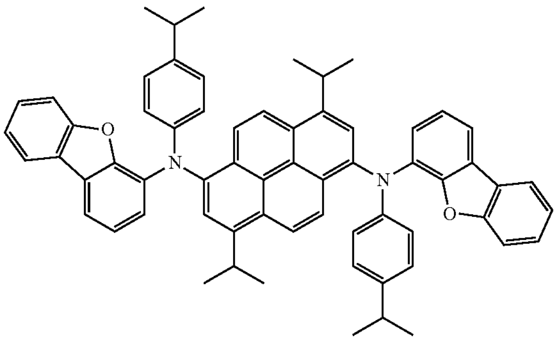
FD24
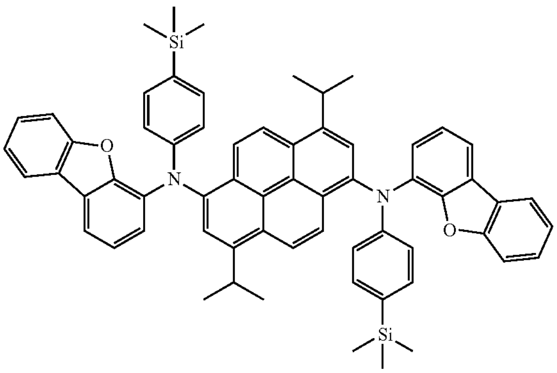
FD25
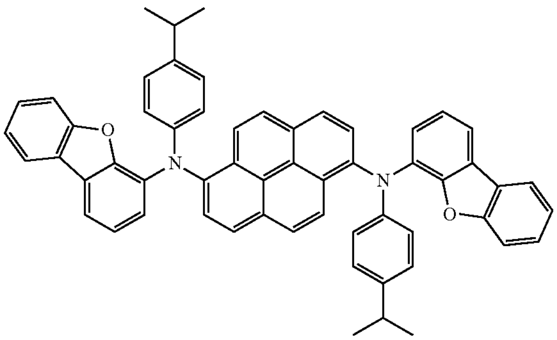
FD26
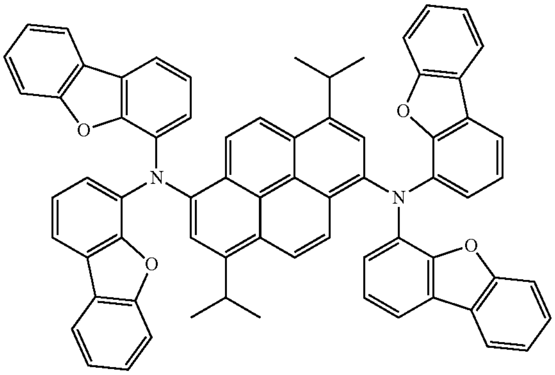
FD27
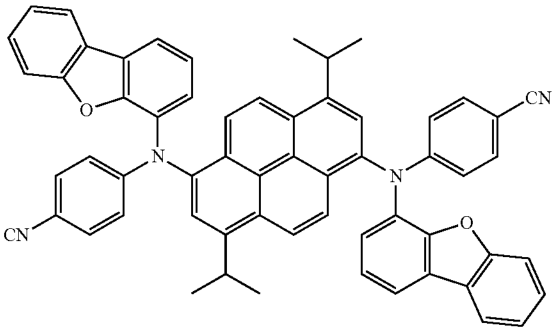
FD28
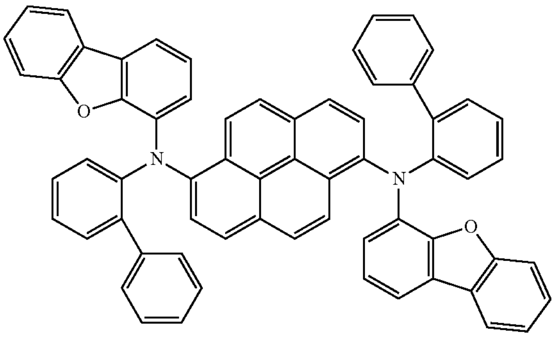

-continued
FD29
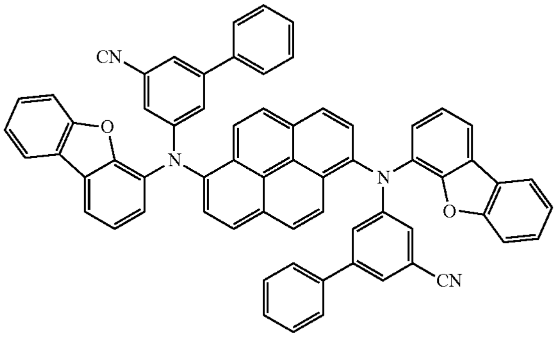
FD30
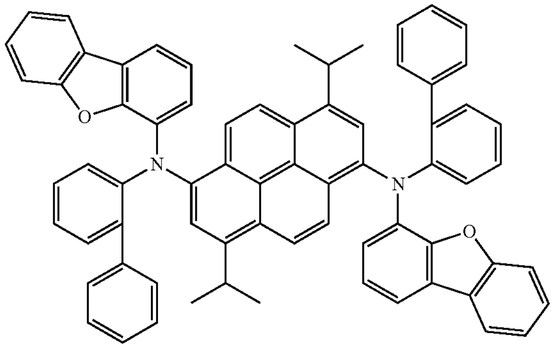
FD31
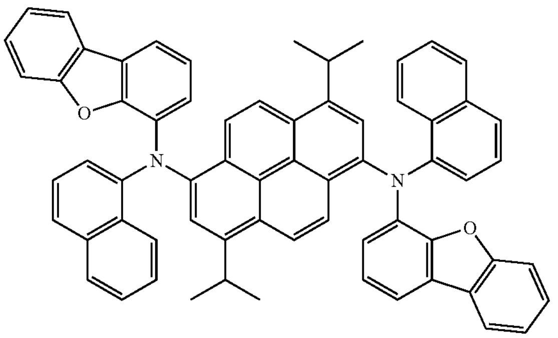
FD32
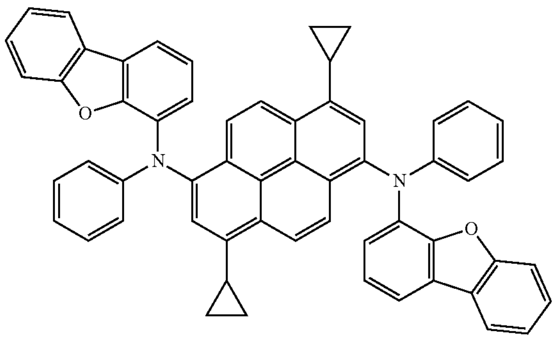
FD33
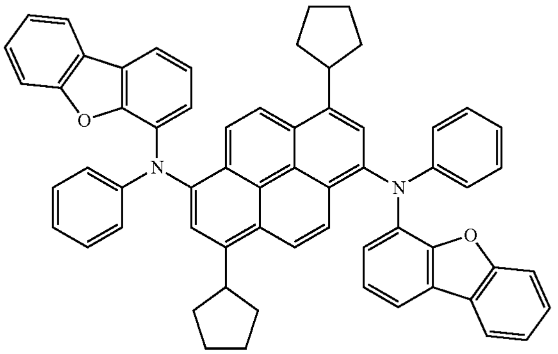
FD34
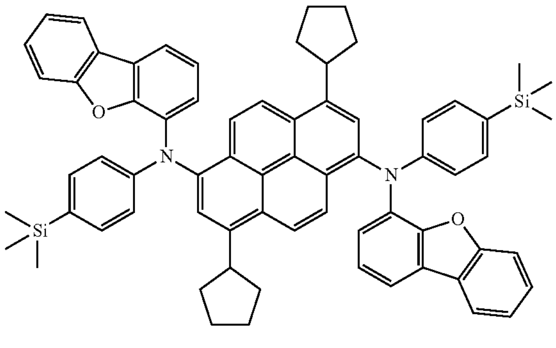
FD35
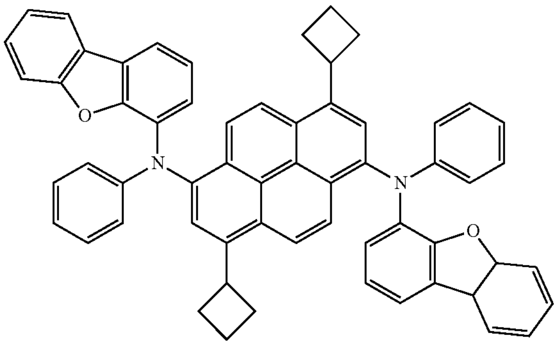
FD36
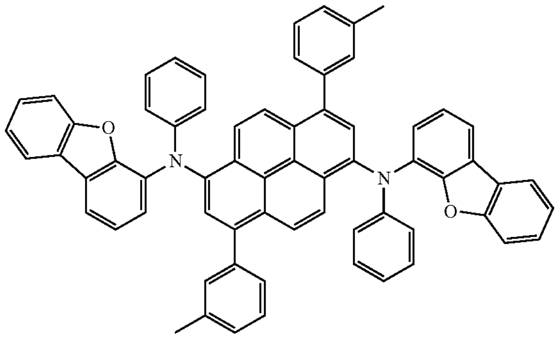

-continued

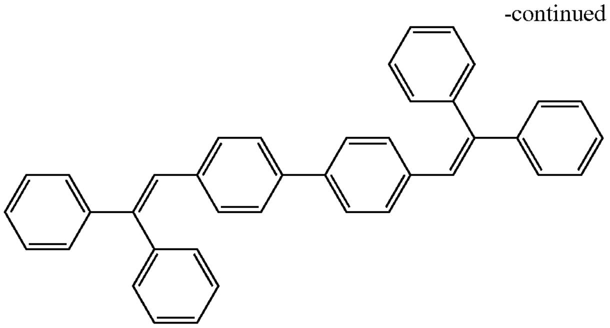

DPVBi

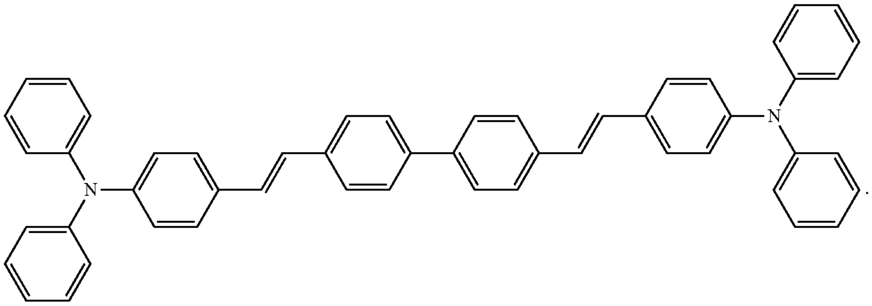

DPAVBi

[Delayed Fluorescence Material]

The emission layer may include a delayed fluorescence material.

The delayed fluorescence material used herein may be selected from any compound that is capable of emitting delayed fluorescent light based on a delayed fluorescent emission mechanism.

The delayed fluorescence material included in the emission layer may act as a host or a dopant depending on the type of other materials included in the emission layer.

In an embodiment, the difference between the triplet energy level (eV) of the delayed fluorescence material and the singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the light-emission efficiency of the light-emitting device 10 may be improved.

In an embodiment, the delayed fluorescence material may include i) a material that includes at least one electron donor (for example, a π electron-rich $C_3$-$C_{60}$ cyclic group, such as a carbazole group) and at least one electron acceptor (for example, a sulfoxide group, a cyano group, or a π-electron-deficient nitrogen-containing $C_1$-$C_{60}$ cyclic group), ii) a material including a $C_8$-$C_{60}$ polycyclic group in which two or more cyclic groups share boron (B) and are condensed with each other.

The delayed fluorescence material may include at least one of Compounds DF1 to DF9:

DF1

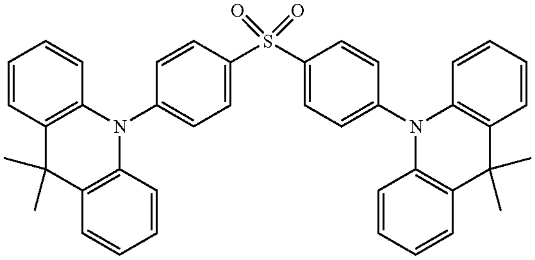

(DMAC-DPS)

DF2

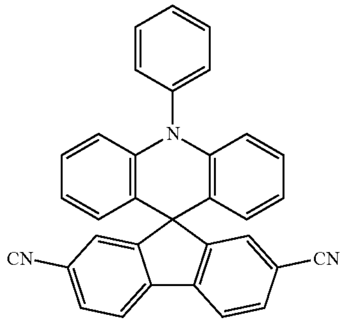

(ACRFLCN)

DF3

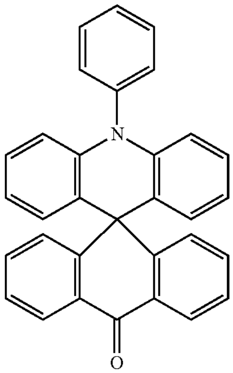

(ACRSA)

DF4

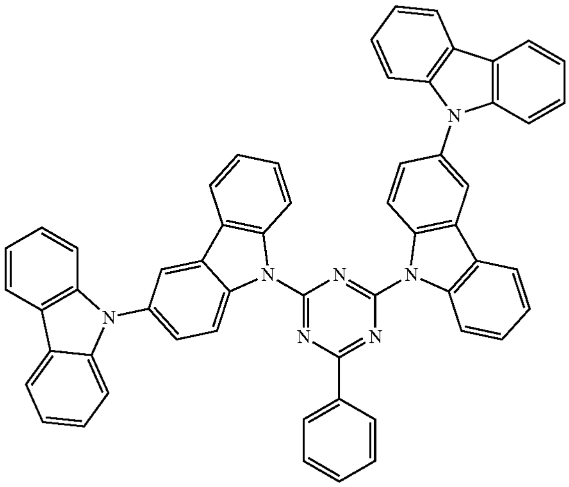

(CC2TA)

DF5

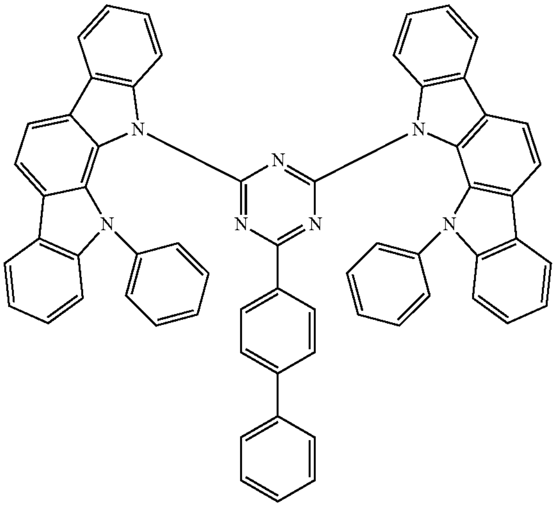

(PIC-TRZ)

DF6

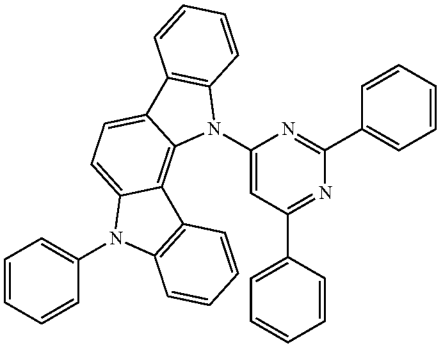

(PIC-TR22)

DF7

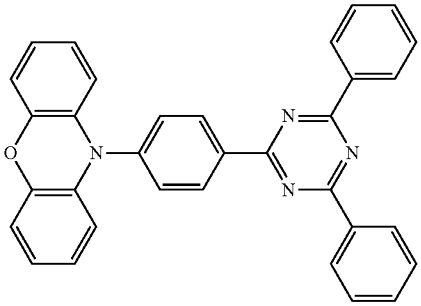

(PXZ-TRZ)

DF8

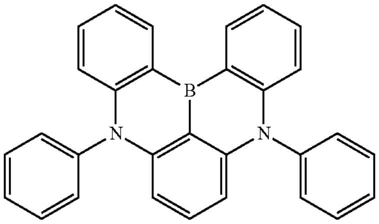

(DABNA-1)

DF9

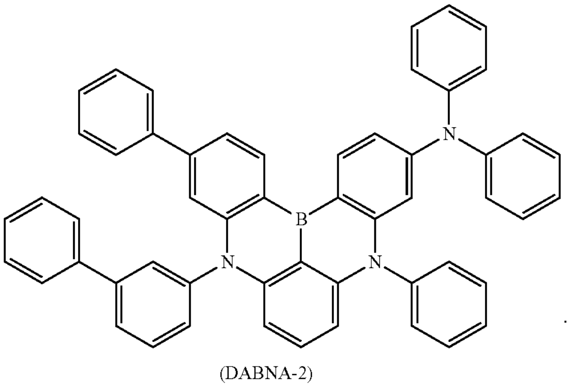

(DABNA-2)

[Quantum Dot]

The emission layer may include a quantum dot.

The quantum dot used herein refers to the crystal of a semiconductor compound, and may include any material that is capable of emitting light of various emission wavelengths depending on the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or a process that is similar to these processes.

The wet chemical process refers to a method in which an organic solvent and a precursor material are mixed, and a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include a Groups III-VI semiconductor compound, a Groups II-VI semiconductor compound, a Groups III-V semiconductor compound, a Group I-III-VI semiconductor compound, a Groups IV-VI semiconductor compound, a Group IV element or compound, or any combination thereof.

Examples of the Groups II-VI semiconductor compound may include: a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Groups III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. The Groups III-V semiconductor compound may further include a Group II element. Examples of the Groups III-V semiconductor compound further including a Group II element may include InZnP, InGaZnP, or InAlZnP.

Examples of the Groups III-VI semiconductor compound may include: a binary compound, such as GaS, GaSe, $Ga_2Se_3$, GaTe, InS, $In_2S_3$, InSe, $In_2Se_3$, or InTe; a ternary compound, such as $InGaS_3$, or $InGaSe_3$; or any combination thereof.

Examples of the Group I-III-VI semiconductor compound are a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound are a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

In an embodiment, the Group IV element or compound may include a single element, such as Si or Ge; a binary compound, such as SiC or SiGe; or any combination thereof.

Each element included in the multi-element compound such as the binary compound, the ternary compound, and the quaternary compound may be present in a particle at a uniform concentration or a non-uniform concentration.

The quantum dot may have a single structure having a uniform concentration of each element included in the corresponding quantum dot or a dual structure of a core-shell. In an embodiment, a material included in the core may be different from a material included in the shell.

The shell of the quantum dot may function as a protective layer for maintaining semiconductor characteristics by preventing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases toward the center.

Examples of the shell of the quantum dot are a metal or non-metal oxide, a semiconductor compound, or any combination thereof. Examples of the oxide of metal or non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound are, as described herein, a Groups III-VI semiconductor compound, a Groups II-VI semiconductor compound, a Groups III-V semiconductor compound, a Groups I-III-VI semiconductor compound, a Groups IV-VI semiconductor compound, or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, the FWHM of an emission wavelength spectrum of the quantum dot may be equal to or less than about 40 nm. For example, the FWHM of an emission wavelength spectrum of the quantum dot may be equal to or less than about 30 nm. When the FWHM of the emission wavelength spectrum of the quantum dot is within this range, color purity or color reproduction may be improved. Light emitted through such a quantum dot may be irradiated omnidirectionally. Accordingly, a wide viewing angle may be increased.

The quantum dot may be a spherical, a pyramidal, a multi-arm, or a cubic nanoparticle, a nanotube, a nanowire, a nanofiber, or a nanoplate particle.

By adjusting the size of the quantum dot, the energy band gap may also be adjusted, thereby obtaining light of various wavelengths in the quantum dot emission layer. Therefore, by using quantum dots of different sizes, a light-emitting device that emits light of various wavelengths may be implemented. In an embodiment, the size of the quantum dot may be selected to emit red, green and/or blue light. The size of the quantum dot may be adjusted such that light of various colors are combined to emit white light.

[Electron Transport Region in Interlayer 130]

The electron transport region may have: i) a single-layered structure consisting of a single layer consisting of a single material, ii) a single-layered structure consisting of a single layer consisting of different materials, or iii) a multi-layered structure including multiple layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region (for example, the buffer layer, the hole blocking layer, the electron control layer, or the electron transport layer in the electron transport region) may include a metal-free compound including at least one π-electron-deficient nitrogen-containing $C_1$-$C_{60}$ cyclic group.

In an embodiment, the electron transport region may include a compound represented by Formula 601 below:

$$[Ar_{601}]_{xe11}\text{-}[(L_{601})_{xe1}\text{-}R_{601}]_{xe21} \qquad \text{[Formula 601]}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a π-electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked to each other via a single bond.

In an embodiment, $Ar_{601}$ in Formula 601 may be a substituted or unsubstituted anthracene group.

In an embodiment, the electron transport region may include a compound represented by Formula 601-1:

[Formula 601-1]

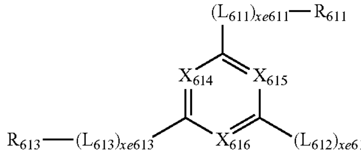

In Formula 601-1, $X_{614}$ may be N or $C(R_{614})$, $X_{616}$ may be N or $C(R_{615})$, $X_{616}$ may be N or $C(R_{616})$, and at least one of $X_{614}$ to $X_{616}$ may be N, $L_{611}$ to $L_{613}$ may be understood by referring to the description presented in connection with $L_{601}$, xe611 to xe613 may be understood by referring to the description presented in connection with xe1, $R_{611}$ to $R_{613}$ may be understood by referring to the description presented in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of following Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

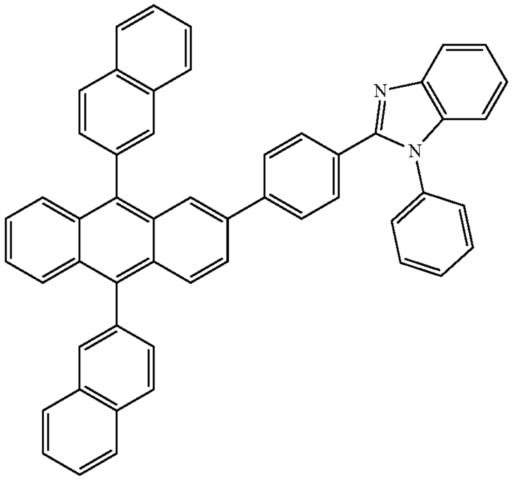

ET2

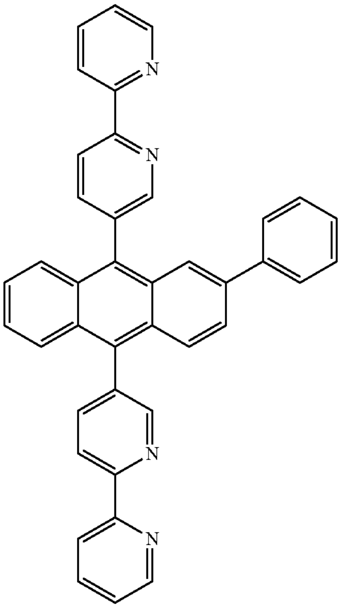

-continued
ET3
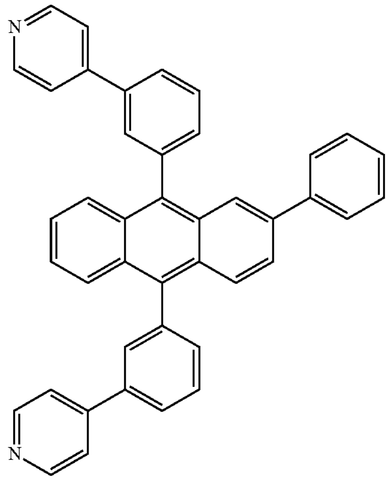
ET4
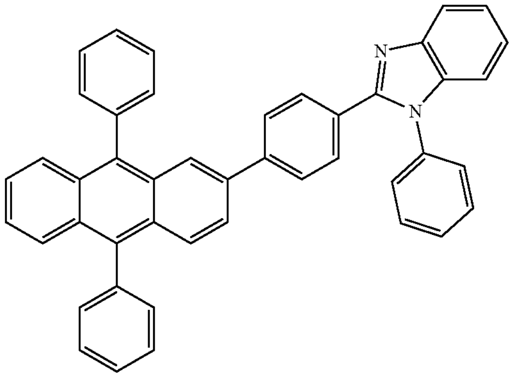
ET5
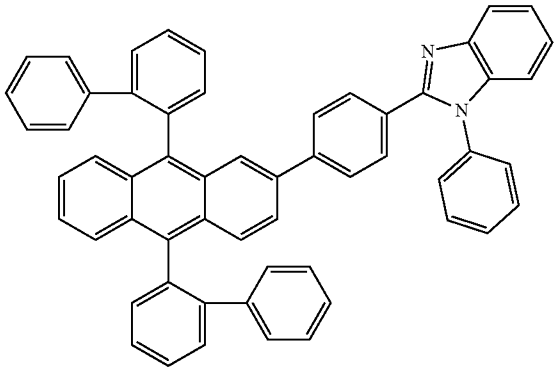
ET6
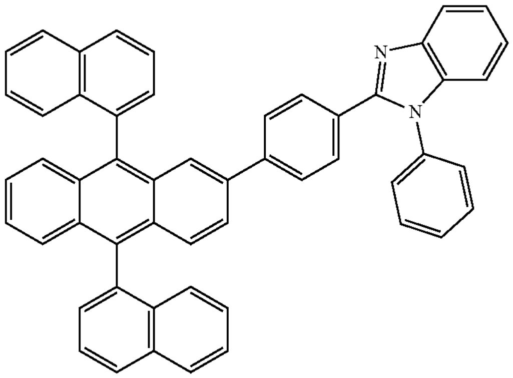
ET7
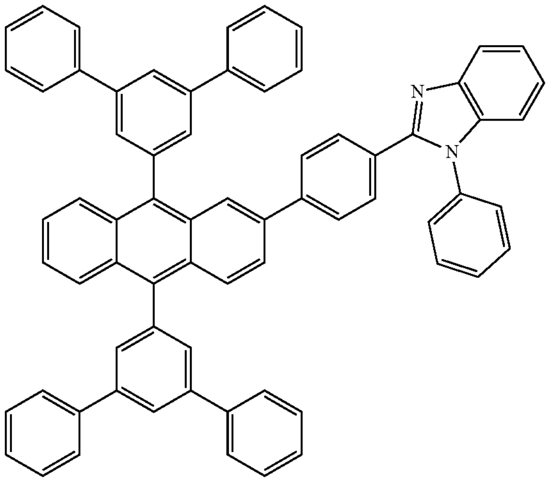
ET8
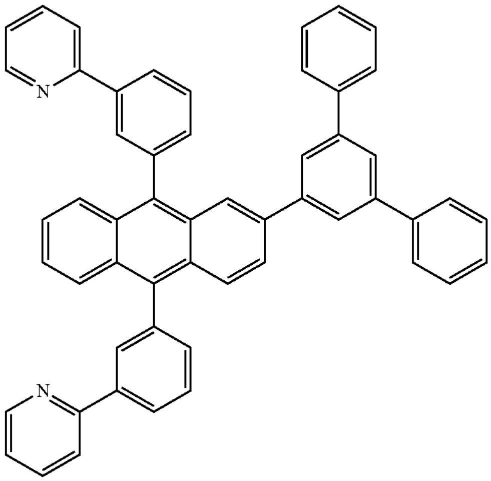

-continued
ET9
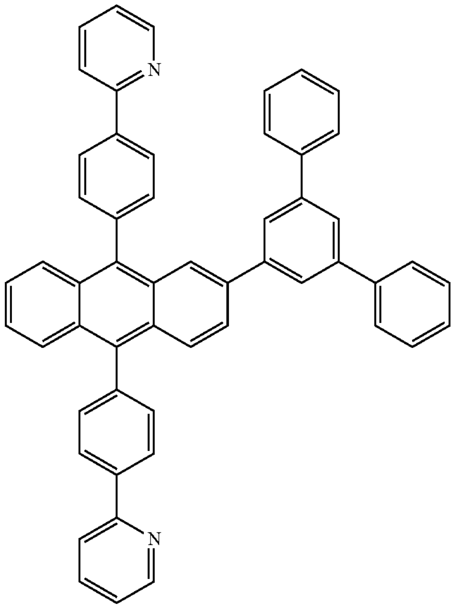
ET10
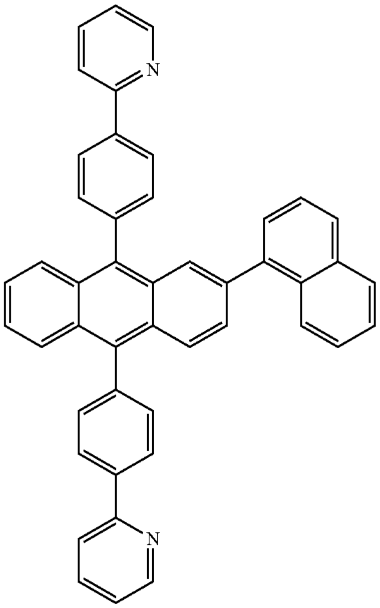
ET11
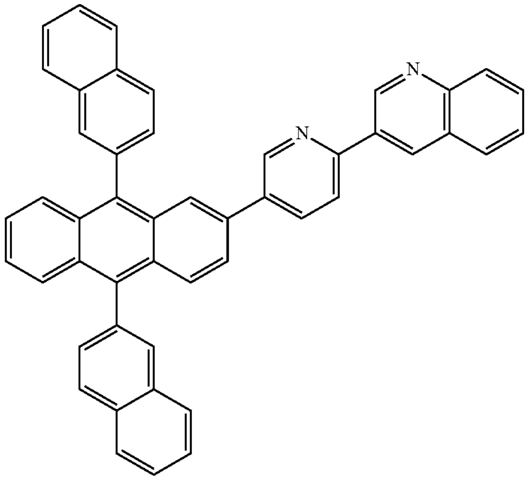
ET12
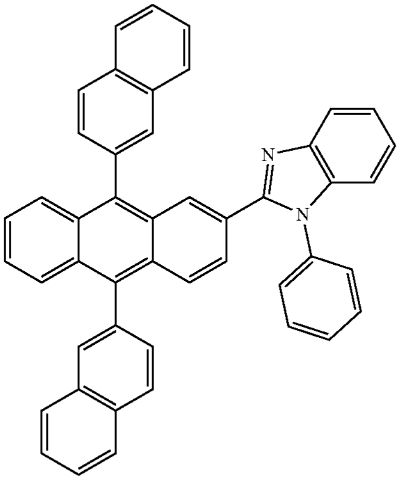
ET13
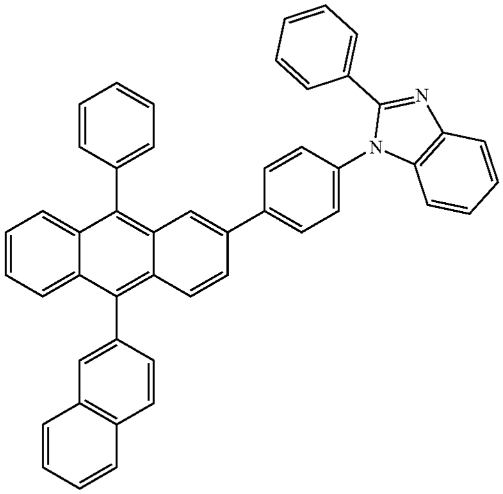
ET14
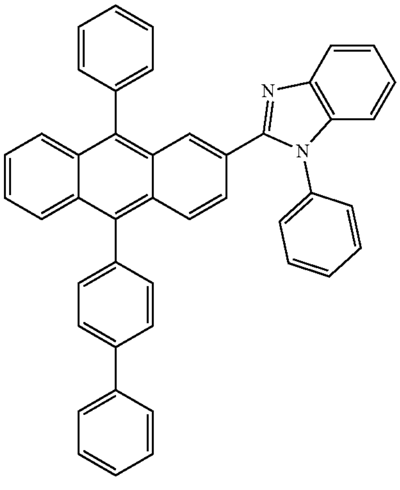

-continued
ET15
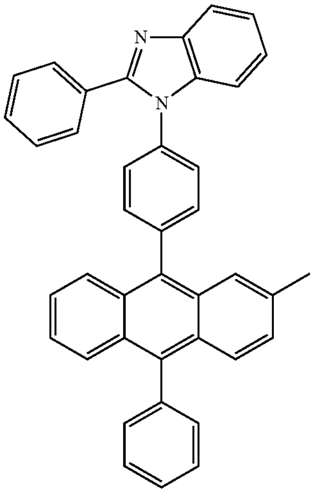
ET16
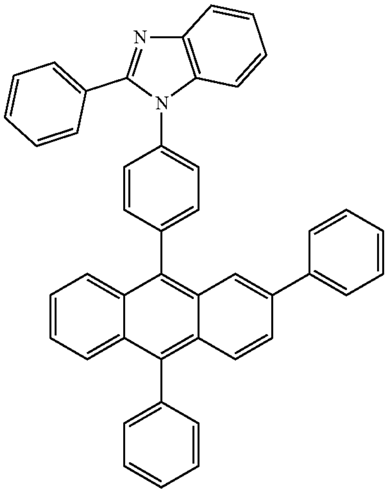
ET17
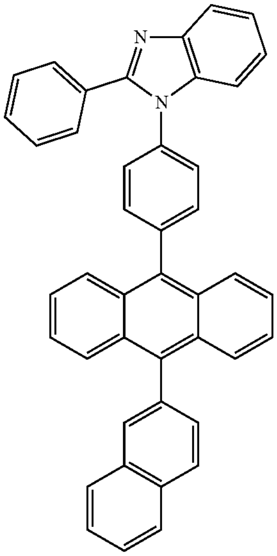
ET18
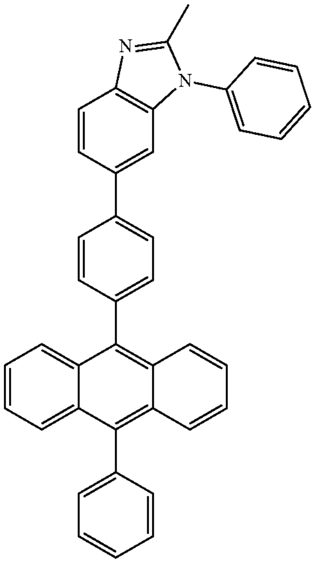
ET19
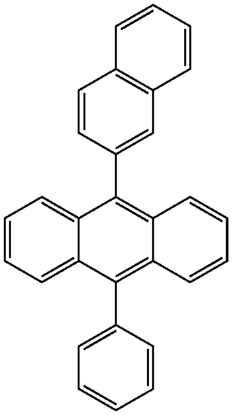
ET20
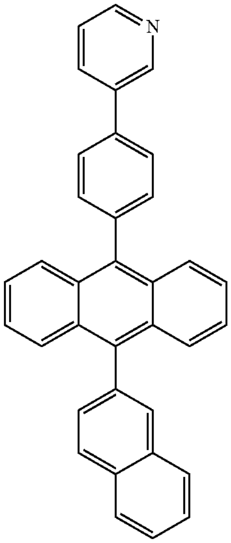

-continued
ET21
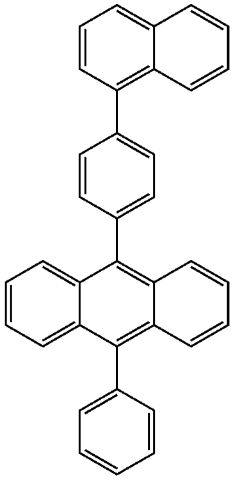
ET22
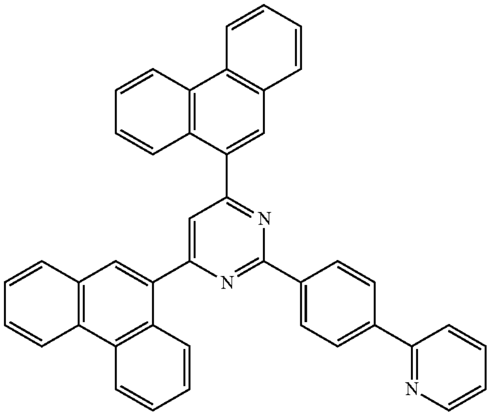
ET23
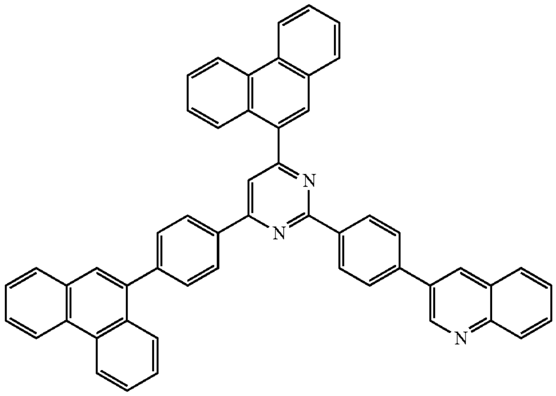
ET24
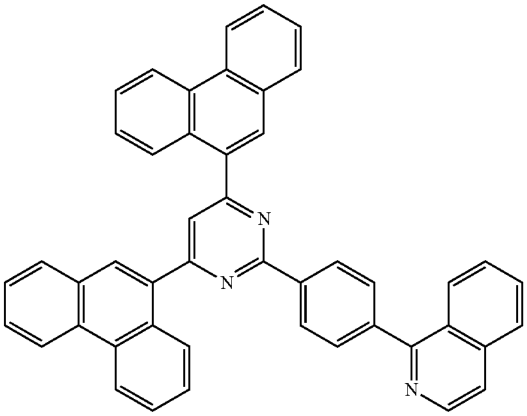
ET25
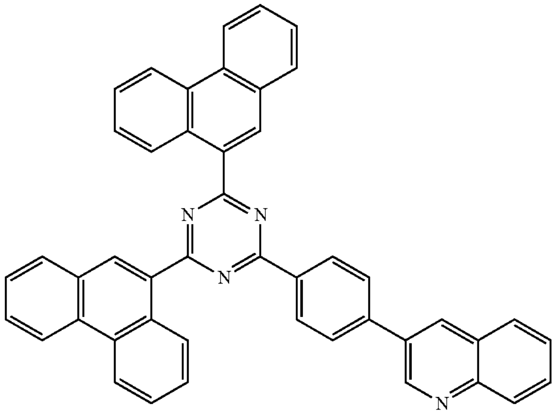
ET26
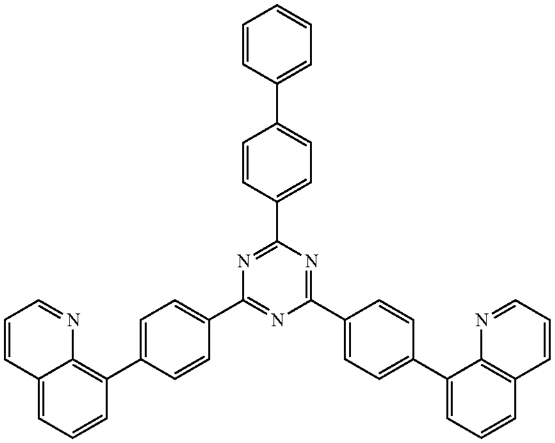

-continued
ET27
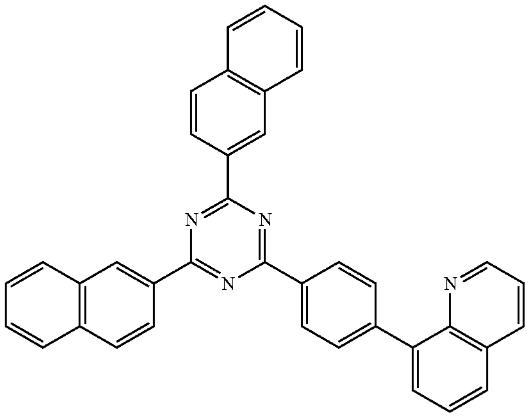
ET28
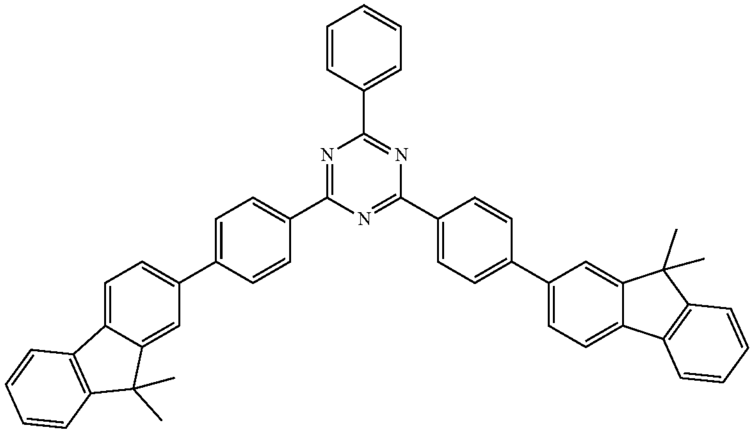
ET29
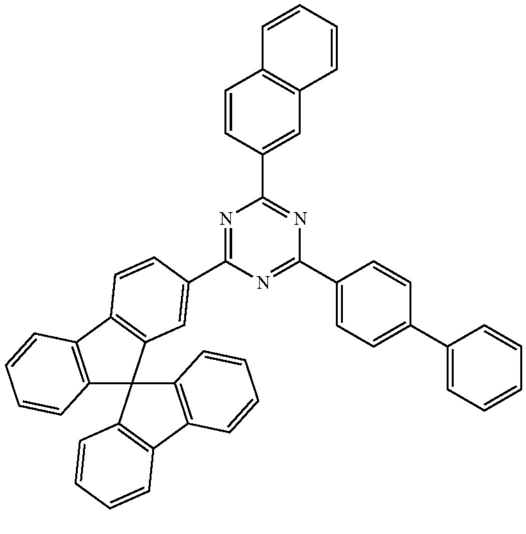
ET30
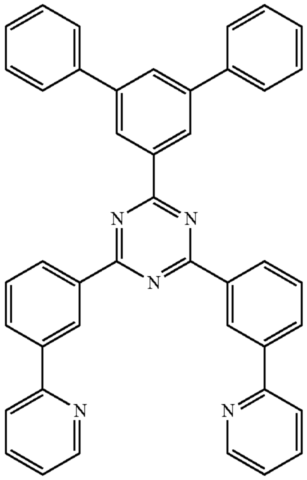

-continued
ET31
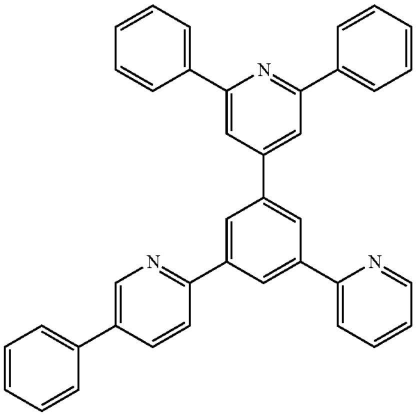
ET32
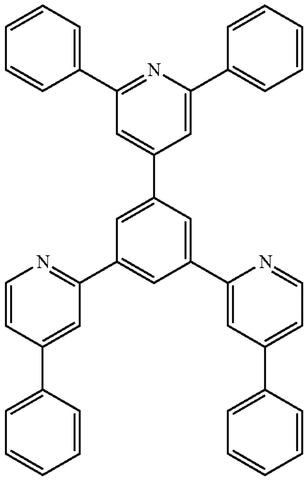
ET33
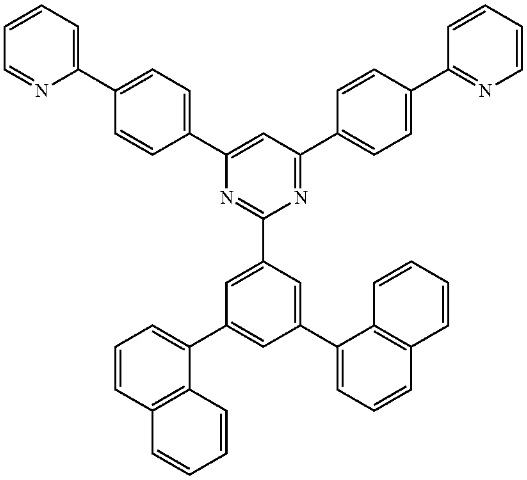
ET34
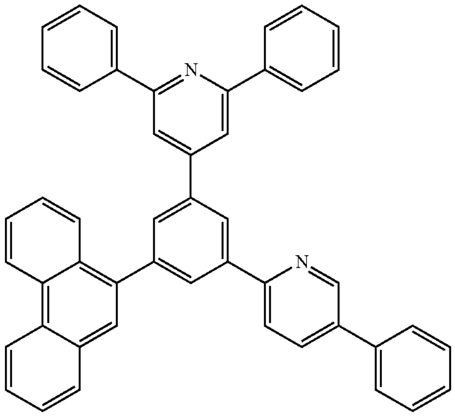
ET35
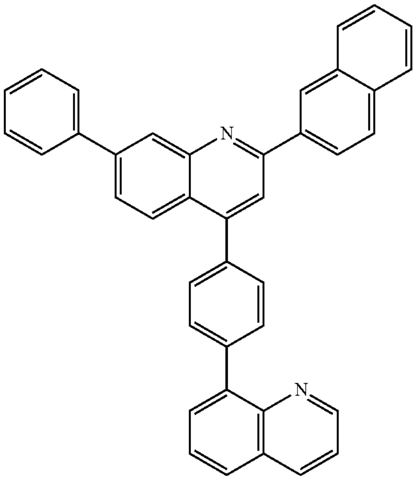
ET36
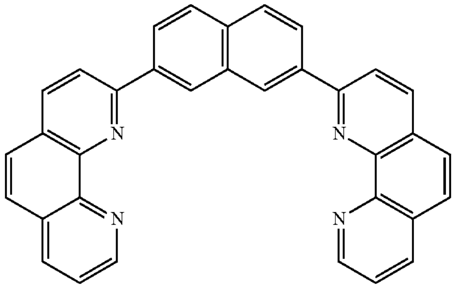

-continued
ET37
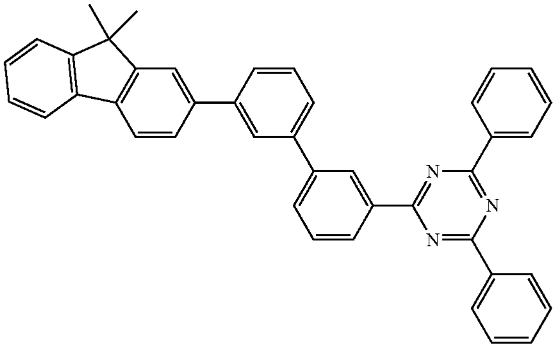
ET38
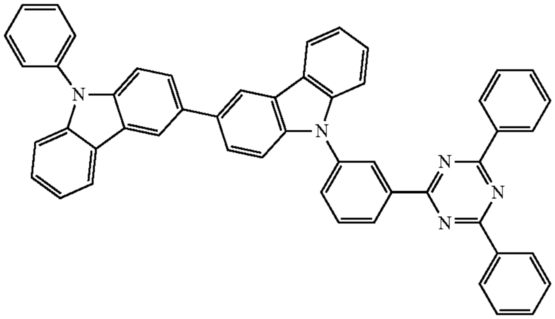
ET39
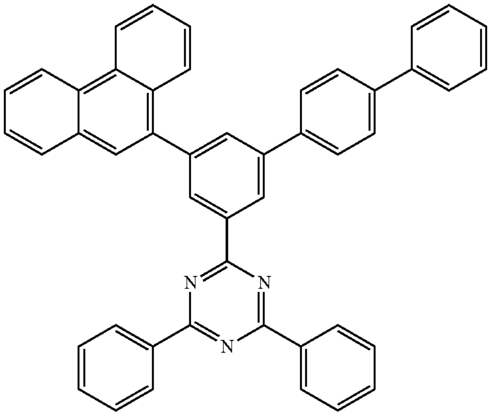
ET40
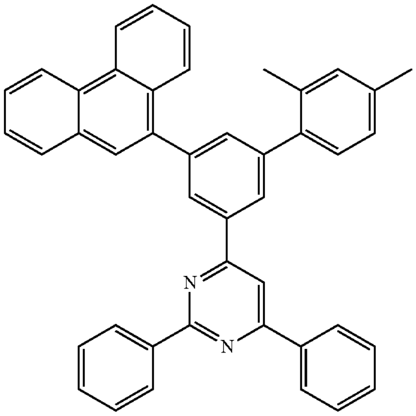
ET41
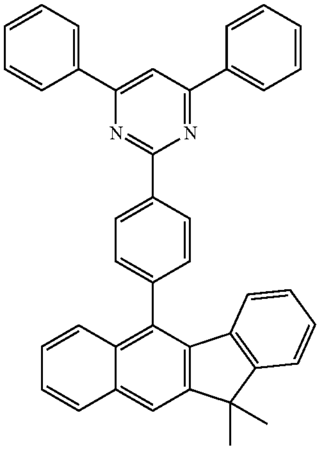
ET42
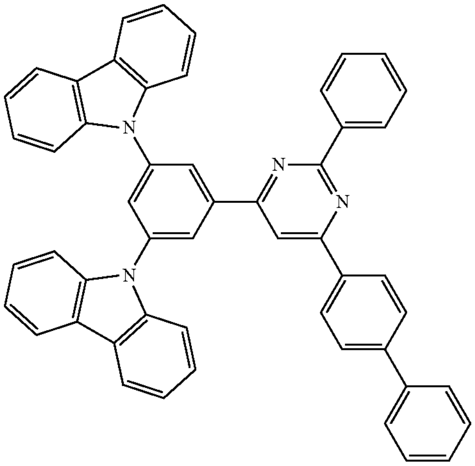

-continued

ET43

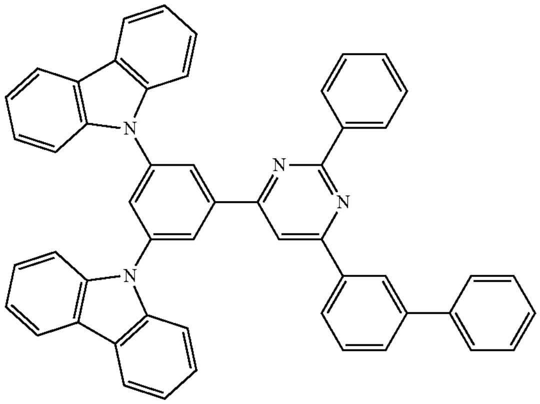

ET44

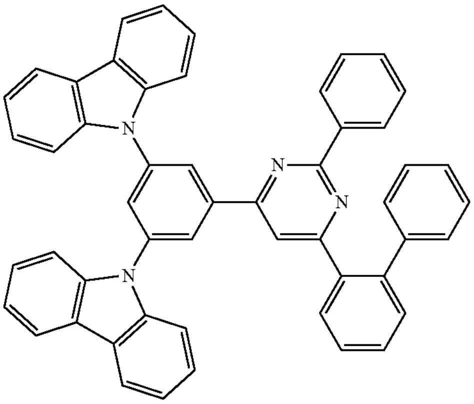

ET45

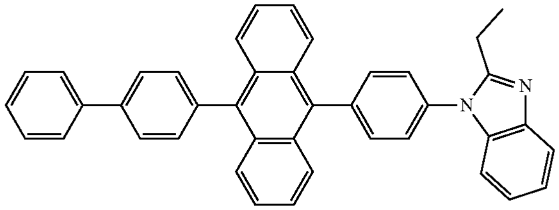

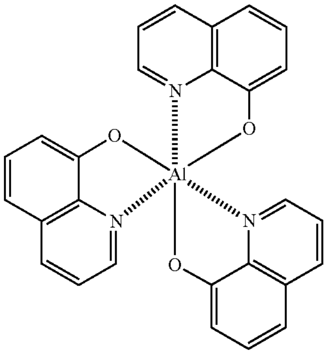

Alq3

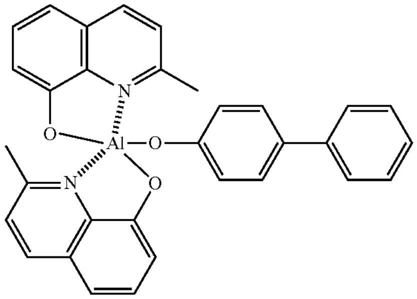

BAlq

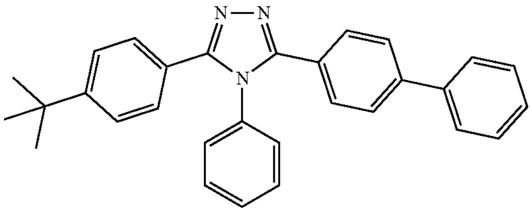

TAZ

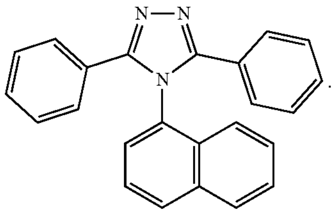

NTAZ

A thickness of the electron transport region may be in a range of about 100 Å to about 5,000 Å. For example, the thickness of the electron transport region may be in a range of about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thickness of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

ET-D1

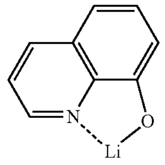

ET-D2

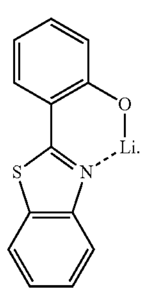

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer including different materials, or iii) a multi-layered structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides and halides (for example, fluorides, chlorides, bromides, or iodides) of the alkali metal, the alkaline earth metal, and the rare earth metal, telluride, or any combination thereof.

The alkali metal-containing compound may be alkali metal oxides, such as $Li_2O$, $Cs_2O$, or $K_2O$, and alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number that satisfies the condition of $0<x<1$), or $Ba_xCa_{1-x}O$ (x is a real number that satisfies the condition of $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii) a ligand linked to the metal ion, for example, hydroxyquinoline, hydroxy isoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may consist of i) an alkali metal-containing compound (for example, an alkali metal halide), or ii) a) an alkali metal-containing compound (for example, an alkali metal halide); and b) alkali metal, alkaline earth metal, rare earth metal, or any combination thereof. In an embodiment, the electron injection layer may be a KI:Yb co-deposited layer or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the range described above, the electron injection layer may have satisfactory electron injection characteristics without a substantial increase in driving voltage.

[Second Electrode 150]

The second electrode 150 may be located on the interlayer 130 having such a structure. The second electrode 150 may be a cathode, which is an electron injection electrode, and as the material for forming the second electrode 150, a metal, an alloy, an electrically conductive compound, or any combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be located outside the first electrode 110, and/or a second capping layer may be located outside the second electrode 150. The light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be emitted toward the outside through the first electrode 110, which is a semi-transmissive electrode or a transmissive electrode, and the first capping layer, and light generated in an emission layer of the interlayer 130 of the light-emitting device 10 may be emitted toward the outside through the second electrode 150, which is a semi-transmissive electrode or a transmissive electrode, and the second capping layer.

The first capping layer and the second capping layer may increase external light-emission efficiency according to the principle of constructive interference. Accordingly, the light-emission efficiency of the light-emitting device 10 is increased, so that the light-emission efficiency of the light-emitting device 10 may be improved.

The first capping layer and the second capping layer may each include a material having a refractive index of equal to or greater than about 1.6 (at 589 nm).

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and second capping layer may each independently include a compound represented by Formula 201, a compound represented by Formula 202, or any combination thereof.

In an embodiment, at least one of the first capping layer and the second capping layer may each independently include one of Compounds HT28 to HT33, one of Compounds CP1 to CP6, β-NPB, or any combination thereof:

CP1

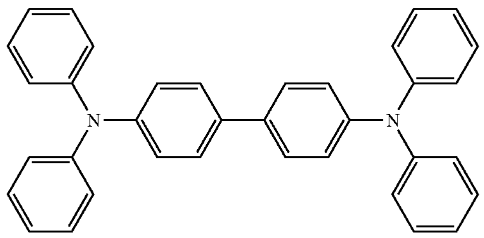

CP2

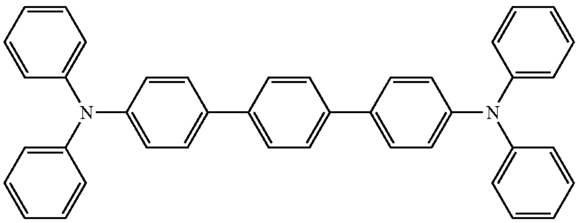

CP3

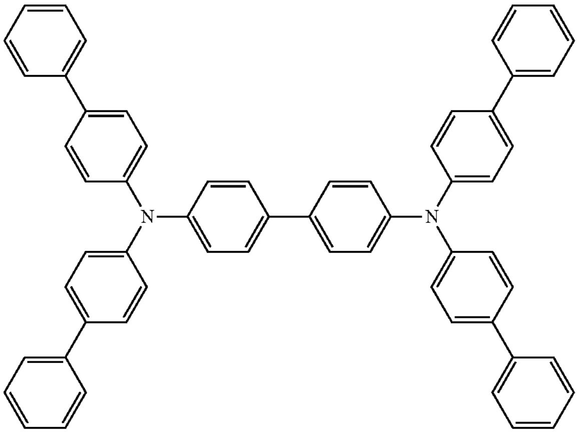

CP4

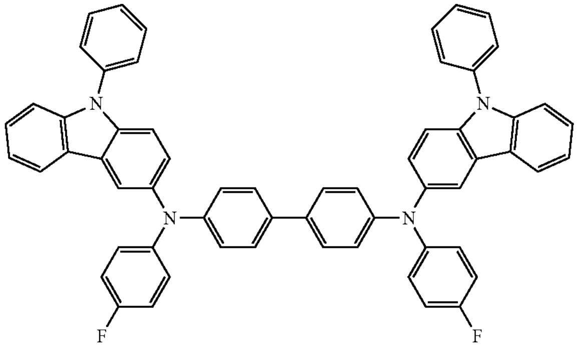

-continued

CP5

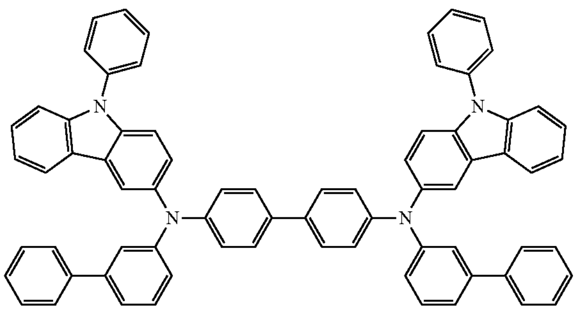

CP6

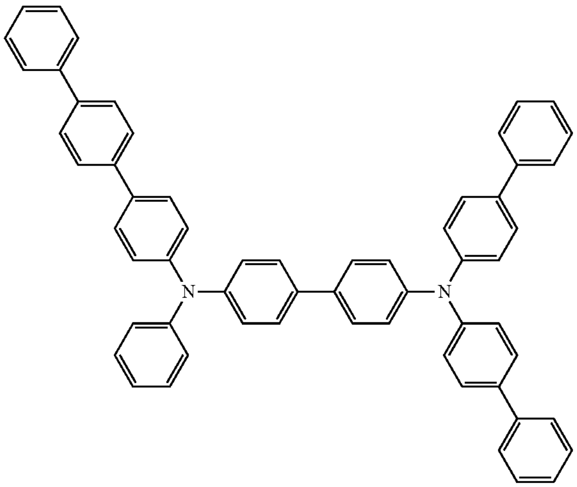

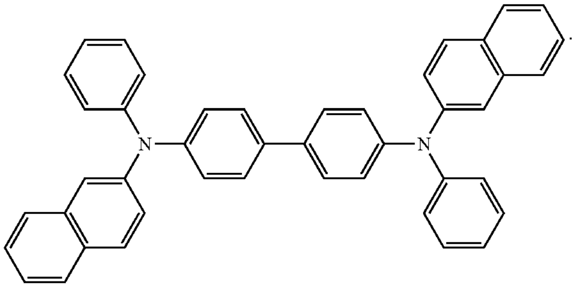

β-NPB

[Electronic Apparatus]

The light-emitting device may be included in various electronic apparatuses. In an embodiment, an electronic apparatus including the light-emitting device may be a light-emitting apparatus, an authentication apparatus, or the like.

The electronic apparatus (for example, light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. In an embodiment, light emitted from the light-emitting device may be blue light or white light. The light-emitting device may be the same as described above. In an embodiment, the color conversion layer may include a quantum dot. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be located between the subpixels to define each of the subpixels.

The color filter may further include color filter areas and light-blocking patterns located between the color filter areas, and the color conversion layer may further include color conversion areas and light-blocking patterns located between the color conversion areas.

The color filter areas (or the color conversion areas) may include a first area emitting first-color light, a second area emitting second-color light, and/or a third area emitting third-color light, and the first-color light, the second-color light, and/or the third-color light may have different maximum emission wavelengths from one another. In an embodiment, the first-color light may be red light, the second-color light may be green light, and the third-color light may be blue light. In an embodiment, the color filter areas (or the color conversion areas) may include quantum dots. The first area may include a red quantum dot, the second area may include a green quantum dot, and the third area may not include a quantum dot. The quantum dot is the same as described in the specification. Each of the first area, the second area and/or the third area may further include a scattering body.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. The first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulation layer, or the like.

The active layer may include crystalline silicon, amorphous silicon, organic semiconductor, oxide semiconductor, or the like.

The electronic apparatus may further include a sealing portion for sealing the light-emitting device. The sealing portion may be located between the color filter and/or the color conversion layer and the light-emitting device. The sealing portion allows light from the light-emitting device 10 to be emitted to the outside, while simultaneously preventing ambient air and moisture from penetrating into the light-emitting device 10. The sealing portion may be a sealing substrate including a transparent glass substrate or a plastic substrate. The sealing portion may be a thin film encapsulation layer including one or more organic layers and/or one or more inorganic layers. When the sealing portion is a thin film encapsulation layer, the electronic apparatus may be flexible.

On the sealing portion, in addition to the color filter and/or color conversion layer, various functional layers may be further located according to the use of the electronic apparatus. Examples of the functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus for authenticating an individual by using biometric information of a biometric body (for example, a fingertip, a pupil, or the like).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
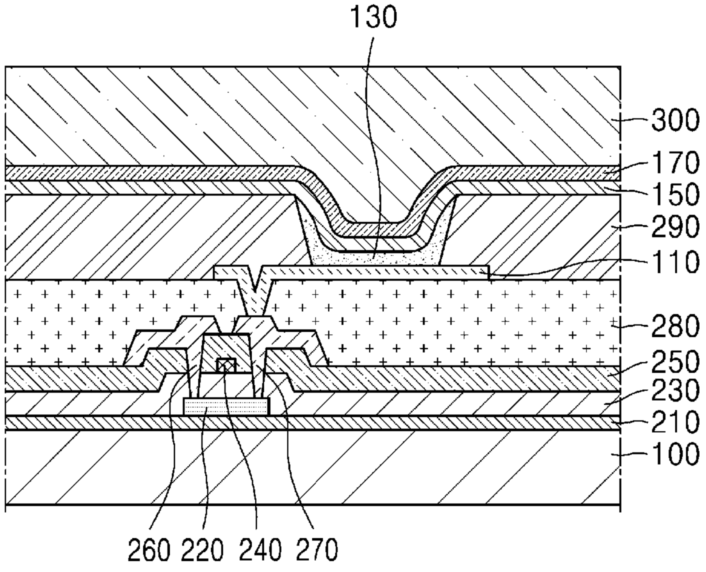
Figure 3:
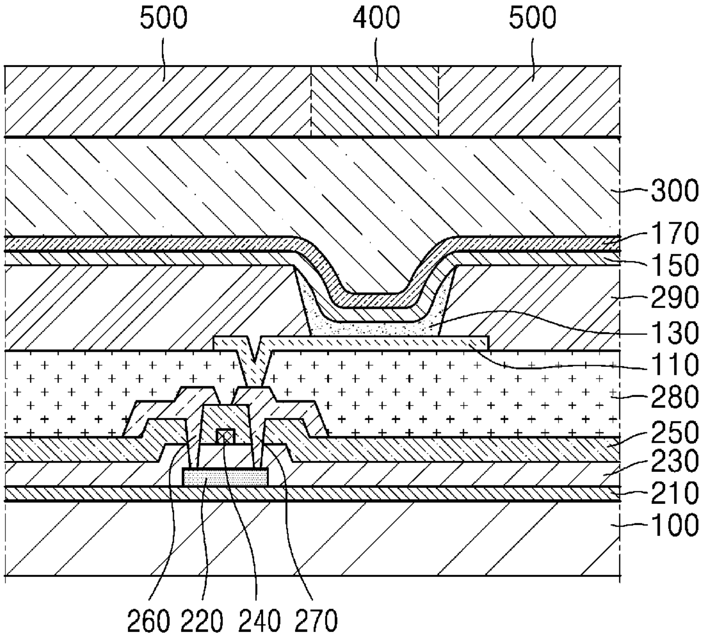

[Description of FIGS. 2 and 3]

FIG. 2 is a schematic cross-sectional view showing a light-emitting apparatus according to an embodiment of the disclosure; and The light-emitting apparatus of FIG. 2 includes a substrate 100, a thin-film transistor (TFT), a light-emitting device, and an encapsulation portion 300 that seals light-emitting device.

The substrate 100 may be a flexible substrate, a glass substrate, or a metal substrate. A buffer layer 210 may be located on the substrate 100. The buffer layer 210 prevents the penetration of impurities through the substrate 100 and may provide a flat surface on the substrate 100.

The TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 is located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may be located to be in contact with the exposed portions of the source region and the drain region of the active layer 220.

The TFT may be electrically connected to a light-emitting device to drive the light-emitting device, and may be covered by a passivation layer 280. The passivation layer 280 may include an inorganic insulating film, an organic insulating film, or a combination thereof. A light-emitting device may be provided on the passivation layer 280. The light-emitting device includes the first electrode 110, the interlayer 130, and the second electrode 150.

The first electrode 110 may be located on the passivation layer 280. The passivation layer 280 may not completely cover the drain electrode 270 and may expose a portion of the drain electrode 270, and the first electrode 110 may be connected to the exposed portion of the drain electrode 270.

A pixel defining layer 290 including an insulating material may be located on the first electrode 110. The pixel defining layer 290 may expose a region of the first electrode 110, and the interlayer 130 may be formed in the exposed region of the first electrode 110. The pixel defining layer 290 may be a polyimide or polyacryl-based organic film. Although not shown in FIG. 2, at least some layers of the interlayer 130 may extend beyond the upper portion of the pixel defining layer 290 and may thus be disposed in the form of a common layer.

The second electrode 150 may be disposed on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device and protects the light-emitting device from moisture or oxygen. The encapsulation portion 300 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate or polyacrylic acid), an epoxy-based resin (for example, aliphatic glycidyl ether (AGE)), or any combination thereof; or a combination of an inorganic film and an organic film.

FIG. 3 is a schematic cross-sectional view of a light-emitting apparatus according to another embodiment.

The light-emitting apparatus of FIG. 3 is the same as the light-emitting apparatus of FIG. 2, except that a light-blocking pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

[Preparation Method]

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

Definition of Terms

The term "$C_3$-$C_{60}$ carbocyclic group" as used herein refers to a cyclic group that consists of carbon and hydrogen only and has three to sixty carbon atoms (for example three to thirty, three to twenty four, or three to eighteen carbon atoms), and the term "$C_1$-$C_{60}$ heterocyclic group" as used herein refers to a cyclic group that has one to sixty carbon atoms (for example one to thirty, one to twenty four, or one to eighteen carbon atoms) and further includes, in addition to carbon, a heteroatom (for example, one to five or one to three heteroatoms). The $C_3$-$C_{60}$ carbocyclic group and the $C_1$-$C_{60}$ heterocyclic group may each be a monocyclic group that consists of one ring or a polycyclic group in which two or more rings are condensed with each other. In an embodiment, the number of ring-forming atoms of the $C_1$-$C_{60}$ heterocyclic group may be from 3 to 61.

The term "cyclic group" as used herein includes the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms (for example three to thirty, three to twenty four, or three to eighteen carbon atoms) and does not include *—N=*' as a ring-forming moiety, and the term "π-electron-deficient nitrogen-containing $C_1$-$C_{60}$ cyclic group" as used herein refers to a heterocyclic group that has one to sixty carbon atoms (for example one to thirty, one to twenty four, or one to eighteen carbon atoms) and includes *—N=*' as a ring-forming moiety.

For example, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), the π-electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the $\pi$ electron-rich $C_3$-$C_{60}$ cyclic group, or the $\pi$-electron-deficient nitrogen-containing $C_1$-$C_{60}$ cyclic group" as used herein refer to a group that is condensed with a cyclic group, a monovalent group, a polyvalent group (for example, a divalent group, a trivalent group, a tetravalent group, or the like), according to the structure of a formula described with corresponding terms. In an embodiment, the term "benzene group" may be a benzo group, a phenyl group, a phenylene group, or the like, which may be easily understood by one of ordinary skill in the art according to a structure of a formula including the "benzene group."

In an embodiment, examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms (for example, 1 to 30, 1 to 20 or 1 to 10 carbon atoms), and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group (for example, 2 to 30, 2 to 20 or 2 to 10 carbon atoms) having at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group (for example, 2 to 30, 2 to 20 or 2 to 10 carbon atoms) having at least one carbon-carbon triple bond in the middle or at the terminus of a $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by $-OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cycloctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom (for example, 1 to 5 or 1 to 3 heteroatoms) as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom (for example, 1 to 5 or 1 to 3 heteroatoms) as a ring-forming atom, 1 to 10 carbon atoms, and at least one double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms (for example, 6 to 30, 6 to 24 or 6 to 18 carbon atoms), and the term "$C_6$-$C_{60}$ arylene group" as used herein refers to a divalent group having a carbocyclic aromatic system having 6 to 60 carbon atoms (for example, 6 to 30, 6 to 24 or 6 to 18 carbon atoms). Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be condensed to each other.

The term "$C_1$-$C_{60}$ heteroaryl group" as used herein refers to a monovalent group having a heterocyclic aromatic system that has, in addition to a carbon atom, at least one heteroatom (for example, 1 to 5 or 1 to 3 heteroatoms) as a ring-forming atom, and 1 to 60 carbon atoms (for example, 1 to 30, 1 to 24 or 1 to 18 carbon atoms). The term "$C_1$-$C_{60}$ heteroarylene group" as used herein refers to a divalent group having a heterocyclic aromatic system that has, in addition to a carbon atom, at least one heteroatom (for example, 1 to 5 or 1 to 3 heteroatoms) as a ring-forming atom, and 1 to 60 carbon atoms (for example, 1 to 30, 1 to 24 or 1 to 18 carbon atoms). Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group (for example, having 8 to 60 carbon atoms, such as 8 to 30, 8 to 24 or 8 to 18 carbon atoms) having two or more rings condensed with each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms, such as 1 to 30, 1 to 24 or 1 to 18 carbon atoms) having two or more rings condensed to each other, at least one heteroatom (for example, 1 to 5 or 1 to 3 heteroatoms) other than carbon atoms, as a ring-forming atom, and non-aromaticity in its entire molecular structure. Examples of the monovalent non-aromatic condensed heteropolycyclic group includes a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to $-OA_{102}$ (wherein $A_{102}$ is the $C_6$-$C_{60}$ aryl group), and the term "$C_6$-$C_{60}$ arylthio group" as used herein refers to $-SA_{103}$ (wherein $A_{103}$ is the $C_6$-$C_{60}$ aryl group).

The group $R_{10a}$ as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $-Si(Q_{11})(Q_{12})(Q_{13})$, $-N(Q_{11})(Q_{12})$, $-B(Q_{11})(Q_{12})$, $-C(=O)(Q_{11})$, $-S(=O)_2(Q_{11})$, $-P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $-Si(Q_{21})(Q_{22})(Q_{23})$, $-N(Q_{21})(Q_{22})$, $-B(Q_{21})(Q_{22})$, $-C(=O)(Q_{21})$, $-S(=O)_2(Q_{21})$, $-P(=O)(Q_{21})(Q_{22})$, or any combination thereof; or $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, or $-P(=O)(Q_{31})(Q_{32})$.

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term “heteroatom” as used herein refers to any atom other than a carbon atom. Examples of the heteroatom are O, S, N, P, Si, B, Ge, Se, or any combination thereof.

The term “Ph” as used herein refers to a phenyl group, the term “Me” as used herein refers to a methyl group, the term “Et” as used herein refers to an ethyl group, the term “tert-Bu” or “But” as used herein refers to a tert-butyl group, and the term “OMe” as used herein refers to a methoxy group.

The term “biphenyl group” as used herein refers to “a phenyl group substituted with a phenyl group.” In other words, the “biphenyl group” is a substituted phenyl group having a $C_6$-$C_{60}$ aryl group as a substituent.

The term “terphenyl group” as used herein refers to “a phenyl group substituted with a biphenyl group.” In other words, the “terphenyl group” is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a compound according to embodiments and a light-emitting device according to embodiments will be described in detail with reference to Examples. The wording “B was used instead of A” used in describing Examples refers to that an identical molar equivalent of B was used in place of A.

EXAMPLES

Example 1-1

As an anode, an ITO/Ag/ITO substrate (hereinafter, referred to as “ITO substrate”) was cut to a size of 50 mm×50 mm×0.7 mm, sonicated by using isopropyl alcohol and pure water for 5 minutes each, and cleaned by irradiation of ultraviolet rays and exposure of zone thereto for 30 minutes. The ITO substrate was loaded onto a vacuum deposition apparatus.

Compound 6 was vacuum-deposited on the ITO substrate to form a hole injection layer having a thickness of 110 nm, and HT45 was vacuum-deposited on the hole injection layer to form a hole transport layer having a thickness of 10 nm.

H125 and PD11 were co-deposited on the hole transport layer at a weight ratio of 90:10 to form an emission layer having a thickness of 30 nm. Subsequently, BAlq was vacuum-deposited thereon to form a hole blocking layer having a thickness of 10 nm. Subsequently, $Alq_3$ was deposited on the hole blocking layer to form an electron transport layer having a thickness of 20 nm, LiF, which is an alkali metal halide, was deposited on the electron transport layer to form an electron injection layer having a thickness of 1 nm, and Al was vacuum-deposited thereon to form an LiF/Al cathode having a thickness of 30 nm, thereby completing manufacture of a light-emitting device.

6

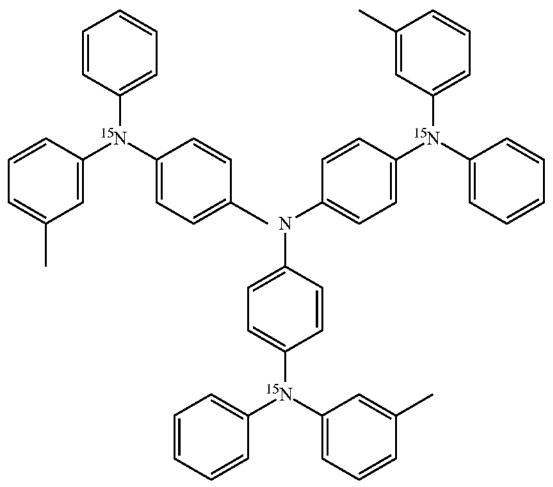

HT45

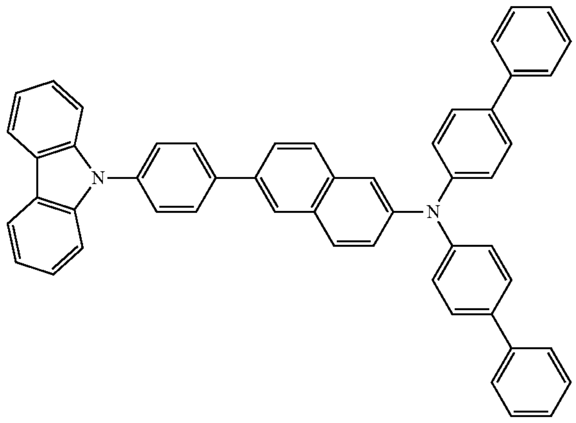

H125

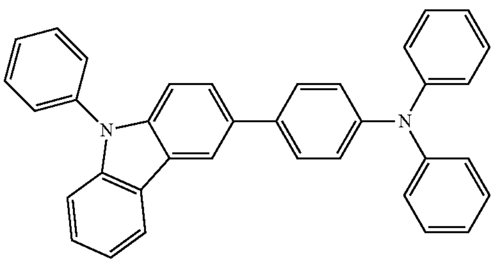

PD11

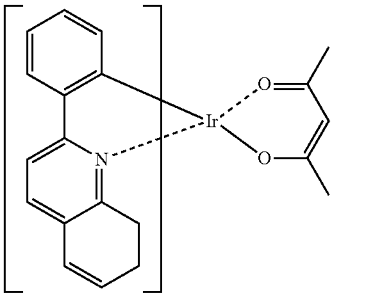

-continued

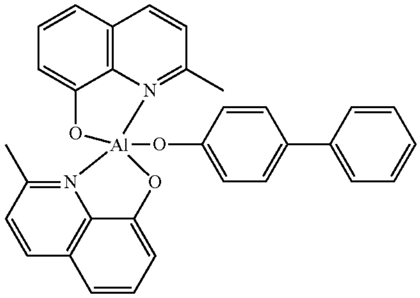

BAlq

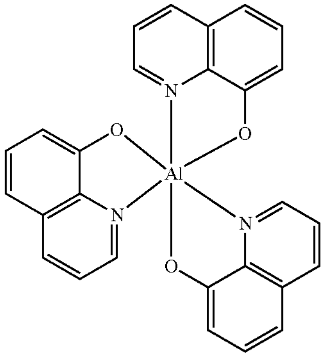

Alq3

Examples 1-2 to 1-8 and Comparative Examples 1-1 and 1-2

A light-emitting device was manufactured in the same manner as in Example 1-1, except that, compounds shown in Table 1 were used instead of Compound 6, HT45, HT125, and PD11, which were used in Example 1-1.

Evaluation Example 1

In order to evaluate characteristics of the light-emitting devices manufactured in Examples 1-1 to 1-8 and Comparative Examples 1-1 and 1-2, with respect to each of the light-emitting devices of Examples 1-1 to 1-8 and Comparative Examples 1-1 and 1-2, a driving voltage (V) at 1000 cd/$m^2$, a light-emission efficiency (cd/A), an emission color, and a lifespan ($LT_{97}$) were each measured by using Keithley MU 236 and a luminance meter PR650, and results thereof are shown in Table 1. In Table 1, the lifespan ($LT_{97}$) indicates an amount of time that lapsed when luminance was 97% of initial luminance, wherein results are represented based on the lifespan of the light-emitting device of Comparative Example 1-2 being 100%.

TABLE 1

| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
| Example 1-1 | Compound 6 | HT45 | H125:PD11 (90:10) | 5.3 | 19.1 | Red | 67% |
| Example 1-2 | m-MTDATA | Compound 15 | H125:PD11 (90:10) | 5.2 | 20.1 | Red | 71% |
| Example 1-3 | Compound 6 | Compound 15 | H125:PD11 (90:10) | 5.3 | 20.3 | Red | 77% |
| Example 1-4 | Compound 7 | Compound 16 | H125:PD11 (90:10) | 5.3 | 20.3 | Red | 80% |
| Example 1-5 | Compound 6 | HT45 | H126:H40: PD11 (45:45:10) | 4.9 | 23.4 | Red | 104% |
| Example 1-6 | m-MTDATA | Compound 15 | H126:H40: PD11 (45:45:10) | 5.0 | 23.9 | Red | 111% |
| Example 1-7 | Compound 6 | Compound 15 | H126:H40: PD11 (45:45:10) | 4.8 | 24.1 | Red | 118% |
| Example 1-8 | Compound 7 | Compound 16 | H126:H40: PD11 (45:45:10) | 4.8 | 24.2 | Red | 120% |
| Comparative Example 1-1 | m-MTDATA | HT45 | H125:PD11 (90:10) | 5.3 | 19.2 | Red | 63% |

TABLE 1-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
| Comparative Example 1-2 | m-MTDATA | HT45 | H126:H40: PD11 (45:45:10) | 4.9 | 23.4 | Red | 100% |
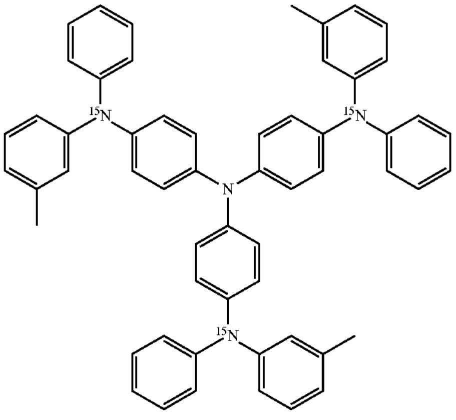
6
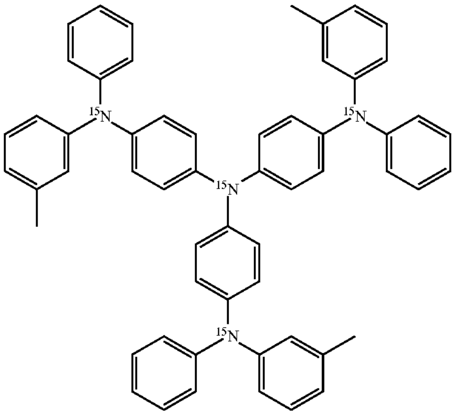
7
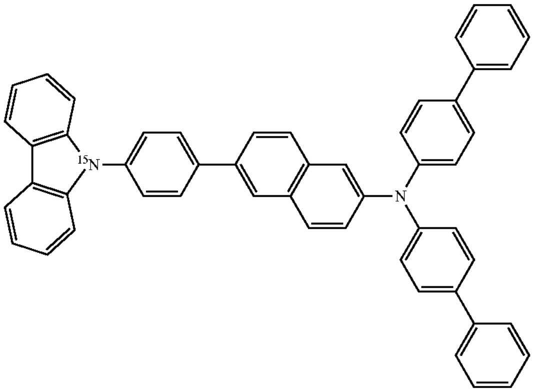
15

TABLE 1-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
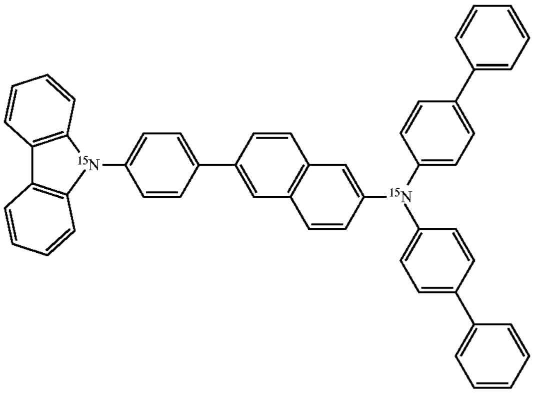
16
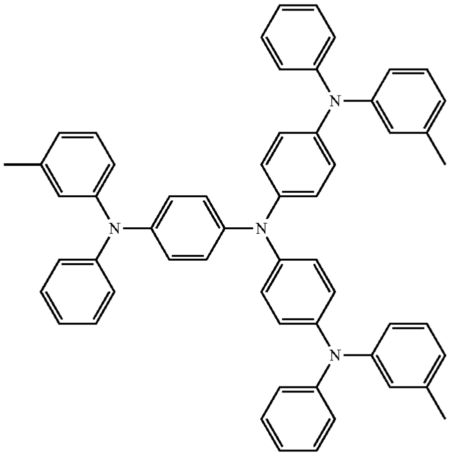
m-MTDATA
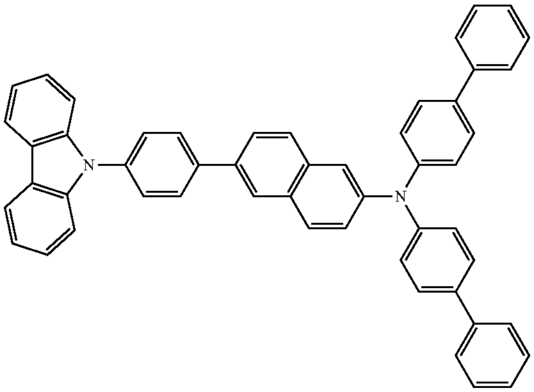
HT45

TABLE 1-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
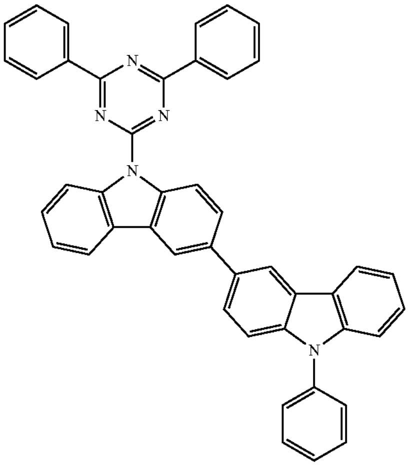
H40
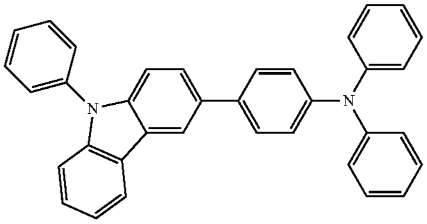
H125
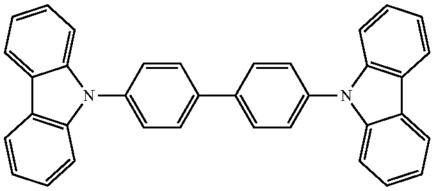
H126
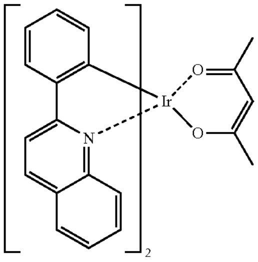
PD11

Referring to Table 1, it was confirmed that the light-emitting devices of Examples 1-1 to 1-4 have low driving voltage, high efficiency, or long lifespan, compared to the light-emitting device of Comparative Example 1-1, and the light-emitting devices of Examples 1-5 to 1-8 have low driving voltage, high efficiency, or long lifespan, compared to the light-emitting device of Comparative Example 1-2.

Example 2-1

A light-emitting device was manufactured in the same manner as in Example 1-1, except that Compound 6 was vacuum-deposited on the ITO substrate to form a hole injection layer having a thickness of 110 nm, HT45 was vacuum-deposited on the hole injection layer to form a hole transport layer having a thickness of 10 nm, and H125 and PD13 were co-deposited on the hole transport layer at a weight ratio of 90:10 to form an emission layer having a thickness of 30 nm.

6

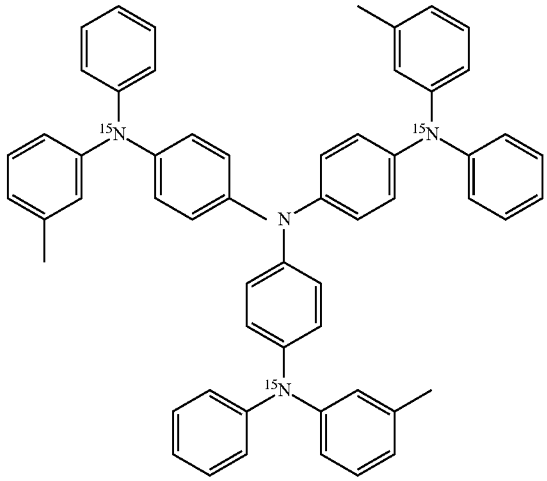

HT45

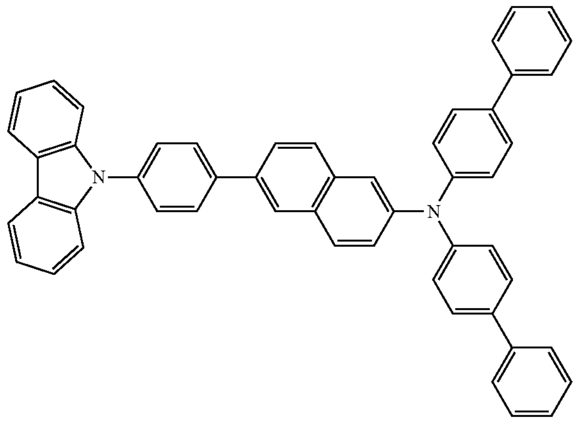

-continued

H125

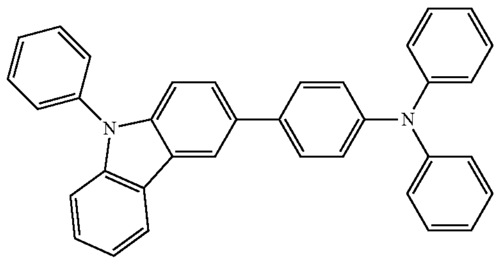

PD13

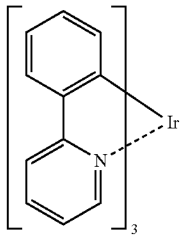

Examples 2-2 to 2-8 and Comparative Examples 2-1 and 2-2

A light-emitting device was manufactured in the same manner as in Example 2-1, except that, compounds shown in Table 2 were used instead of Compound 6, HT45, HT125, and PD13, which were used in Example 2-1.

Evaluation Example 2

Evaluation Example 2 was measured in the same manner as Evaluation Example 1, except that the lifespan of Comparative Example 2-2 was used as a standard of 100%. Results of evaluation on characteristics of the light-emitting devices manufactured in Examples 2-1 to 2-8 and Comparative Examples 1-1 and 2-2 are shown in Table 2.

TABLE 2

| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
| Example 2-1 | Compound 6 | HT45 | H125:PD13 (90:10) | 5.2 | 42.0 | Green | 59 % |

TABLE 2-continued

| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
| Example 2-2 | m-MTDATA | Compound 15 | H125:PD13 (90:10) | 5.1 | 43.2 | Green | 67 % |
| Example 2-3 | Compound 6 | Compound 15 | H125:PD13 (90:10) | 5.1 | 43.1 | Green | 69 % |
| Example 2-4 | Compound 7 | Compound 16 | H125:PD13 (90:10) | 5.1 | 43.1 | Green | 73 % |
| Example 2-5 | Compound 6 | HT45 | H126:H40: PD13 (45:45:10) | 4.8 | 52.9 | Green | 105 % |
| Example 2-6 | m-MTDATA | Compound 15 | H126:H40: PD13 (45:45:10) | 4.8 | 55.5 | Green | 110% |
| Example 2-7 | Compound 6 | Compound 15 | H126:H40: PD13 (45:45:10) | 4.8 | 56.1 | Green | 117% |
| Example 2-8 | Compound 7 | Compound 16 | H126:H40: PD13 (45:45:10) | 4.8 | 56.0 | Green | 120 % |
| Comparative Example 2-1 | m-MTDATA | HT45 | H125:PD13 (90:10) | 5.1 | 41.7 | Green | 57% |
| Comparative Example 2-2 | m-MTDATA | HT45 | H126:H40: PD13 (45:45:10) | 4.8 | 53.2 | Green | 100 % |

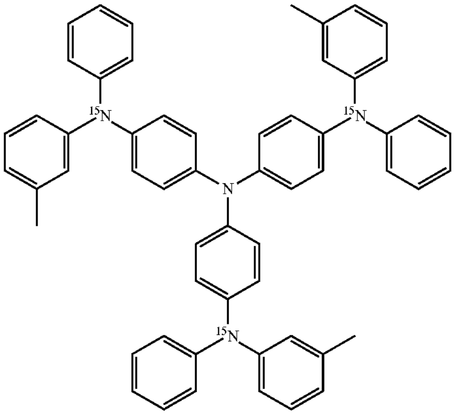

6

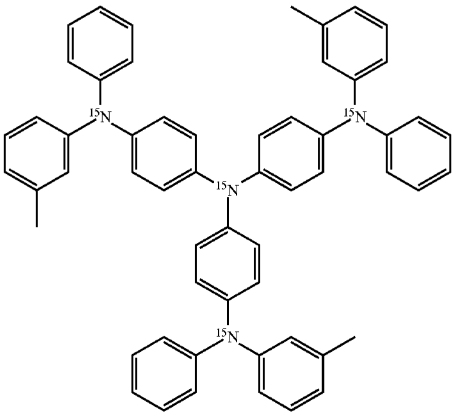

7

TABLE 2-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
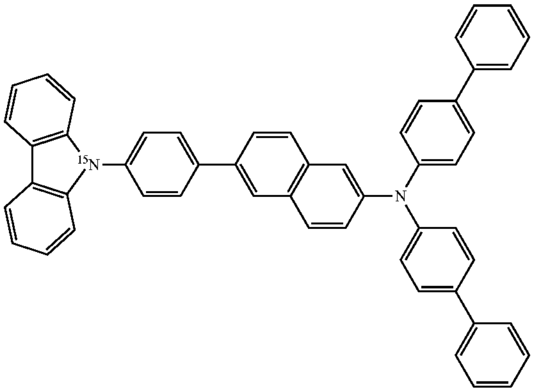
15
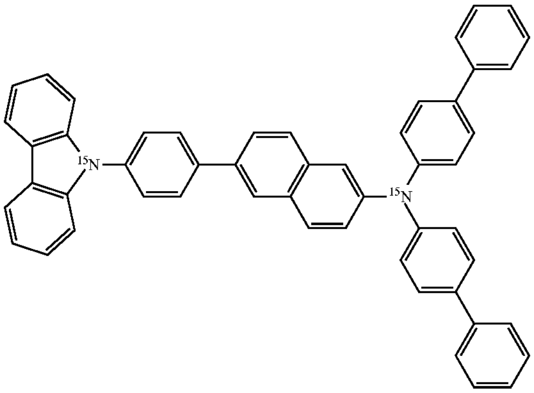
16
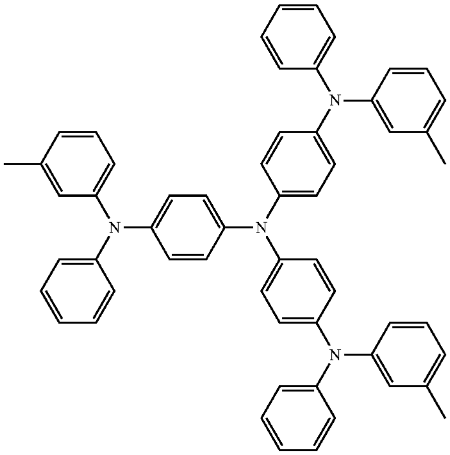
m-MTDATA TABLE 2-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
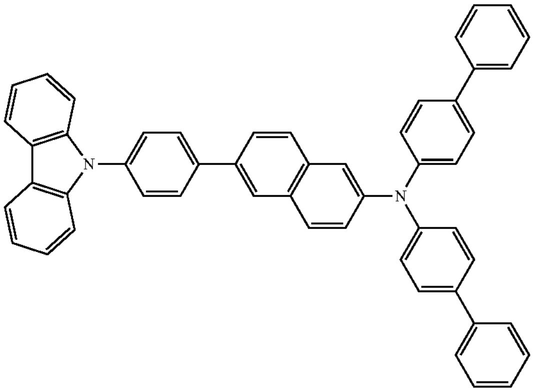
HT45
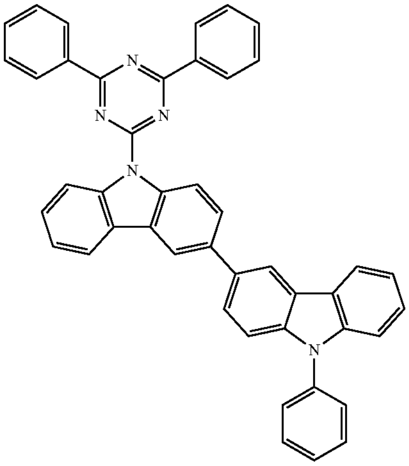
H40
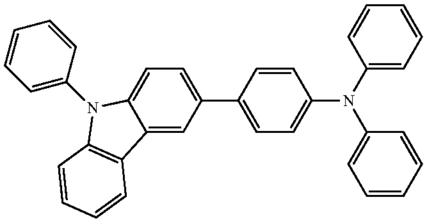
H125
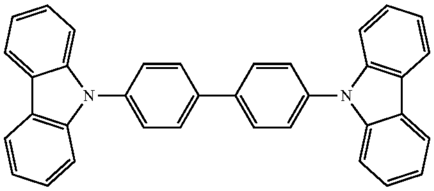
H126

TABLE 2-continued

| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
| 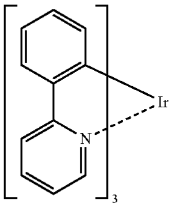 PD13 | | | | | | | |

Referring to Table 2, it was confirmed that the light-emitting devices of Examples 2-1 to 2-4 have low driving voltage, high efficiency, or long lifespan, compared to the light-emitting device of Comparative Example 2-1, and the light-emitting devices of Examples 2-5 to 2-8 have low driving voltage, high efficiency, or long lifespan, compared to the light-emitting device of Comparative Example 2-2.

Example 3-1

A light-emitting device was manufactured in the same manner as in Example 1-1, except that Compound 6 was vacuum-deposited on the ITO substrate to form a hole injection layer having a thickness of 110 nm, HT45 was vacuum-deposited on the hole injection layer to form a hole transport layer having a thickness of 10 nm, and H127 and FD1 were co-deposited on the hole transport layer at a weight ratio of 90:10 to form an emission layer having a thickness of 30 nm.

6

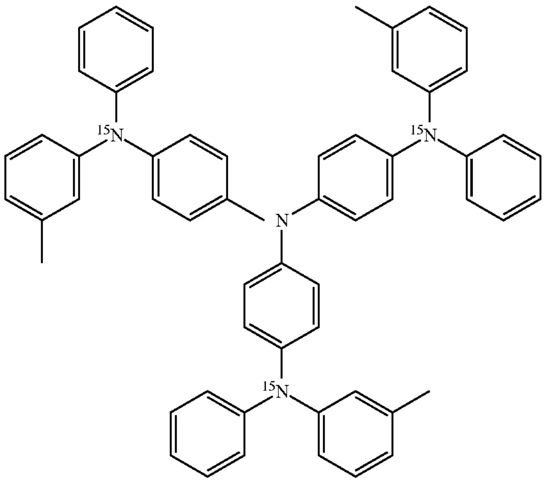

-continued

HT45

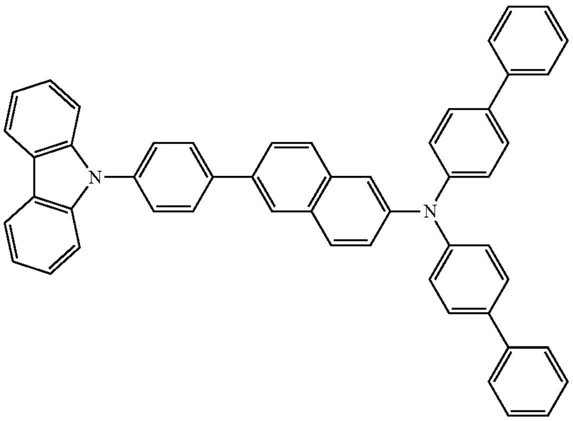

H127

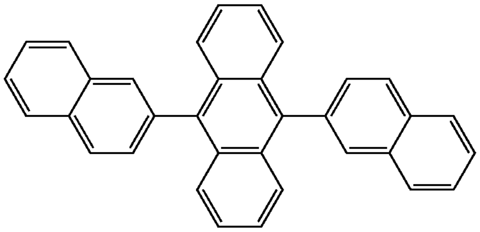

FD1

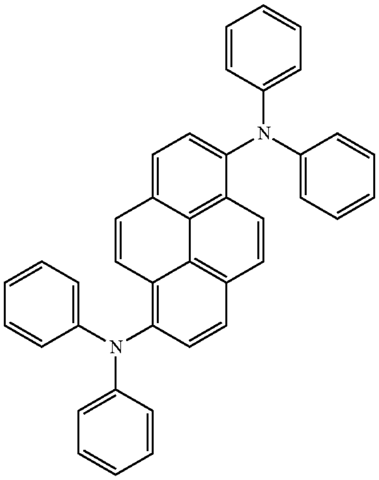

Examples 3-2 to 3-8 and Comparative Examples 3-1 and 3-2

A light-emitting device was manufactured in the same manner as in Example 3-1, except that, compounds shown in Table 3 were used instead of Compound 6, HT45, HT127, and FD1, which are used in Example 3-1.

Evaluation Example 3

Evaluation Example 3 was measured in the same manner as Evaluation Example 1, except that the lifespan of Comparative Example 3-1 was used as a standard of 100%. Results of evaluation on characteristics of the light-emitting devices manufactured in Examples 3-1 to 3-8 and Comparative Examples 3-1 and 3-2 are shown in Table 3.

TABLE 3

| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
| Example 3-1 | Compound 6 | HT45 | H127:FD1 (90:10) | 4.3 | 6.2 | Blue | 103% |
| Example 3-2 | m-MTDATA | Compound 15 | H127:FD1 (90:10) | 4.2 | 6.3 | Blue | 111% |
| Example 3-3 | Compound 6 | Compound 15 | H127:FD1 (90:10) | 4.2 | 6.4 | Blue | 120% |
| Example 3-4 | Compound 7 | Compound 16 | H127:FD1 (90:10) | 4.2 | 6.4 | Blue | 122% |
| Example 3-5 | Compound 6 | HT45 | H127:H128: FD1 (45:45:10) | 3.9 | 5.8 | Blue | 95% |
| Example 3-6 | m-MTDATA | Compound 15 | H127:H128: FD1 (45:45:10) | 3.8 | 6.0 | Blue | 100% |
| Example 3-7 | Compound 6 | Compound 15 | H127:H128: FD1 (45:45:10) | 3.9 | 6.0 | Blue | 103% |
| Example 3-8 | Compound 7 | Compound 16 | H127:H128: FD1 (45:45:10) | 3.9 | 6.0 | Blue | 105% |
| Comparative Example 3-1 | m-MTDATA | HT45 | H127:FD1 (90:10) | 4.2 | 6.3 | Blue | 100% |
| Comparative Example 3-2 | m-MTDATA | HT45 | H127:H128: FD1 (45:45:10) | 3.9 | 5.9 | Blue | 93% |

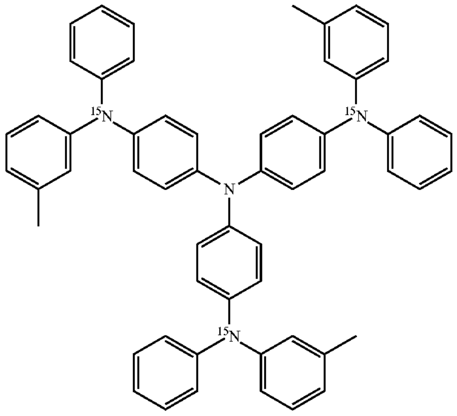

6

TABLE 3-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
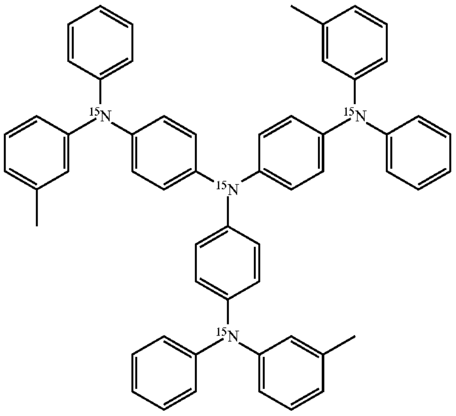
7
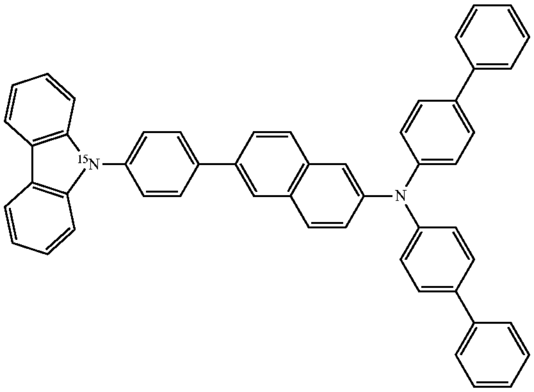
15
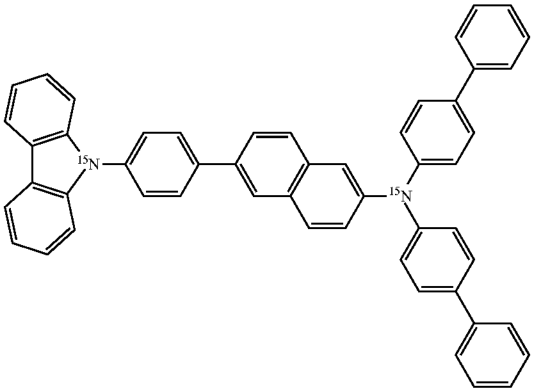
16

TABLE 3-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
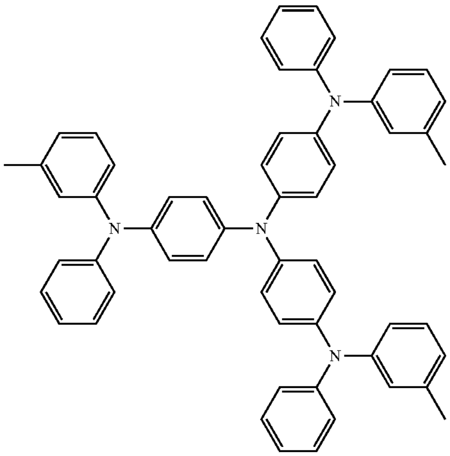
m-MTDATA
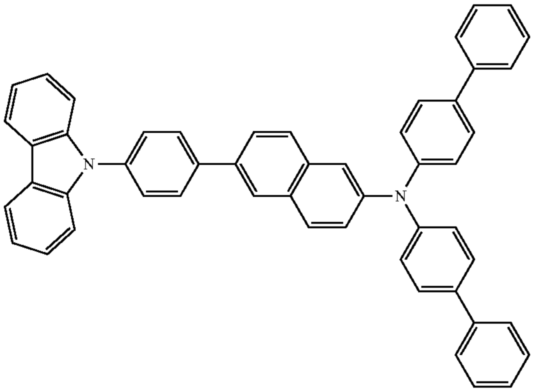
HT45
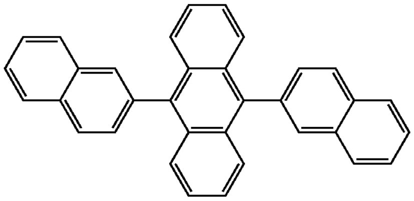
H127
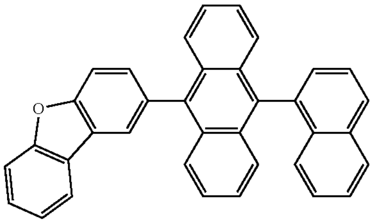
H128

TABLE 3-continued

| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|

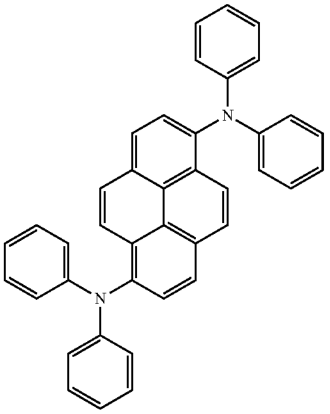

FD1

Referring to Table 3, it was confirmed that the light-emitting devices of Examples 3-1 to 3-4 have low driving voltage, high efficiency, or long lifespan, compared to the light-emitting device of Comparative Example 3-1, and the light-emitting devices of Examples 3-5 to 3-8 have low driving voltage, high efficiency, or long lifespan, compared to the light-emitting device of Comparative Example 3-2.

Example 4-1

A light-emitting device was manufactured in the same manner as in Example 1-1, except that Compound 24 was vacuum-deposited on the ITO substrate to form a hole injection layer having a thickness of 110 nm, HT45 was vacuum-deposited on the hole injection layer to form a hole transport layer having a thickness of 10 nm, and H125 and PD11 were co-deposited on the hole transport layer at a weight ratio of 90:10 to form an emission layer having a thickness of 30 nm.

24

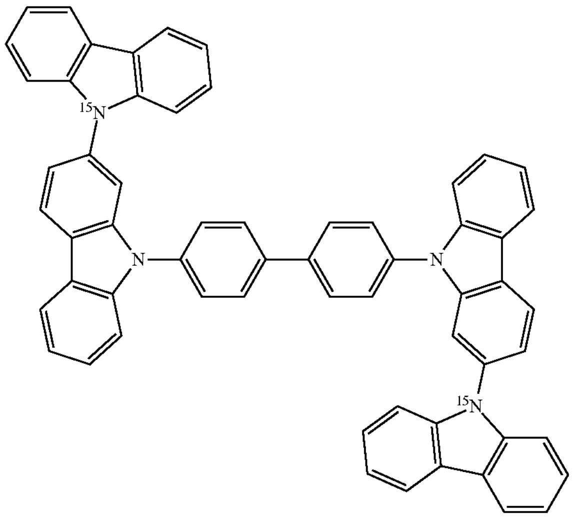

-continued

HT45

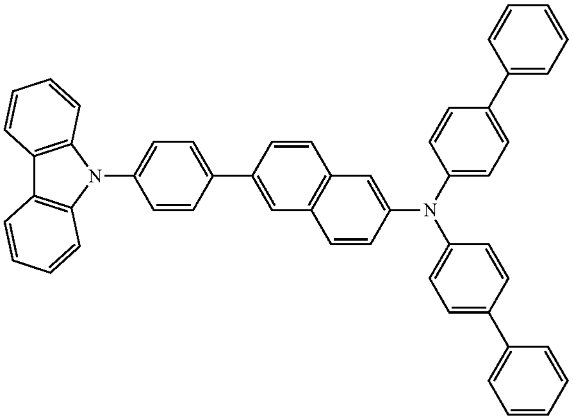

H125

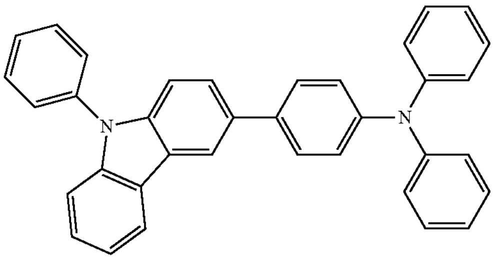

-continued

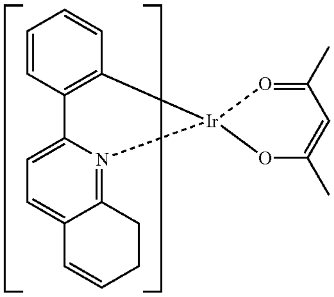

PD11

Examples 4-2 to 4-6 and Comparative Examples 4-1 and 4-2

A light-emitting device was manufactured in the same manner as in Example 4-1, except that, compounds shown in Table 4 were used instead of Compound 24, HT45, HT125, and PD11, which were used in Example 4-1.

Evaluation Example 4

Evaluation Example 4 was measured in the same manner as Evaluation Example 1, except that the lifespan of Comparative Example 4-2 was used as a standard of 100%. Results of evaluation on characteristics of the light-emitting devices manufactured in Examples 4-1 to 4-6 and Comparative Examples 4-1 and 4-2 are shown in Table 4.

TABLE 4

| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
| Example 4-1 | Compound 24 | HT45 | H125:PD11 (90:10) | 5.3 | 19.5 | Red | 80% |
| Example 4-2 | HT35 | Compound 15 | H125:PD11 (90:10) | 5.3 | 19.6 | Red | 81% |
| Example 4-3 | Compound 24 | Compound 15 | H125:PD11 (90:10) | 5.3 | 19.7 | Red | 81% |
| Example 4-4 | Compound 24 | HT45 | H126:H40: PD11 (45:45:10) | 5.2 | 22.7 | Red | 109% |
| Example 4-5 | HT35 | Compound 15 | H126:H40: PD11 (45:45:10) | 5.1 | 22.9 | Red | 115% |
| Example 4-6 | Compound 24 | Compound 15 | H126:H40: PD11 (45:45:10) | 5.2 | 22.9 | Red | 118% |
| Comparative Example 4-1 | HT35 | HT45 | H125:PD11 (90:10) | 5.4 | 19.5 | Red | 73% |
| Comparative Example 4-2 | HT35 | HT45 | H126:H40: PD11 (45:45:10) | 5.2 | 22.7 | Red | 100% |

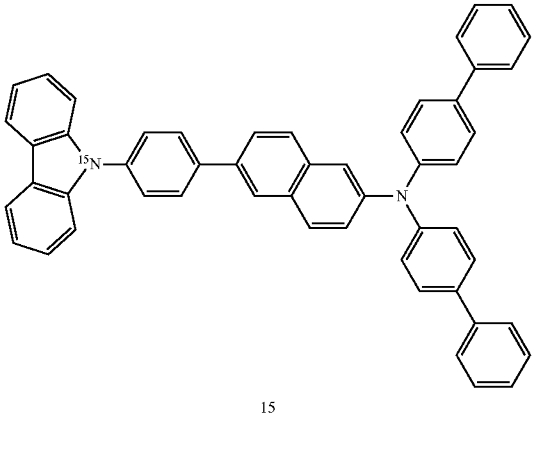 [SMILES: c1ccc(-c2ccc(N(c3ccc(-c4ccccc4)cc3)c3ccc4cc(-c5ccc(-[15n]6c7ccccc7c7ccccc76)cc5)ccc4c3)cc2)cc1 ; "15"]

15

TABLE 4-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
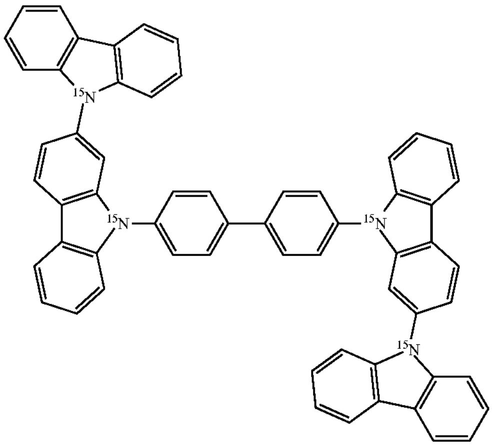
24
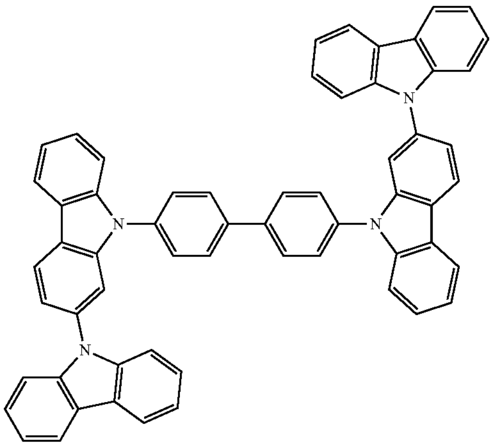
HT35
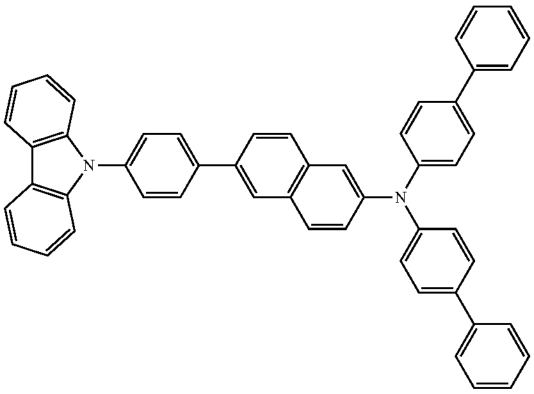
HT45

TABLE 4-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
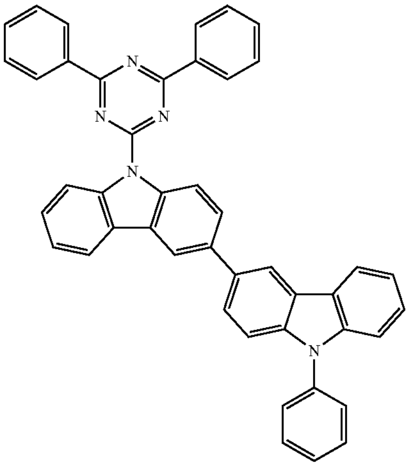
H40
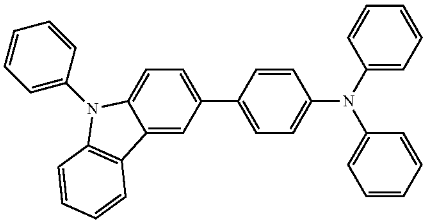
H125
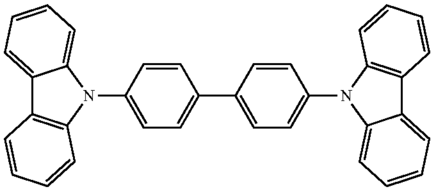
H126
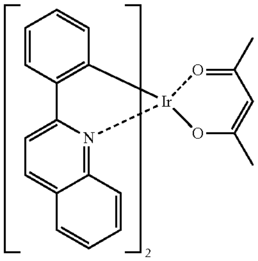
PD11

Referring to Table 4, it was confirmed that the light-emitting devices of Examples 4-1 to 4-3 have low driving voltage, high efficiency, or long lifespan, compared to the light-emitting device of Comparative Example 4-1, and the light-emitting devices of Examples 4-4 to 4-6 have low driving voltage, high efficiency, or long lifespan, compared to the light-emitting device of Comparative Example 4-2.

Example 5-1

A light-emitting device was manufactured in the same manner as in Example 1-1, except that Compound 24 was vacuum-deposited on the ITO substrate to form a hole injection layer having a thickness of 110 nm, HT45 was vacuum-deposited on the hole injection layer to form a hole transport layer having a thickness of 10 nm, and H125 and PD13 were co-deposited on the hole transport layer at a weight ratio of 90:10 to form an emission layer having a thickness of 30 nm.

24

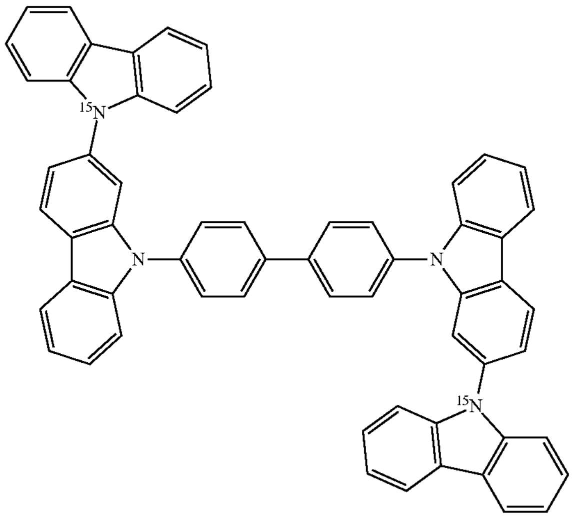

HT45

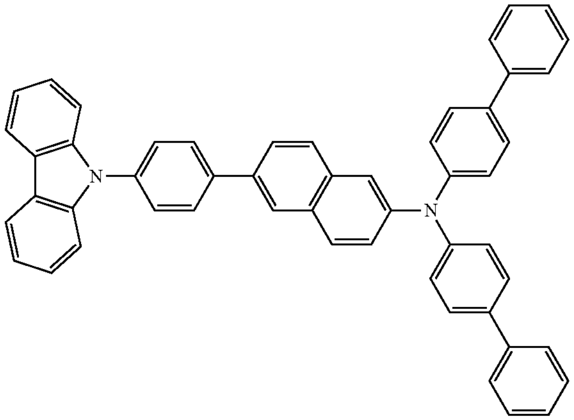

-continued

H125

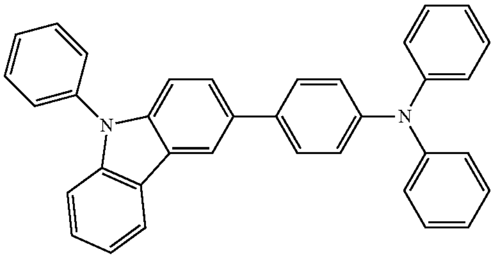

PD13

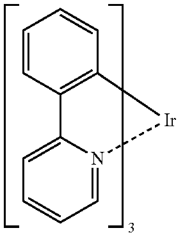

Examples 5-2 to 5-6 and Comparative Examples 5-1 and 5-2

A light-emitting device was manufactured in the same manner as in Example 5-1, except that, compounds shown in Table 5 were used instead of Compound 24, HT45, HT125, and PD13, which were used in Example 5-1.

Evaluation Example 5

Evaluation Example 5 was measured in the same manner as Evaluation Example 1, except that the lifespan of Comparative Example 5-2 was used as a standard of 100%. Results of evaluation on characteristics of the light-emitting devices manufactured in Examples 5-1 to 5-6 and Comparative Examples 5-1 and 5-2 are shown in Table 5.

TABLE 5

| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
| Example 5-1 | Compound 24 | HT45 | H125:PD13 (90:10) | 5.3 | 42.2 | Green | 65% |
| Example 5-2 | HT35 | Compound 15 | H125:PD13 (90:10) | 5.2 | 42.3 | Green | 69% |
| Example 5-3 | Compound 24 | Compound 15 | H125:PD13 (90:10) | 5.2 | 42.3 | Green | 75% |
| Example 5-4 | Compound 24 | HT45 | H126:H40: PD13 (45:45:10) | 4.8 | 51.5 | Green | 105% |
| Example 5-5 | HT35 | Compound 15 | H126:H40: PD13 (45:45:10) | 4.8 | 51.3 | Green | 109% |
| Example 5-6 | Compound 24 | Compound 15 | H126:H40: PD13 (45:45:10) | 4.8 | 51.5 | Green | 115% |
| Comparative Example 5-1 | HT35 | HT45 | H125:PD13 (90:10) | 5.3 | 42.3 | Green | 61% |
| Comparative Example 5-2 | HT35 | HT45 | H126:H40: PD13 (45:45:10) | 4.9 | 51.2 | Green | 100% |

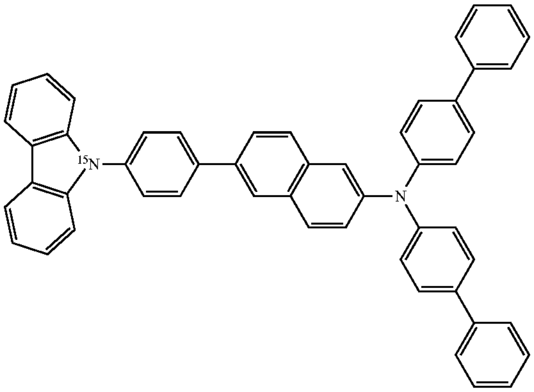

15

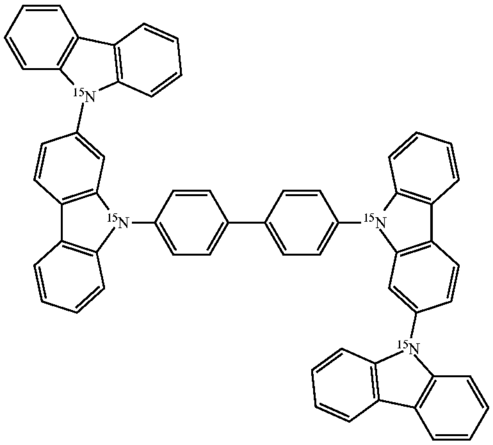

24

TABLE 5-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
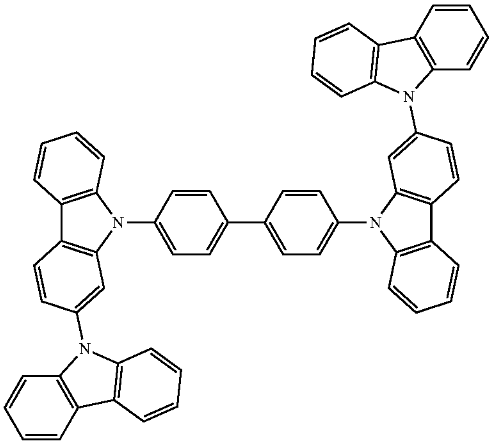
HT35
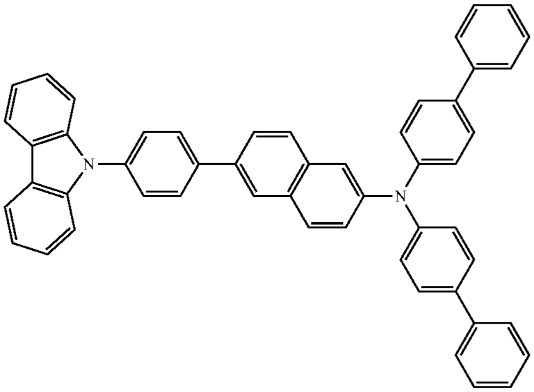
HT45
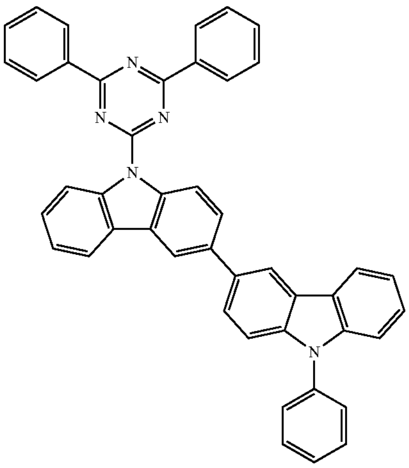
H40

TABLE 5-continued

| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|

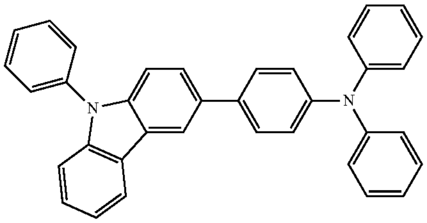

H125

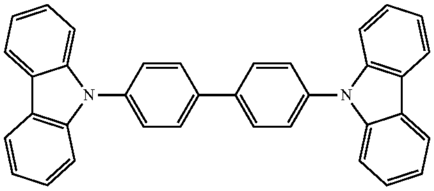

H126

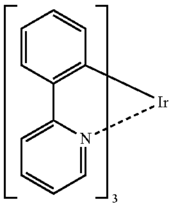

PD13

Referring to Table 5, it was confirmed that the light-emitting devices of Examples 5-1 to 5-3 have low driving voltage, high efficiency, or long lifespan, compared to the light-emitting device of Comparative Example 5-1, and the light-emitting devices of Examples 5-4 to 5-6 have low driving voltage, high efficiency, or long lifespan, compared to the light-emitting device of Comparative Example 5-2.

24

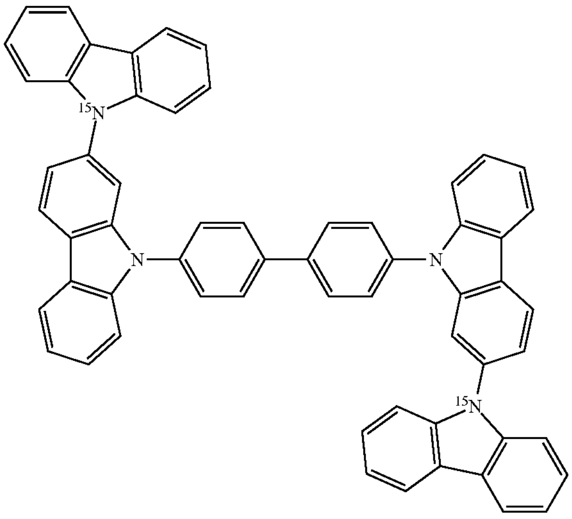

Example 6-1

A light-emitting device was manufactured in the same manner as in Example 1-1, except that Compound 24 was vacuum-deposited on the ITO substrate to form a hole injection layer having a thickness of 110 nm, HT45 was vacuum-deposited on the hole injection layer to form a hole transport layer having a thickness of 10 nm, and H127 and FD1 were co-deposited on the hole transport layer at a weight ratio of 90:10 to form an emission layer having a thickness of 30 nm.

-continued

HT45

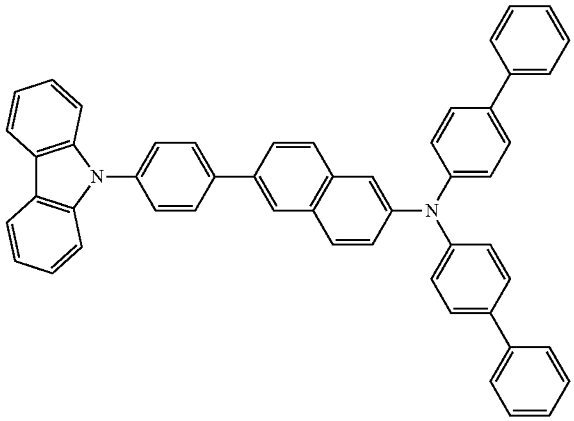

H127

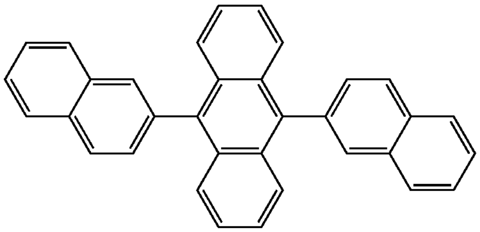

-continued

FD1

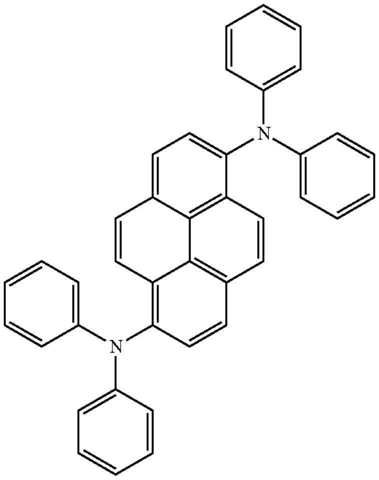

Examples 6-2 to 6-6 and Comparative Examples 6-1 and 6-2

A light-emitting device was manufactured in the same manner as in Example 6-1, except that, compounds shown in Table 6 were used instead of Compound 24, HT45, HT127, and FD1, which were used in Example 6-1.

Evaluation Example 6

Evaluation Example 6 was measured in the same manner as Evaluation Example 1, except that the lifespan of Comparative Example 6-1 was used as a standard of 100%. Results of evaluation on characteristics of the light-emitting devices manufactured in Examples 6-1 to 6-6 and Comparative Examples 6-1 and 6-2 are shown in Table 6.

TABLE 6

| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
| Example 6-1 | Compound 24 | HT45 | H127:FD1 (90:10) | 4.2 | 6.1 | Blue | 103% |
| Example 6-2 | HT35 | Compound 15 | H127:FD1 (90:10) | 4.2 | 6.1 | Blue | 112% |
| Example 6-3 | Compound 24 | Compound 15 | H127:FD1 (90:10) | 4.2 | 6.2 | Blue | 119% |
| Example 6-4 | Compound 24 | HT45 | H127:H128: FD1 (45:45:10) | 3.9 | 5.7 | Blue | 95% |
| Example 6-5 | HT35 | Compound 15 | H127:H128: FD1 (45:45:10) | 3.8 | 5.8 | Blue | 98% |
| Example 6-6 | Compound 24 | Compound 15 | H127:H128: FD1 (45:45:10) | 3.8 | 5.8 | Blue | 100% |

TABLE 6-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
| Comparative Example 6-1 | HT35 | HT45 | H127:FD1 (90:10) | 4.2 | 6.1 | Blue | 100% |
| Comparative Example 6-2 | HT35 | HT45 | H127:H128: FD1 (45:45:10) | 3.9 | 5.7 | Blue | 91% |
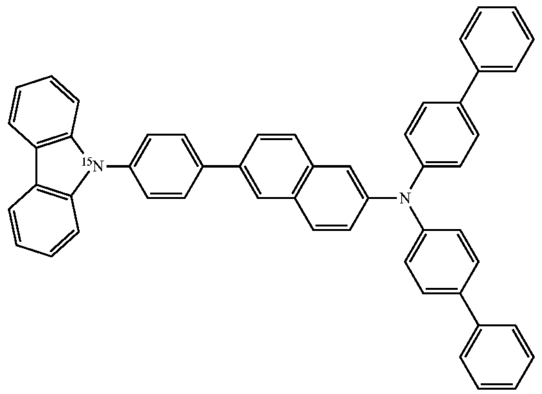
15
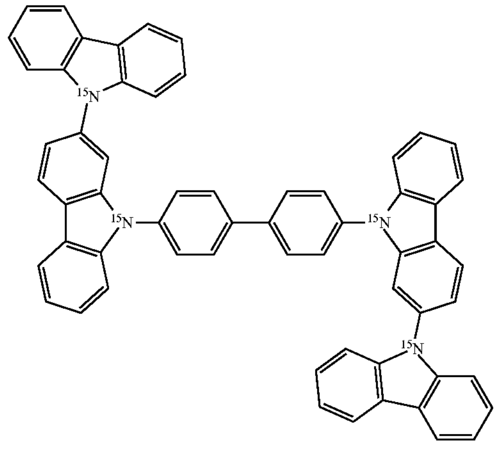
24
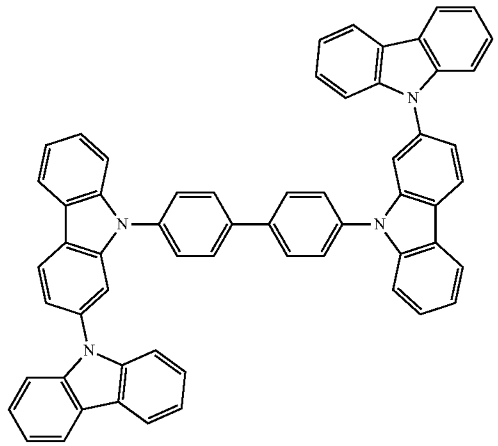
HT35

TABLE 6-continued
| | Material for hole injection layer | Material for hole transport layer | Material for emission layer (weight ratio) | Driving voltage (V) | Efficiency (cd/A) | Emission color | Lifespan ($LT_{97}$) (%) |
|---|---|---|---|---|---|---|---|
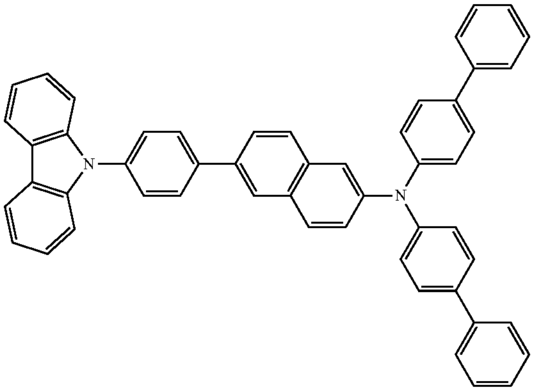
HT45
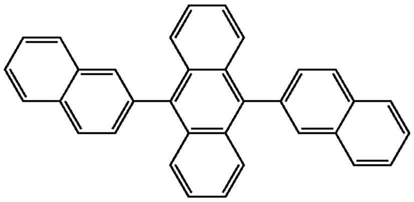
H127
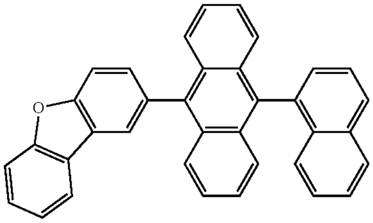
H128
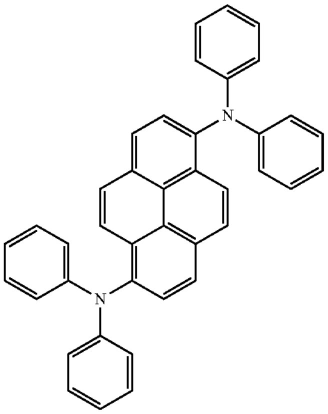
FD1

Referring to Table 6, it was confirmed that the light-emitting devices of Examples 6-1 to 6-3 have low driving voltage, high efficiency, or long lifespan, compared to the light-emitting device of Comparative Example 6-1, and the light-emitting devices of Examples 6-4 to 6-6 have low driving voltage, high efficiency, or long lifespan, compared to the light-emitting device of Comparative Example 6-2.

The light-emitting device may have high efficiency and long lifespan and may be used to manufacture high-quality electronic apparatuses having excellent light-emission efficiency and long lifespan.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the claims.

What is claimed is:

1. A light-emitting device comprising:

a first electrode;

a second electrode facing the first electrode; and an interlayer between the first electrode and the second electrode, wherein the interlayer includes an emission layer, and a hole transport region between the emission layer and the first electrode, the hole transport region includes a first layer, and a second layer between the first layer and the emission layer, the first layer and the second layer each include at least one first compound, the at least one first compound included in the first layer is different from the at least one first compound included in the second layer, and the at least one first compound is each independently represented by one of Formulae 1, 1-1, 2, 2-1, and 3:

1

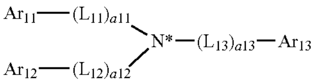

1-1

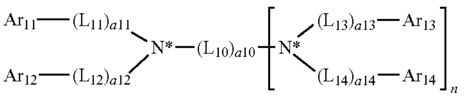

2

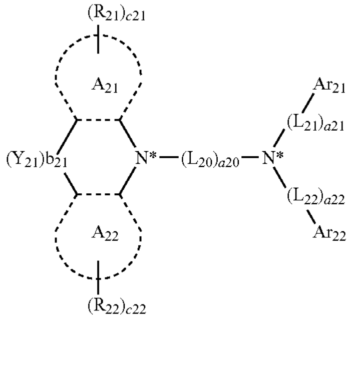

-continued 2-1

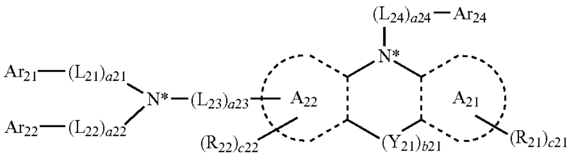

3

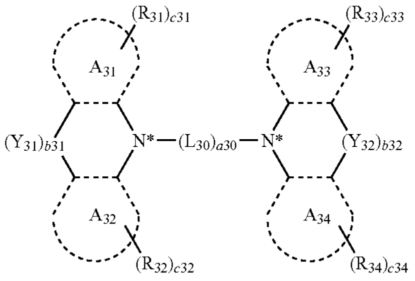

wherein in Formulae 1, 1-1, 2, 2-1, and 3, $Y_{21}$ is O, S, Se, $C(Z_{21a})(Z_{21b})$, $Si(Z_{21a})(Z_{21b})$, or $N^*(Z_{21a})$, $Y_{31}$ is O, S, Se, $C(Z_{31a})(Z_{31b})$, $Si(Z_{31a})(Z_{31b})$, or $N^*(Z_{31a})$, $Y_{32}$ is O, S, Se, $C(Z_{32a})(Z_{32b})$, $Si(Z_{32a})(Z_{32b})$, or $N^*(Z_{32a})$, N* is $^{14}N$ or $^{15}N$, at least one N* in Formula 1, 1-1, 2, 2-1, or 3 is 15N, b21, b31, and b32 are each independently an integer from 0 to 3, $Ar_{11}$ to $Ar_{14}$, $Ar_{21}$, $Ar_{22}$, and $Ar_{24}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, ring $A_{21}$, $A_{22}$, and $A_{31}$ to $A_{34}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{10}$, $L_{20}$, and $L_{30}$ are each independently *—O—*', *—S—*', *—N*($Ar_{15}$)—*', a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $Ar_{15}$ is the same as described in connection with $Ar_{11}$, $L_{11}$ to $L_{14}$ and $L_{21}$ to $L_{24}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 to a14 and a21 to a24 are each independently an integer from 0 to 10, a10, a20, and a30 are each independently an integer from 1 to 5, $R_{21}$, $R_{22}$, $R_{31}$ to $R_{34}$, $Z_{21a}$, $Z_{21b}$, $Z_{31a}$, $Z_{31b}$, $Z_{32a}$, and $Z_{32b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N*($Q_1$)($Q_2$), —B($Q_1$)($Q_2$), —C(═O)($Q_1$), —S(═O)$_2$($Q_1$), or —P(═O)($Q_1$)($Q_2$), c21, c22, and c31 to c34 are each independently an integer from 0 to 10, n is an integer from 1 to 5, $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N*($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-Coo aryloxy group, a $C_6$-$C_{60}$ arylthio group, —Si($Q_{21}$)($Q_{22}$)($Q_{23}$), —N*($Q_{21}$)($Q_{22}$), —B($Q_{21}$)($Q_{22}$), —C(═O)($Q_{21}$), —S(═O)$_2$($Q_{21}$) —P(═O)($Q_{21}$)($Q_{22}$), or a combination thereof; or —Si($Q_{31}$)($Q_{32}$)($Q_{33}$), —N*($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), $Q_1$ to $Q_3$, $Q_{11}$ to $Q_{13}$, $Q_{21}$ to $Q_{23}$, and $Q_{31}$ to $Q_{33}$ are each independently: hydrogen; deuterium —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_6$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, when a heteroatom included in the $C_1$-$C_{60}$ heterocyclic group is a nitrogen atom, the nitrogen atom is $^{14}N$ or $^{15}N$, a nitrogen atom included in the cyano group or the nitro group is $^{14}N$ or $^{15}N$, the at least one first compound included in the first layer includes $^{15}N$ in the number of $m_{11}$, the at least one first compound included in the second layer includes $^{15}N$ in the number of $m_{12}$, $m_{11}$ is greater than $m_{12}$, and the at least one first compound is not Compound A:

A

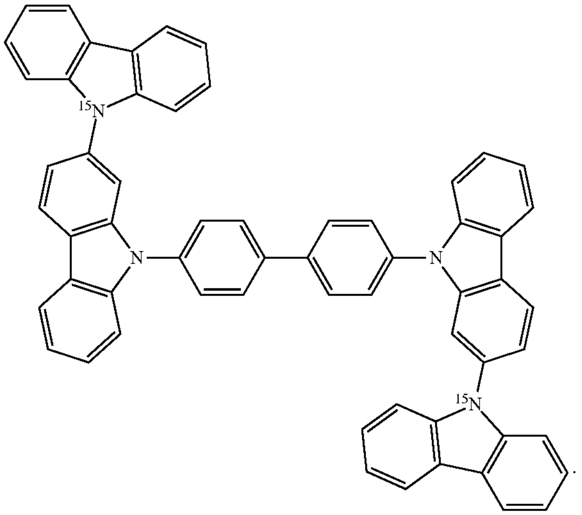

2. The light-emitting device of claim 1, wherein the at least one first compound includes two or more N(s), and when two N(s) from among the two or more N(s) are linked to a heteroatom-free group, at least one of the two N(s) is $^{15}N$.

3. The light-emitting device of claim 1, wherein each N included in the at least one first compound is $^{15}N$.

4. The light-emitting device of claim 1, wherein the hole transport region includes at least one of a first compound selected from Compounds 1 to 24:

1

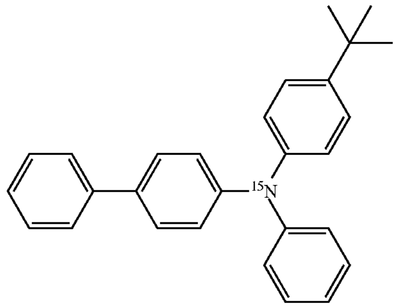

2

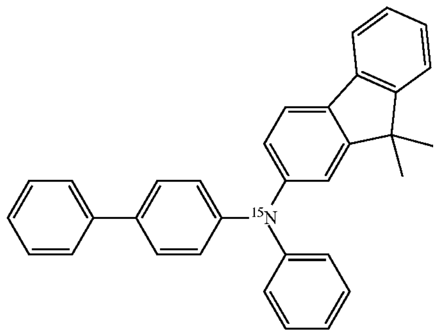

-continued
3
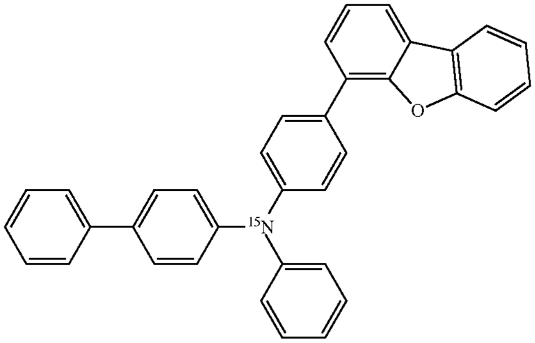
4
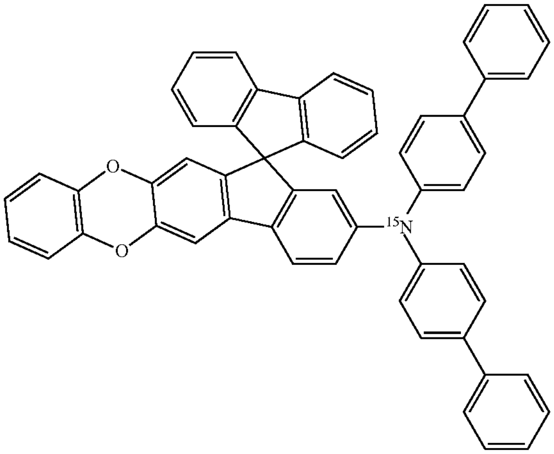
5
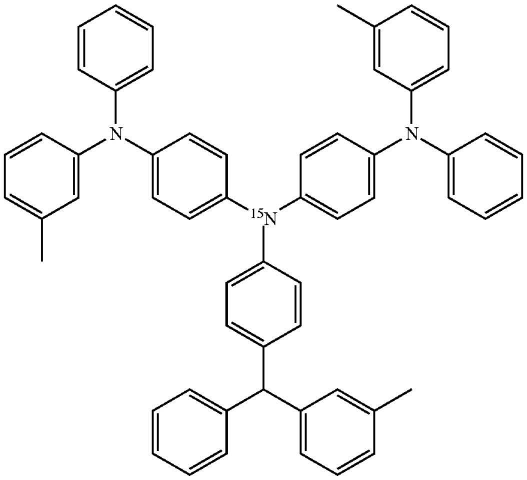
-continued
6
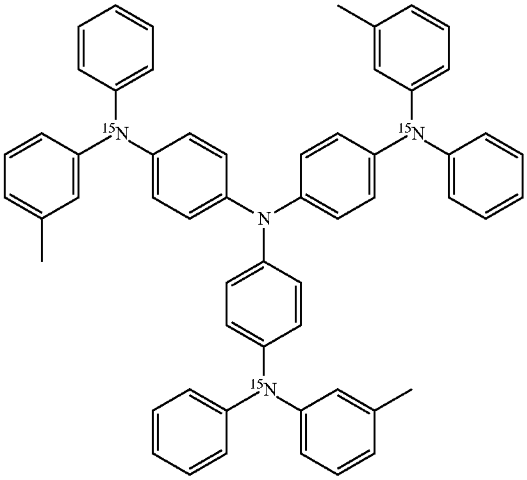
7
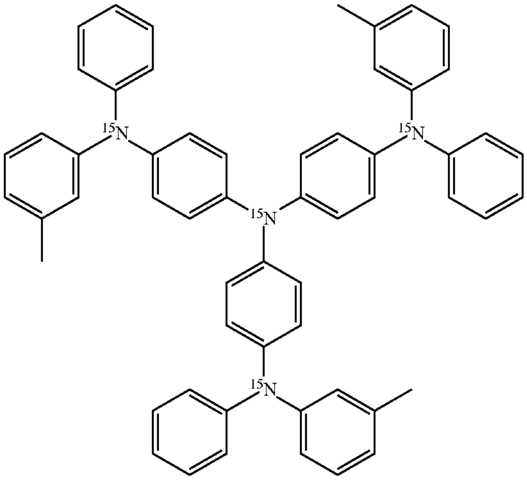
8
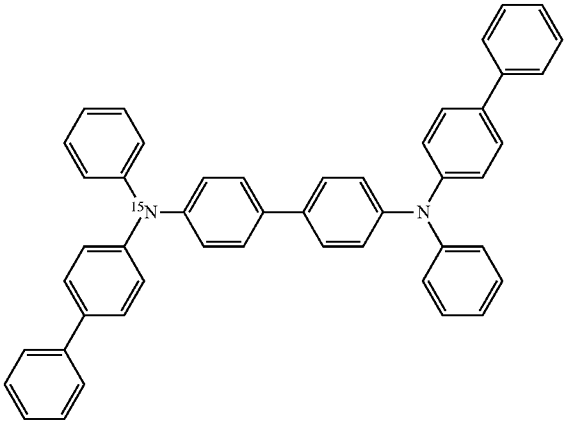

-continued
9
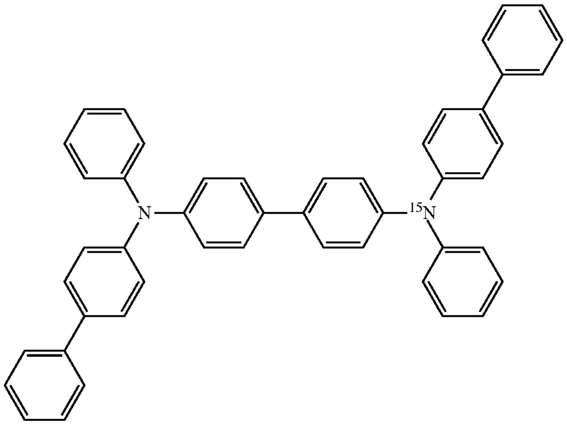
10
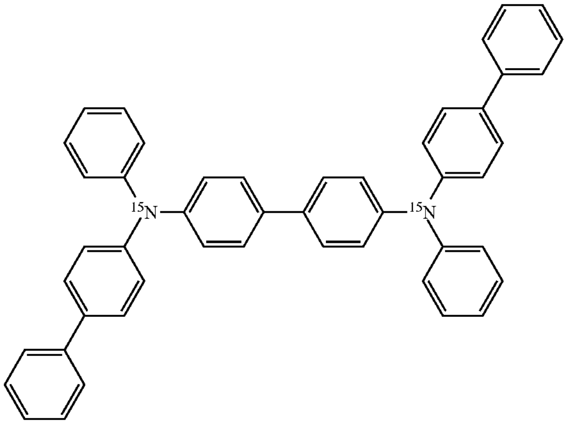
11
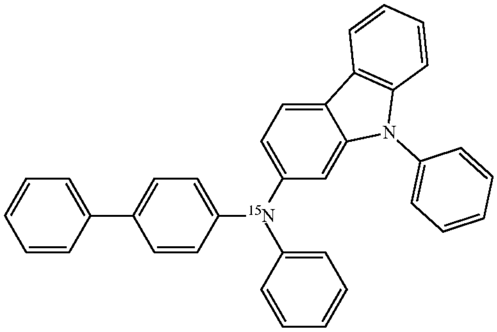
12
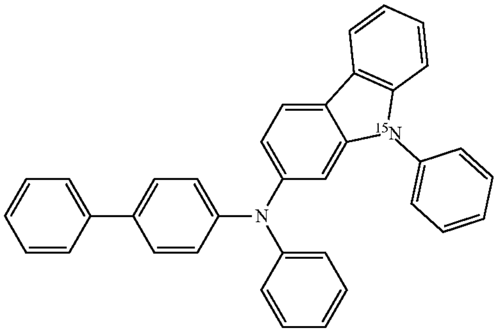
-continued
13
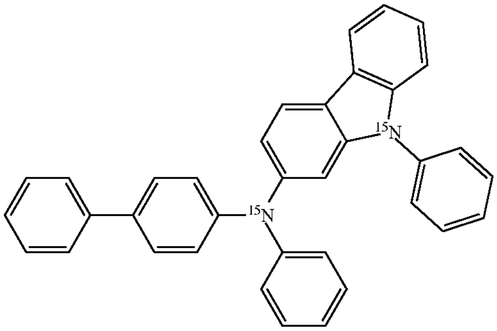
14
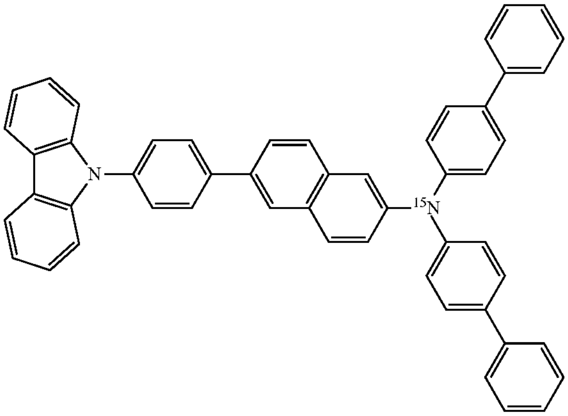
15
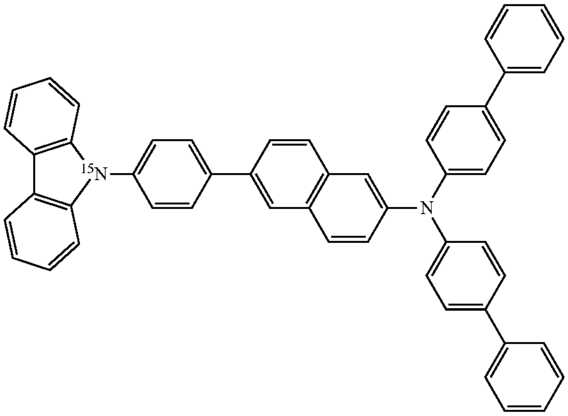
16
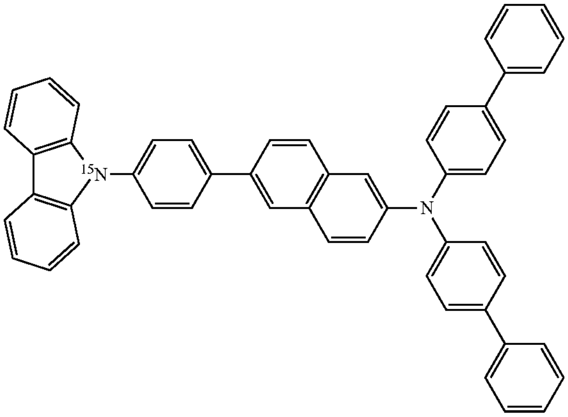

-continued

17

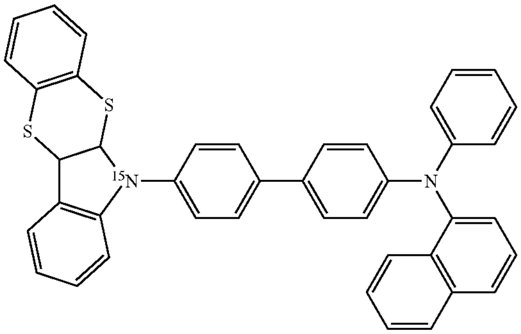

18

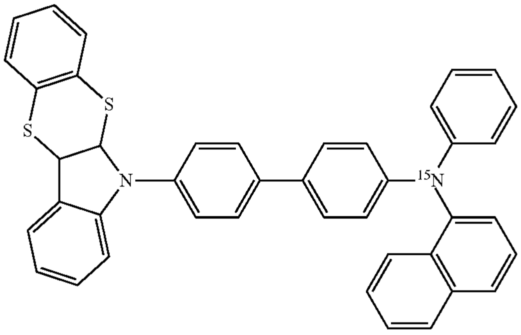

19

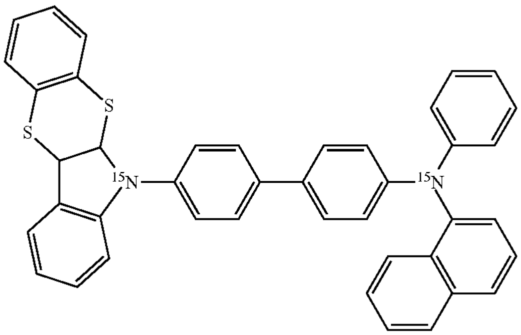

20

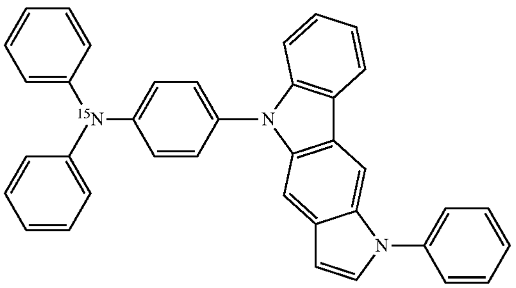

-continued

21

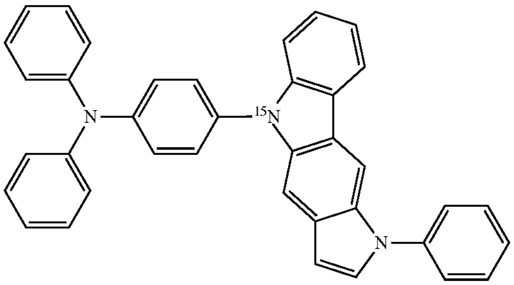

22

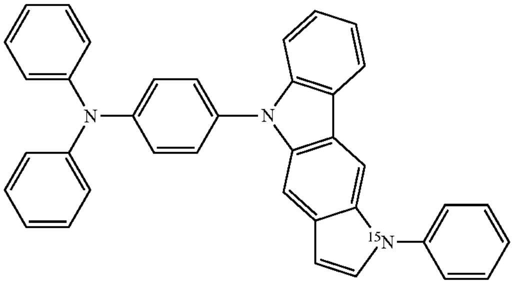

23

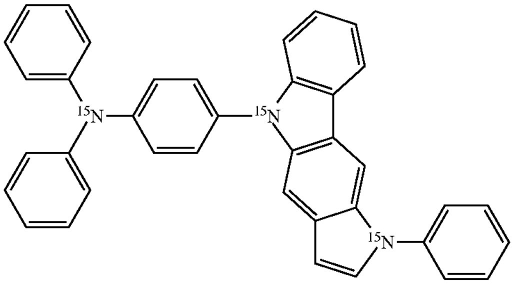

24

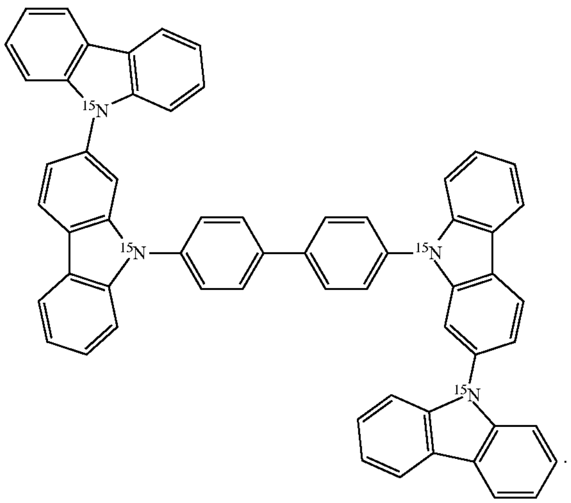

5. The light-emitting device of claim 1, wherein the emission layer includes a first emission layer, a second emission layer, and a third emission layer each having different emission colors, the hole transport region includes a first emission auxiliary layer between the first electrode and the first emission layer, a second emission auxiliary layer between the first electrode and the second emission layer, and a third emission auxiliary layer between the first electrode and the third emission layer, and at least one of the first emission auxiliary layer, the second emission auxiliary layer, and the third emission auxiliary layer includes the at least one first compound.

6. An electronic apparatus including the light-emitting device of claim 1, wherein, the electronic apparatus further comprises a thin-film transistor, the thin-film transistor includes a source electrode and a drain electrode, and the first electrode of the light-emitting device is electrically connected to the source electrode or the drain electrode.

7. The electronic apparatus of claim 6, further comprising a color filter, a color conversion layer, a touch screen layer, a polarization layer, or a combination thereof.

8. A light-emitting device comprising:

a first electrode;

a second electrode facing the first electrode;

an interlayer between the first electrode and the second electrode; and a capping layer disposed outside the second electrode and having a refractive index of equal to or greater than about 1.6, wherein the interlayer includes an emission layer, and a hole transport region between the emission layer and the first electrode, the hole transport region includes a first layer, and a second layer between the first layer and the emission layer, the first layer and the second layer each include at least one first compound, the at least one first compound included in the first layer is different from the at least one first compound included in the second layer, and the at least one first compound is each independently represented by one of Formulae 1, 1-1, 2, 2-1, and 3:

1

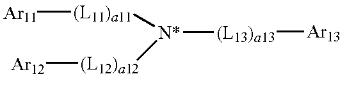

1-1

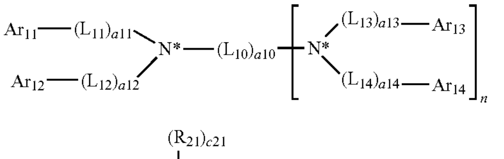

2

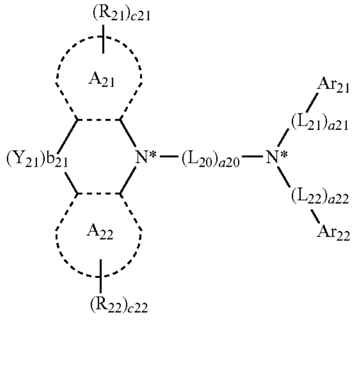

-continued 2-1

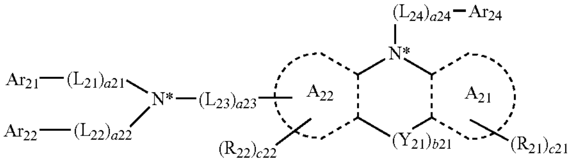

3

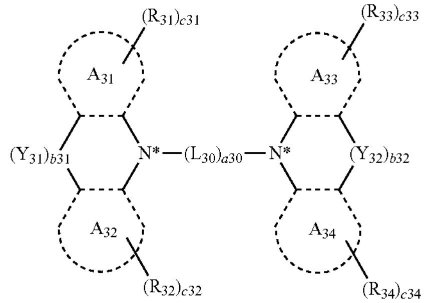

wherein in Formulae 1, 1-1, 2, 2-1, and 3, $Y_{21}$ is O, S, Se, $C(Z_{21a})(Z_{21b})$, $Si(Z_{21a})(Z_{21b})$, or $N^*(Z_{21a})$, $Y_{31}$ is O, S, Se, $C(Z_{31a})(Z_{31b})$, $Si(Z_{31a})(Z_{31b})$, or $N^*(Z_{31a})$, $Y_{32}$ is O, S, Se, $C(Z_{32a})(Z_{32b})$, $Si(Z_{32a})(Z_{32b})$, or $N^*(Z_{32a})$, N* is $^{14}N$ or $^{15}N$, at least one N* in Formula 1, 1-1, 2, 2-1, or 3 is 15N, b21, b31, and b32 are each independently an integer from 0 to 3, $Ar_{11}$ to $Ar_{14}$, $Ar_{21}$, $Ar_{22}$, and $Ar_{24}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, ring $A_{21}$, $A_{22}$, and $A_{31}$ to $A_{34}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{10}$, $L_{20}$, and $L_{30}$ are each independently *—O—*', *—S—*', *—N*($Ar_{15}$)—*', a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $Ar_{15}$ is the same as described in connection with $Ar_{11}$, $L_{11}$ to $L_{14}$ and $L_{21}$ to $L_{24}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 to a14 and a21 to a24 are each independently an integer from 0 to 10, a10, a20, and a30 are each independently an integer from 1 to 5, $R_{21}$, $R_{22}$, $R_{31}$ to $R_{34}$, $Z_{21a}$, $Z_{21b}$, $Z_{31a}$, $Z_{31b}$, $Z_{32a}$, and $Z_{32b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N^*(Q_1)(Q_2)$, —$B(Q_1)(Q_2)$, —$C(=O)(Q_1)$, —$S(=O)_2(Q_1)$, or —$P(=O)(Q_1)(Q_2)$, c21, c22, and c31 to c34 are each independently an integer from 0 to 10, n is an integer from 1 to 5, $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N^*(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N^*(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or —$Si(Q_{31})(Q_{32})(Q_{33})$, —$N^*(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, when a heteroatom included in the $C_1$-$C_{60}$ heterocyclic group is a nitrogen atom, the nitrogen atom is $^{14}N$ or $^{15}N$, a nitrogen atom included in the cyano group or the nitro group is $^{14}N$ or $^{15}N$, the at least one first compound included in the first layer includes $^{15}N$ in the number of $m_{11}$, the at least one first compound included in the second layer includes $^{15}N$ in the number of $m_{12}$, $m_{11}$ is greater than $m_{12}$, and the at least one first compound is not Compound A:

A

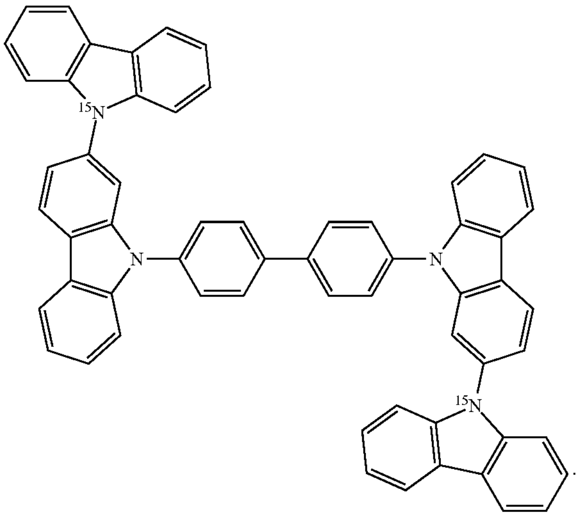

9. A light-emitting device comprising:

a first electrode;

a second electrode facing the first electrode; and an interlayer between the first electrode and the second electrode, wherein the interlayer includes an emission layer, and a hole transport region between the emission layer and the first electrode, the hole transport region includes at least one first compound, each independently represented by one of Formulae 1, 1-1, 2, 2-1, and 3, and the hole transport region does not include any compound that has the same structure as the first compound except that each N* is $^{14}N$:

1

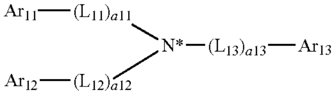

1-1

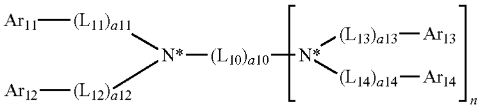

2

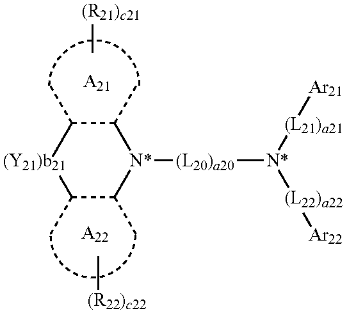

-continued 2-1

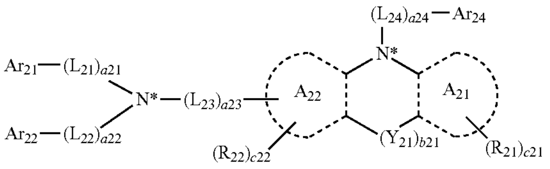

3

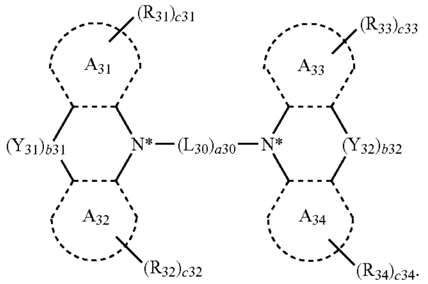

wherein in Formulae 1, 1-1, 2, 2-1, and 3, $Y_{21}$ is O, S, Se, $C(Z_{21a})(Z_{21b})$, $Si(Z_{21a})(Z_{21b})$, or $N^*(Z_{21a})$, $Y_{31}$ is O, S, Se, $C(Z_{31a})(Z_{31b})$, $Si(Z_{31a})(Z_{31b})$, or $N^*(Z_{31a})$, $Y_{32}$ is O, S, Se, $C(Z_{32a})(Z_{32b})$, $Si(Z_{32a})(Z_{32b})$, or $N^*(Z_{32a})$, N* is $^{14}N$ or $^{15}N$, at least one N* in Formula 1, 1-1, 2, 2-1, or 3 is $^{15}N$, b21, b31, and b32 are each independently an integer from 0 to 3, $Ar_{11}$ to $Ar_{14}$, $Ar_{21}$, $Ar_{22}$, and $Ar_{24}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, ring $A_{21}$, $A_{22}$, and $A_{31}$ to $A_{34}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{10}$, $L_{20}$, and $L_{30}$ are each independently *—O—*', *—S—*', *—N*($Ar_{15}$)—*', a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $Ar_{15}$ is the same as described in connection with $Ar_{11}$, $L_{11}$ to $L_{14}$ and $L_{21}$ to $L_{24}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 to a14 and a21 to a24 are each independently an integer from 0 to 10, a10, a20, and a30 are each independently an integer from 1 to 5, $R_{21}$, $R_{22}$, $R_{31}$ to $R_{34}$, $Z_{21a}$, $Z_{21b}$, $Z_{31a}$, $Z_{31b}$, $Z_{32a}$, and $Z_{32}$b are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N*($Q_1$)($Q_2$), —B($Q_1$)($Q_2$), —C(=O)($Q_1$), —S(=O)$_2$($Q_1$), or —P(=O)($Q_1$)($Q_2$), c21, c22, and c31 to c34 are each independently an integer from 0 to 10, n is an integer from 1 to 5, $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-Coo arylthio group, —Si($Q_{11}$)($Q_{12}$)($Q_{13}$), —N*($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N*($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N*($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, when a heteroatom included in the $C_1$-$C_{60}$ heterocyclic group is a nitrogen atom, the nitrogen atom is $^{14}N$ or $^{15}N$, a nitrogen atom included in the cyano group or the nitro group is $^{14}N$ or $^{15}N$, and the at least one first compound is not Compound A:

A

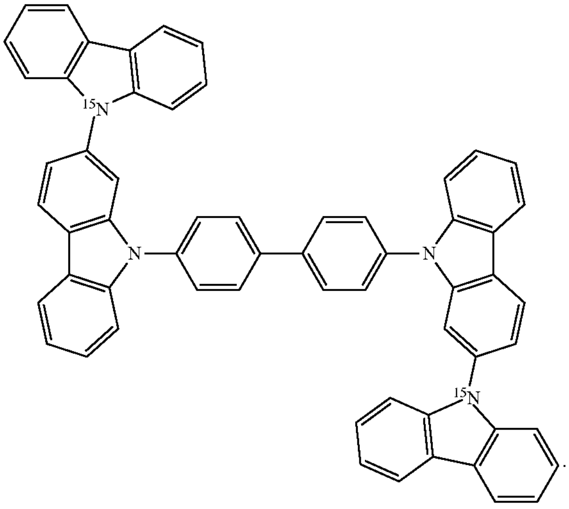

10. The light-emitting device of claim 9, wherein the at least one first compound includes two or more N(s), and when two N(s) from among the two or more N(s) are linked to a heteroatom-free group, at least one of the two N(s) is $^{15}N$.

11. The light-emitting device of claim 9, wherein each N included in the at least one first compound is $^{15}N$.

12. The light-emitting device of claim 9, wherein the at least one first compound included in the first layer includes $^{15}N$ in the number of $m_{11}$, the at least one first compound included in the second layer includes $^{15}N$ in the number of $m_{12}$, and $m_{11}$ is greater than $m_{12}$.

13. The light-emitting device of claim 9, wherein the hole transport region includes at least one of a first compound selected from Compounds 1 to 24:

1

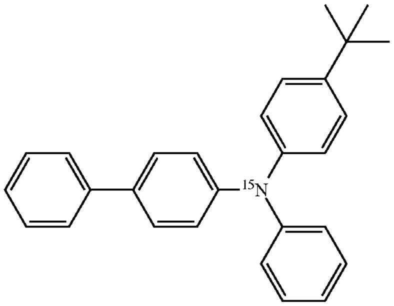

-continued

2

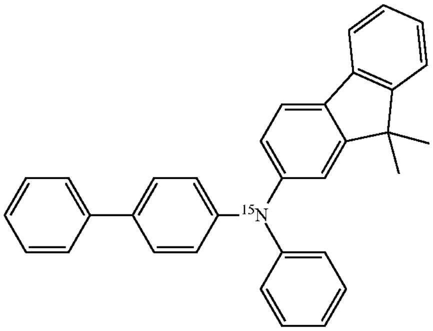

3

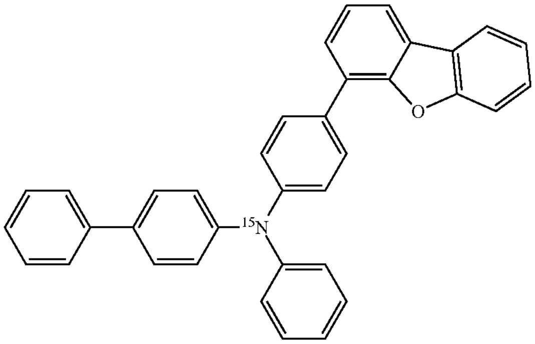

4

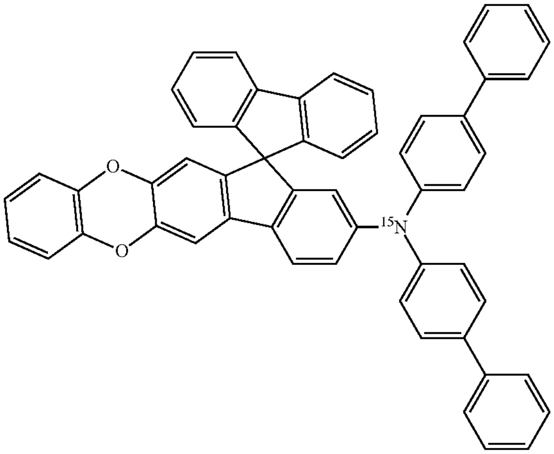

-continued
5
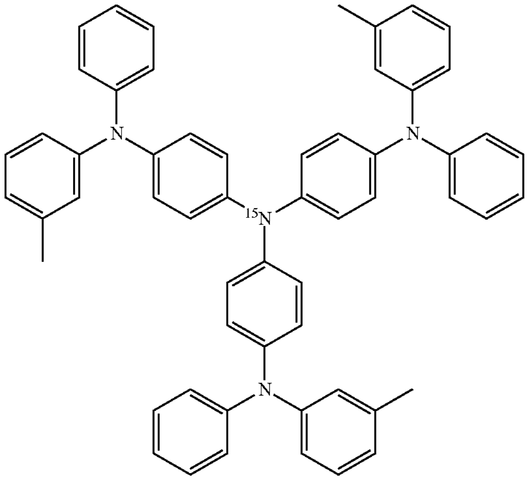
6
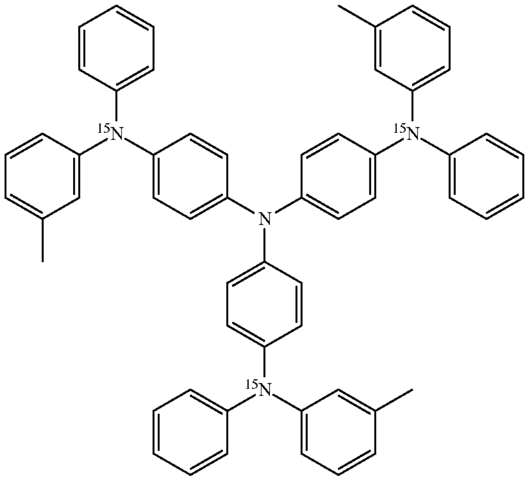
7
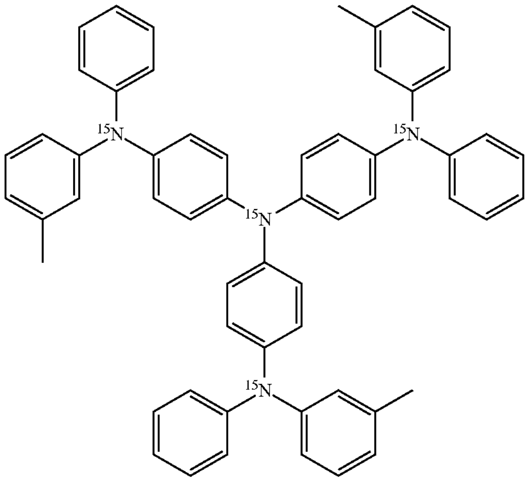
-continued
8
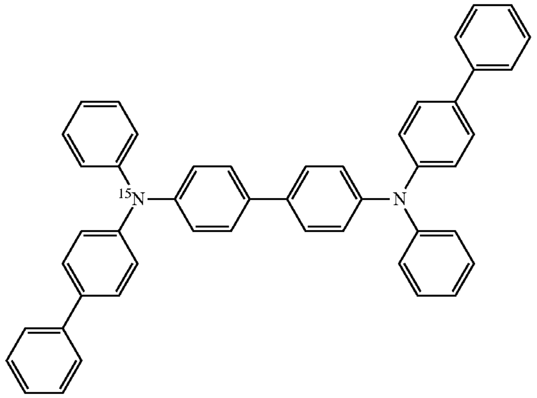
9
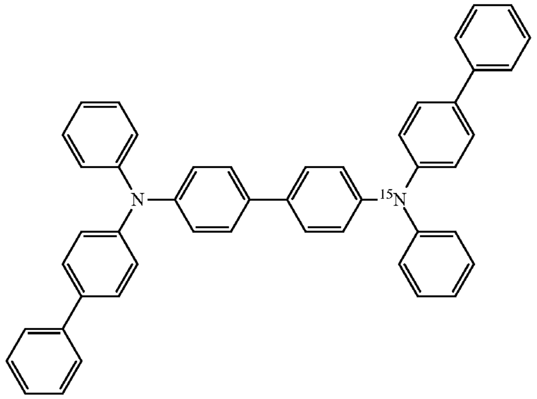
10
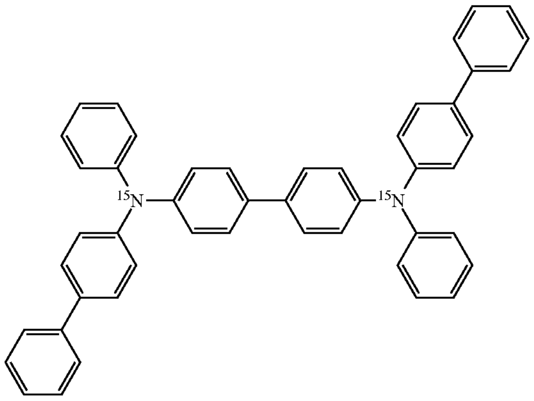
11
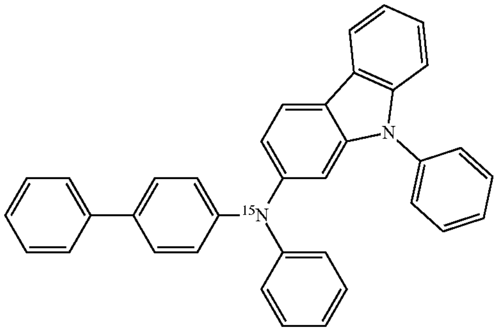

-continued
12
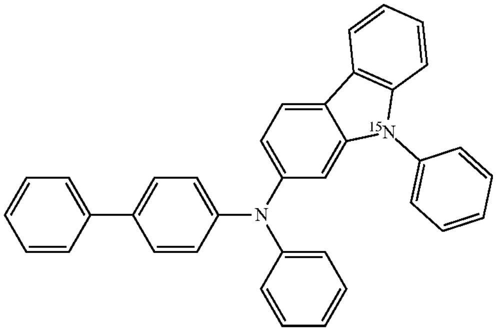
13
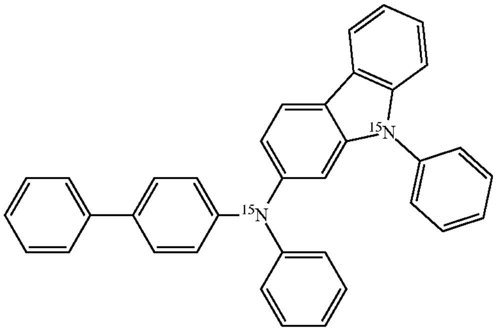
14
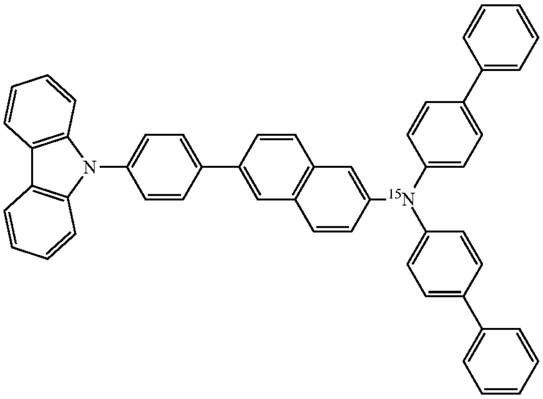
15
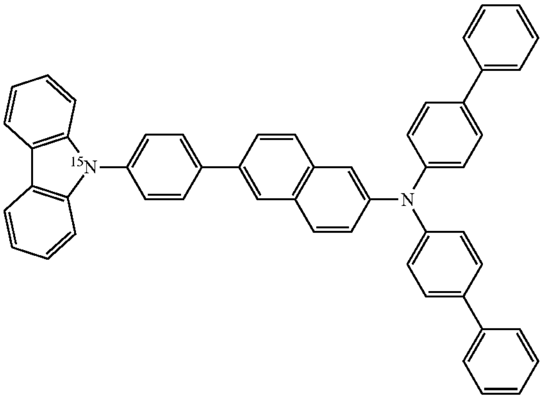
-continued
16
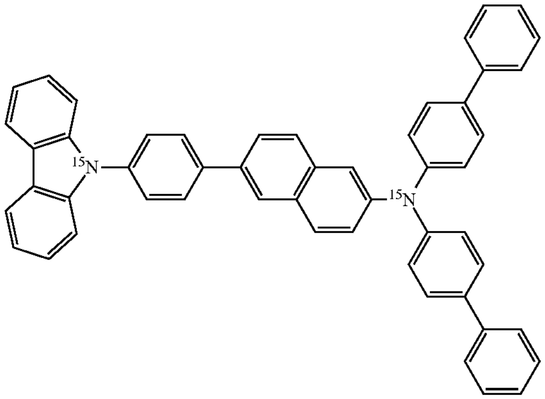
17
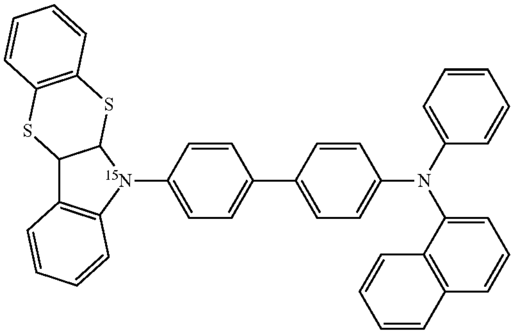
18
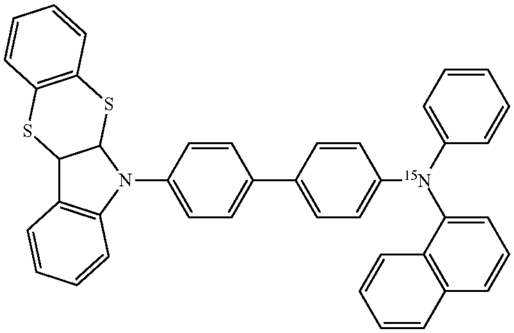
19
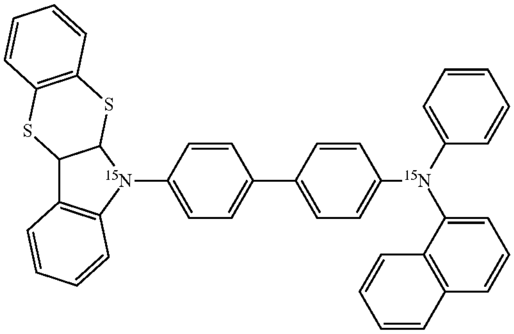

-continued

20

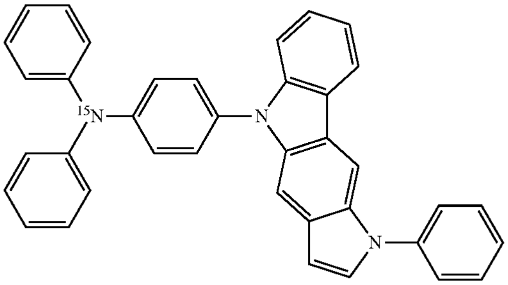

21

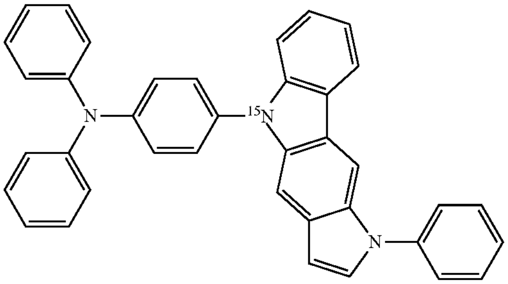

22

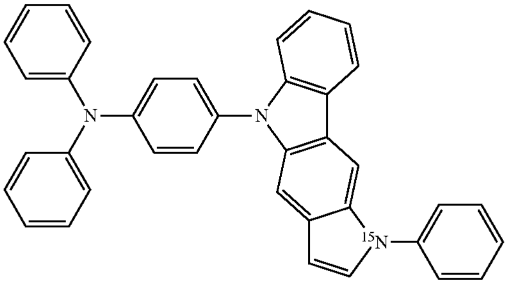

23

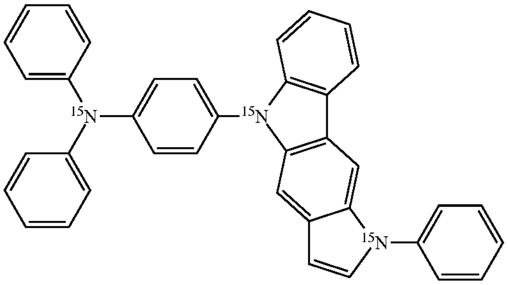

-continued

24

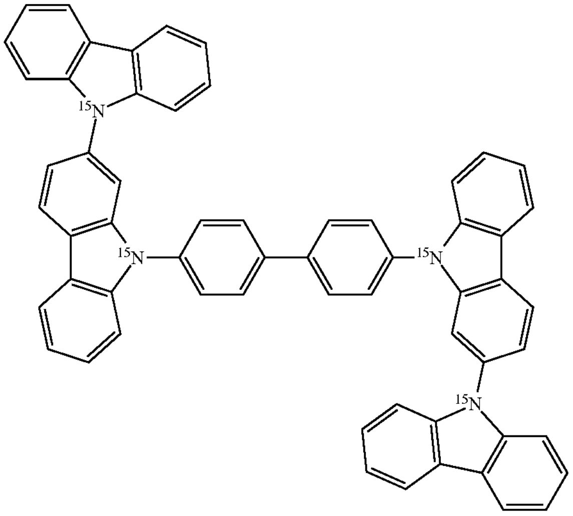

14. The light-emitting device of claim 9, wherein the emission layer includes a first emission layer, a second emission layer, and a third emission layer each having different emission colors, the hole transport region includes a first emission auxiliary layer between the first electrode and the first emission layer, a second emission auxiliary layer between the first electrode and the second emission layer, and a third emission auxiliary layer between the first electrode and the third emission layer, and at least one of the first emission auxiliary layer, the second emission auxiliary layer, and the third emission auxiliary layer includes the at least one first compound.

* * * * *